(12) United States Patent
Yamazaki et al.

(10) Patent No.: US 9,783,722 B2
(45) Date of Patent: Oct. 10, 2017

(54) AGGLOMERATED BORON NITRIDE PARTICLES, COMPOSITION CONTAINING SAID PARTICLES, AND THREE-DIMENSIONAL INTEGRATED CIRCUIT HAVING LAYER COMPRISING SAID COMPOSITION

(71) Applicant: MITSUBISHI CHEMICAL CORPORATION, Chiyoda-ku (JP)

(72) Inventors: Masanori Yamazaki, Yokohama (JP); Mari Abe, Yokohama (JP); Tomohide Murase, Yokohama (JP); Yasuhiro Kawase, Kitakyushu (JP); Makoto Ikemoto, Kitakyushu (JP); Hideki Kiritani, Chiyoda-ku (JP); Yasunori Matsushita, Yokkaichi (JP)

(73) Assignee: Mitsubishi Chemical Corporation, Chiyoda-ku (JP)

( * ) Notice: Subject to any disclaimer, the term of this patent is extended or adjusted under 35 U.S.C. 154(b) by 359 days.

(21) Appl. No.: 14/290,219

(22) Filed: May 29, 2014

(65) Prior Publication Data
US 2014/0349105 A1    Nov. 27, 2014

Related U.S. Application Data

(63) Continuation of application No. PCT/JP2012/080959, filed on Nov. 29, 2012.

(30) Foreign Application Priority Data

Nov. 29, 2011  (JP) ................................. 2011-260238
Apr. 27, 2012  (JP) ................................. 2012-103216
Apr. 27, 2012  (JP) ................................. 2012-103217

(51) Int. Cl.
*C09K 5/14*      (2006.01)
*H01L 27/04*    (2006.01)
(Continued)

(52) U.S. Cl.
CPC .............. *C09K 5/14* (2013.01); *C01B 21/064* (2013.01); *C01B 21/0648* (2013.01);
(Continued)

(58) Field of Classification Search
None
See application file for complete search history.

(56) References Cited

U.S. PATENT DOCUMENTS 4,784,839 A  *  11/1988  Bachelard .............. B82Y 30/00
                                                                  423/290
4,851,203 A        7/1989  Bachelard et al.
(Continued)

FOREIGN PATENT DOCUMENTS

CN         1538908 A      10/2004
CN         1556841 A      12/2004
(Continued)

OTHER PUBLICATIONS

Machine translation JP2000109541 (2000).*
(Continued)

*Primary Examiner* — Alexandre Ferre
(74) *Attorney, Agent, or Firm* — Oblon, McClelland, Maier & Neustadt, L.L.P.

(57) ABSTRACT

To provide a composition for a three-dimensional integrated circuit capable of forming a filling interlayer excellent in thermal conductivity also in a thickness direction, using agglomerated boron nitride particles excellent in the isotropy of thermal conductivity, disintegration resistance and kneading property with a resin.

A composition for a three-dimensional integrated circuit, comprising agglomerated boron nitride particles which have a specific surface area of at least 10 m²/g, the surface of which is constituted by boron nitride primary particles having an average particle size of at least 0.05 μm and at (Continued)

BN-A Before heat treatment most 1 μm, and which are spherical, and a resin (A) having a melt viscosity at 120° C. of at most 100 Pa·s.

24 Claims, 6 Drawing Sheets

(51) Int. Cl.
    *C01B 21/064*    (2006.01)
    *C08L 63/00*    (2006.01)
    *C08G 59/40*    (2006.01)
    *C01B 35/14*    (2006.01)
    *H01L 21/77*    (2017.01)
    *H01L 23/00*    (2006.01)
    *C08K 3/38*    (2006.01)

(52) U.S. Cl.
CPC ........ *C01B 35/146* (2013.01); *C08G 59/4042* (2013.01); *C08L 63/00* (2013.01); *H01L 21/77* (2013.01); *H01L 24/32* (2013.01); *H01L 24/83* (2013.01); *H01L 27/04* (2013.01); *C01P 2004/03* (2013.01); *C01P 2004/30* (2013.01); *C01P 2004/45* (2013.01); *C01P 2004/50* (2013.01); *C01P 2004/61* (2013.01); *C01P 2004/62* (2013.01); *C01P 2006/11* (2013.01); *C01P 2006/12* (2013.01); *C01P 2006/14* (2013.01); *C01P 2006/32* (2013.01); *C01P 2006/80* (2013.01); *C08K 3/38* (2013.01); *C08K 2003/385* (2013.01); *H01L 2924/0002* (2013.01); *H01L 2924/12042* (2013.01); *H01L 2924/15747* (2013.01); *H01L 2924/15788* (2013.01); *Y10T 156/10* (2015.01); *Y10T 428/25* (2015.01); *Y10T 428/2982* (2015.01)

(56) References Cited

U.S. PATENT DOCUMENTS

| | | | | |
|---|---|---|---|---|
| 7,208,062 | B2* | 4/2007 | Nakamura | B32B 7/12 |
| | | | | 156/153 |
| 7,508,061 | B2* | 3/2009 | Kang | G11C 5/04 |
| | | | | 257/668 |
| 2003/0073769 | A1 | 4/2003 | Pujari et al. | |
| 2006/0103028 | A1* | 5/2006 | Hazeyama | H01L 21/563 |
| | | | | 257/778 |

FOREIGN PATENT DOCUMENTS

| | | | |
|---|---|---|---|
| CN | 101580626 | A | 11/2009 |
| CN | 102027584 | A | 4/2011 |
| EP | 0 939 066 | A1 | 9/1999 |
| JP | 60-260405 | | 12/1985 |
| JP | 2-296706 | | 12/1990 |
| JP | 3-115109 | | 5/1991 |
| JP | 6-219714 | A | 8/1994 |
| JP | 9-202663 | | 8/1997 |
| JP | 9-263402 | | 10/1997 |
| JP | 9-295801 | | 11/1997 |
| JP | 11-263670 | | 9/1999 |
| JP | 2000109541 | A * | 4/2000 |
| JP | 2004-244265 | A | 9/2004 |
| JP | 2006-257392 | | 9/2006 |
| JP | 2008-510878 | | 4/2008 |
| JP | 2008-189818 | | 8/2008 |
| JP | 2010-37123 | | 2/2010 |
| JP | 2010-42963 | | 2/2010 |
| JP | 2010-505729 | | 2/2010 |
| JP | 2010-132592 | A | 6/2010 |
| JP | 2011-6586 | | 1/2011 |
| WO | WO 2009/035439 | A1 | 3/2009 |

OTHER PUBLICATIONS

Combined Office Action and Search Report issued Sep. 14, 2015 in Chinese Patent Application No. 201280058680.1 (with English translation).
Combined Office Action and Search Report issued Feb. 25, 2016 in Taiwanese Patent Application No. 101144939 (with English language translation).
Combined Office Action and Search Report issued Sep. 21, 2016 in Taiwanese Patent Application No. 105122041 (with English translation).
Extended European Search Report issued Sep. 8, 2015 in Patent Application No. 12854030.9.
International Search Report issued Feb. 12, 2013 in PCT/JP2012/080959 filed Nov. 29, 2012.
Proceedings of the Japan Institute of Electronics Packaging, Annual Meeting, 61, 23, 2009.
Science and Application of Soldering (Kogyo Chosakai Publishing Co., Ltd.).
Combined Taiwanese Office Action and Search Report issued Nov. 30, 2016 in Patent Application No. 105122039 (with English language translation).
Tsuyoshi Hagio, et al., "Microstructural development with crystallization of hexagonal boron nitride," Journal of Materials Science Letters, vol. 16. (1997), pp. 795-798.
Office Action dated Jul. 5, 2017, in Chinese Patent Application No. 201610370621.8 filed Nov. 29, 2012 (with English translation).

* cited by examiner

BN-B Before heat treatment

AGGLOMERATED BORON NITRIDE PARTICLES, COMPOSITION CONTAINING SAID PARTICLES, AND THREE-DIMENSIONAL INTEGRATED CIRCUIT HAVING LAYER COMPRISING SAID COMPOSITION

TECHNICAL FIELD

The present invention relates to a composition containing agglomerated boron nitride particles and a coating liquid containing it, for a three-dimensional integrated circuit, a laminate for a three-dimensional integrated circuit containing the composition, and a process for producing a three-dimensional integrated circuit using the coating liquid.

BACKGROUND ART

In recent years, for further improvement in the performance of semiconductor devices such as speeding up and an increase in the capacity, research and development of a three-dimensional integrated circuit having at least two layers of semiconductor device chips laminated to constitute a three-dimensional (3D) lamination, is in progress in addition to refinement of transistors and wiring.

A three-dimensional integrated circuit has a structure such that semiconductor device chips are connected e.g. by electric signal terminals such as solder bumps and are bonded by a filling interlayer formed by being filled with an interlayer filler.

Specifically, such a process is proposed (for example, Non-Patent Document 1) that a coating liquid of a composition (a composition for forming a filling interlayer) is applied to a wafer to form a thin film, B-stage formation (cure for B-state) is carried out by heating, and then chips are cut out by dicing, a procedure of laminating a plurality of such chips and temporary bonding the chips by pressure heating is repeatedly carried out, and finally main bonding (solder bonding) is carried out under pressure heating conditions.

For practical use of such a three-dimensional integrated circuit device, various problems have been pointed out, and one of them is a problem of dissipation of heat generated from a device such as a transistor or wiring. This problem results from a commonly very low coefficient of thermal conductivity of a composition to be used for lamination of semiconductor device chips as compared with metals and ceramics, and there are concerns about a decrease in the performance due to accumulation of heat in laminated device chips.

As one means to solve the problem, an increase in the coefficient of thermal conductivity of the composition for forming a filling interlayer may be mentioned. Specifically, a highly thermally conductive epoxy resin is used as a thermosetting resin constituting an adhesive component of the composition, or such a highly thermally conductive resin is combined with a highly thermally conductive inorganic filler, to make the composition be highly thermally conductive.

For example, Patent Document 1 discloses a composition having spherical boron nitride agglomerates blended as a filler.

Further, a composition has been required to have not only improved thermal conductivity but also compatibility to the 3D lamination process and capability in being formed into a thin film, and further connection properties to electric signal terminals between semiconductor device chips, and further technical development has been required.

That is, in a conventional process of mounting semiconductor device chips on an interposer or the like, first, electric signal terminals such as solder bumps on the semiconductor device chip side are subjected to activation treatment by a flux, and then bonded to a substrate having lands (electric connection electrode), and the space between the substrates is filled with a liquid resin or an underfill material having an inorganic filler added to a liquid resin, which is cured, whereby the bonding is carried out.

On that occasion, the flux is required to have properties to remove the surface oxide film on the metal electric signal terminals such as solder bumps and the lands, and to improve wettability, and further, an activation treatment function such as prevention of reoxidation on the metal terminal surface.

On the other hand, in the 3D lamination process of semiconductor device chips, if activation treatment of the electric signal terminals such as solder bumps using a flux is carried out first, a flux layer having low thermal conductivity is formed on the surface of the terminals, and there are concerns about inhibition of thermal conductivity between the laminated substrates by composition, or deterioration by corrosion of connection terminals by remaining flux components.

Accordingly, a flux which can be directly mixed with a composition having high thermal conductivity and which is less likely to corrode metal terminals has been desired.

As such a flux, not only an inorganic metal salt containing halogen excellent in capability in solving the metal oxide film of the electric signal terminals, but also an organic acid or an organic acid salt, an organic halogen compound or an amine, rosin or its constituent, is used alone or in combination of two or more of them (for example, Non-Patent Document 2).

As described above, a conventional interlayer filler composition usually contains a thermosetting resin as an adhesive component, an inorganic filler and a flux, and this composition is usually applied to a semiconductor substrate in the form of a coating liquid as dispersed or dissolved in a proper organic solvent thereby having an appropriate viscosity.

In recent years, particularly in the electric/electronic fields, heat generation due to high densification of integrated circuits is significantly problematic, and how to dissipate heat is an urgent problem.

In a conventional composition, boron nitride (BN) has been used as a filler.

Boron nitride (BN) is an insulating ceramic, and various crystal forms such as c-BN having a diamond structure, h-BN (hexagonal boron nitride) having a graphite structure, α-BN having a turbostratic structure and β-BN have been known.

Among them, h-BN having a graphite structure has characteristics such that it has the same layer structure as graphite, it is relatively easily prepared and it is excellent in the thermal conductivity, solid lubricity, chemical stability and heat resistance, and is widely used in the electric/electronic material fields.

Further, h-BN attracts attention, by making use of its characteristics such that it has high thermal conductivity although it is insulating, as a thermally conductive filler for a heat dissipation member for such applications, and is considered to be capable of forming a filling interlayer excellent in the heat dissipation properties.

In addition to the above Patent Document 1, techniques using a boron nitride powder have been known, and as such boron nitride, for example, a boron nitride powder having specific particle size and particle size distribution has been known (for example, Patent Document 3). Further, aside from this, a technique (for example, Patent Document 4) has been known to use a mixture of two types of boron nitrides differing in the particle properties such as the surface area, the particle size and the tap density.

Further, a h-BN powder is known as a material excellent in the thermal conductivity, and a technique has been known (for example, Patent Document 5) in which a crude hexagonal boron nitride powder is washed with water and subjected to heat treatment in a stream of an inert gas at from 1,500 to 1,800° C. to prepare highly crystalline boron nitride. By this technique, the crystallite size (La) of the 100 plane of crystallites of boron nitride is developed.

Further, Patent Document 6 discloses that a hexagonal boron nitride powder having a large particle size and having excellent lubricity can be obtained by applying a specific treatment to a crude hexagonal boron nitride powder.

Further, Patent Document 7 discloses a hexagonal boron nitride powder obtained by mixing a compound containing lanthanum as the main component with a crude hexagonal boron nitride powder and subjected the mixture to heat treatment in a non-oxidizing gas atmosphere within a specific temperature range to develop the crystallite size (Lc) of the 002 plane, and discloses that this hexagonal boron nitride powder is excellent in the dispersibility and has high crystallinity.

Further, with respect to hexagonal boron nitride, Patent Document 8 discloses that a crude hexagonal boron nitride powder is aged in the atmospheric pressure at 60° C. or below for at least one week, and then subjected to specific baking, whereby a powder having a large particle size and high crystallinity can be obtained.

Patent Document 9 discloses a hexagonal boron nitride powder developed to have an average particle size of 10 μm or larger by aging a crude hexagonal boron nitride powder in the atmospheric pressure at 60° C. or below for at least one week, washing it and subjecting it to specific baking treatment.

However, h-BN is in the form of plate-shaped particles, and has high thermal conductivity (usually, a coefficient of thermal conductivity of about 250 W/mK) in its plane direction (the C-plane direction or the (002) plane direction) but has only low thermal conductivity (usually, a coefficient of thermal conductivity of from about 2 to 3 W/mK) in the thickness direction (the C-axis direction). Thus, if this is blended with a resin to prepare a coating liquid of a composition, which is applied to a substrate surface to form a coating film, and the coating film is heated for the B-stage formation, and further temporally bonding and main bonding are carried out to produce a three-dimensional integrated circuit, in the produced three-dimensional integrated circuit, the plate-shaped BN particles are aligned in the plane direction of the coating film, and the formed filling interlayer is excellent in the coefficient of thermal conductivity in the layer plane direction but has only a low coefficient in the thickness direction.

Heretofore, in order to improve the anisotropy of the thermal conductivity of the BN particles, a h-BN powder not having a scaly shape, which is less likely to be aligned as above even when blended with a resin, has been studied. Such a h-BN powder may, for example, be h-BN particles granulated by spray drying, or h-BN particles produced by sintering h-BN and grinding the sintered h-BN (for example, Patent Documents 2 and 10).

Further, as other agglomerated particles, BN particles in the form of a pine cone having h-BN particles prepared from a mixture of boric acid and melamine agglomerated without being aligned, have been proposed (for example, Patent Document 11).

PRIOR ART DOCUMENTS

Patent Documents

Patent Document 1: JP-A-2008-510878
Patent Document 2: JP-A-2006-257392
Patent Document 3: JP-A-2008-189818
Patent Document 4: JP-A-2010-505729
Patent Document 5: JP-A-61-7260
Patent Document 6: JP-A-9-263402
Patent Document 7: JP-A-9-295801
Patent Document 8: JP-A-2010-37123
Patent Document 9: JP-A-2010-42963
Patent Document 10: JP-A-2008-510878
Patent Document 11: JP-A-9-202663

Non-Patent Documents

Non-Patent Document 1: Proceedings of The Japan Institute of Electronics Packaging, Annual Meeting, 61, 23, 2009
Non-Patent Document 2: Science and Application of Soldering (Kogyo Chosakai Publishing Co., Ltd.)

DISCLOSURE OF INVENTION

Technical Problem

Conventional h-BN granulated particles are likely to be broken and disintegrated when kneaded with a resin, although they have improved thermal conductivity anisotropy as granulated particles, since the size of constituting h-BN primary particles to achieve high thermal conductivity is so large as several micron or larger, and they are randomly agglomerated, and as a result, the low thermal conductivity planes of the h-BN particles are aligned in the thickness direction when a formed product is prepared. Further, for spherical agglomerates as disclosed in prior art documents, h-BN primary particles constituting the agglomerates are large particles of several micron or larger. This is to secure thermal conductivity of agglomerates by using material h-BN particles having high crystallinity, however, if such highly crystalline h-BN material is used, it is difficult to prepare agglomerated BN particles of at most 25 μm, restricted by the size of the h-BN primary particles. Further, even if crystallization is promoted by heat treatment, due to high crystallinity of the material h-BN itself, no further crystal growth can be expected, and the crystal growth direction cannot be controlled.

The agglomerated structure in the form of a pine cone disclosed in Patent Document 11 or the like has high purity since no binding agent is used, and is expected to have small thermal conductivity anisotropy, however, the size of the constituting h-BN particles is so large as several micron to several hundreds micron, and when the h-BN particles are kneaded with a resin, they are disintegrated and their low thermal conductivity plane are aligned in the direction of the thickness of the formed product. Further, a problem such that the crystal growth direction of the h-BN primary particles constituting the agglomerated particles cannot be controlled still remains.

On the other hand, in the powder produced by grinding sintered h-BN, h-BN primary particles are aligned at the time of hot pressing or preliminary forming in the process for producing sintered h-BN, and the proportion of particles agglomerated in a state where the primary particles are aligned is high, and therefore some improvements are achieved, however, the problem still remains that the low thermal conductivity planes of h-BN are aligned in the direction of the thickness of the formed product.

As described above, it has not yet been achieved to control the crystal growth direction (primary particles of the BN crystal grow in a normal direction so that their a-axes face outward) and the size of the h-BN primary particles constituting the agglomerated powder, and to obtain boron nitride particles having the thermal conductivity anisotropy and the disintegration of the agglomerated structure by kneading with a resin suppressed.

The object of the present invention is to provide specific boron nitride particles (hereinafter sometimes referred to as BN particles), to provide particles of boron nitride having a specific crystal structure (hereinafter sometimes referred to as specific crystalline BN particles) and agglomerated boron nitride particles having boron nitride primary particles having a specific average particle size on their surface (hereinafter sometimes referred to as agglomerated BN particles), and to provide BN particles excellent in the isotropy of thermal conductivity, disintegration resistance and kneading property with a resin. Further, another object is to provide a composition for a three-dimensional integrated circuit capable of forming a filling interlayer excellent in the thermal conductivity also in the thickness direction and its coating liquid (sometimes referred to as a composition coating liquid), using the BN particles, a laminate for a three-dimensional integrated circuit using the coating liquid, and a process for producing a three-dimensional integrated circuit.

Solution to Problem

The present inventors have conducted extensive studies to achieve the above objects and as a result, found that the above objects can be achieved by using, as boron nitride as a filler to be used for a composition filled between layers of a laminate for a three-dimensional integrated circuit, at least one BN particles selected from the specific crystalline BN particles and agglomerated BN particles.

The agglomerated BN particles used in the present invention have specific total pore volume and specific surface area and have very small primary particles of h-BN crystals arranged on their surface or have such primary particles radially arranged (the primary particles of the h-BN crystal are arranged in a normal direction so that their a-axes face outward). The present inventors have found that by using such agglomerated BN particles as a filler of a composition, the frequency that the highly thermally conductive planes (C-planes) of the particles of the h-BN crystal are contacted via the a-axes on their surface increases and as a result, the thermal conductivity in the thickness direction of the formed filling interlayer is significantly improved.

The present invention has been accomplished based on such discoveries, and provides the following.

(1) Agglomerated boron nitride particles which have a specific surface area of at least 10 m$^2$/g and a total pore volume of at most 2.15 cm$^3$/g, and the surface of which is constituted by boron nitride primary particles having an average particles size of at least 0.05 μm and at most 1 μm.

(2) Agglomerated boron nitride particles which are spherical, and on the surface of which boron nitride primary particles having an average particle size of at most 1 μm are radially arranged.

(3) The agglomerated boron nitride particles according to the above (1) or (2), wherein the volume-based maximum particle size is within a range of at least 0.1 μm and at most 25 μm.

(4) The agglomerated boron nitride particles according to any one of the above (1) to (4), wherein the bulk density is at least 0.3 g/cm$^3$.

(5) A process for producing agglomerated boron nitride particles, comprising a granulation step using a slurry containing a material boron nitride powder,
wherein the volume-based average particle size $D_{50}$ of the material boron nitride powder in the slurry is at most ⅕ of the volume-based average particle size $D_{50}$ of granulated particles.

(6) The process for producing agglomerated boron nitride particles according to the above (5), wherein the total oxygen content of the material boron nitride powder is at least 1 wt % and at most 10 wt %.

(7) The process for producing agglomerated boron nitride particles according to the above (5) or (6), wherein the material boron nitride powder satisfies the following conditions <1> and/or <2>:
<1> the total pore volume is at most 1.0 cm$^3$/g; and
<2> the specific surface area is at least 20 m$^2$/g.

(8) The process for producing agglomerated boron nitride particles according to any one of the above (5) to (7), wherein the slurry containing a material boron nitride powder is granulated into spherical particles by a spray drying method, and the obtained granulated particles are subjected to heat treatment in a non-oxidizing gas atmosphere.

(9) The process for producing agglomerated boron nitride particles according to any one of the above (5) to (8), wherein the slurry containing a material boron nitride powder contains a metal oxide in an amount of at least 1 wt % and at most 30 wt % based on the material boron nitride powder.

(10) A composition containing a resin (A) having a melt viscosity at 120° C. of at most 100 Pa·s and a filler (B) comprising the agglomerated boron nitride particles as defined in any one of the above (1) to (4).

(11) The composition according to the above (10), which contains the filler (B) in an amount of at least 40 parts by weight and at most 400 parts by weight per 100 parts by weight of the resin (A).

(12) A composition containing a filler (B) comprising agglomerated boron nitride particles produced by the process for producing agglomerated boron nitride particles as defined in any one of the above (5) to (9) and a resin (A) having a melt viscosity at 120° C. of at most 100 Pa·s.

(13) The composition according to the above (12), wherein the volume average particle size of the filer (B) is at most 10 μm.

(14) The composition according to the above (12) or (13), which contains the filler (B) in an amount of at least 40 parts by weight and at most 400 parts by weight per 100 parts by weight of the resin (A).

(15) A composition comprising a resin (A) having a melt viscosity at 120° C. of at most 100 Pa·s and a filler (B) comprising boron nitride which has a crystallite size (Lc) of the 002 plane of at least 450 [Å], a crystallite size (La) of the 100 plane of at least 500 [Å], the crystallize size (Lc) and the crystallite size (La) satisfying the following formula (i), and has an oxygen content of at most 0.30 wt %:

$$0.70 \leq Lc/La \quad \text{(i)}$$

(16) The composition according to the above (15), wherein the volume average particle size of the filler (B) is at most 10 µm.

(17) The composition according to the above (15) or (16), which contains the filler (B) in an amount of at least 40 parts by weight and at most 400 parts by weight per 100 parts by weight of the resin (A).

(18) The composition according to any one of the above (10) to (17), which further contains a curing agent (C).

(19) The composition according to any one of the above (10) to (18), which further contains a flux (D).

(20) The composition according to any one of the above (10) to (19), wherein the resin (A) is a thermosetting resin.

(21) The composition according to the above (20), wherein the thermosetting rein is an epoxy resin (a).

(22) The composition according to the above (21), wherein the epoxy resin (a) comprises an epoxy resin (a1) having an epoxy equivalent of at least 100 g/equivalent and less than 650 g/equivalent.

(23) The composition according to the above (21) or (22), wherein the epoxy resin (a) comprises an epoxy resin (a2) having an epoxy equivalent of at least 650 g/equivalent and at most 30,000 g/equivalent.

(24) The composition according to any one of the above (21) to (23), wherein the epoxy resin (a) is a phenoxy resin having at least one skeleton among a bisphenol A skeleton, a bisphenol F skeleton and a biphenyl skeleton.

(25) A composition coating liquid comprising the composition as defined in any one of the above (10) to (24) and an organic solvent (E).

(26) A process for producing a three-dimensional integrated circuit, which comprises forming a film of the composition coating liquid as defined in the above (25) on the surface of a plurality of semiconductor substrates, and pressure-bonding such semiconductor substrates.

(27) A three-dimensional integrated circuit, which comprises a semiconductor substrate laminate having at least two semiconductor substrates each having a semiconductor device layer formed thereon laminated, and a layer containing the composition as defined in any one of the above (10) to (24).

Advantageous Effects of Invention

According to the present invention, the crystal growth direction of h-BN can easily be controlled to obtain specific crystalline BN particles. Further, the crystal growth direction and the particle size of h-BN primary particles constituting agglomerated BN particles are easily controlled to produce agglomerated BN particles having a desired particle size and isotropic thermal conductivity, on the surface of which crystals of h-BN primary particles having a specific particle size are arranged or radially arranged.

Further, by the composition or the coating liquid containing BN particles for a three-dimensional integrated circuit of the present invention, a filling interlayer having favorable thermal conductivity also in the thickness direction can be formed. Further, the BN particles to be used as a filler are excellent also in the kneading property with a resin and accordingly, a coating film formed by using the composition coating liquid of the present invention containing such a filler is a homogeneous coating film excellent in the film properties, and a homogeneous B-stage film can be formed by subjecting the coating film into B-stage formation.

Thus, since a favorable filling interlayer can be formed by heat curing the B-stage film, a high quality three-dimensional integrated circuit excellent in the thermal conductivity can be realized.

DESCRIPTION OF EMBODIMENTS

Figure 1A:
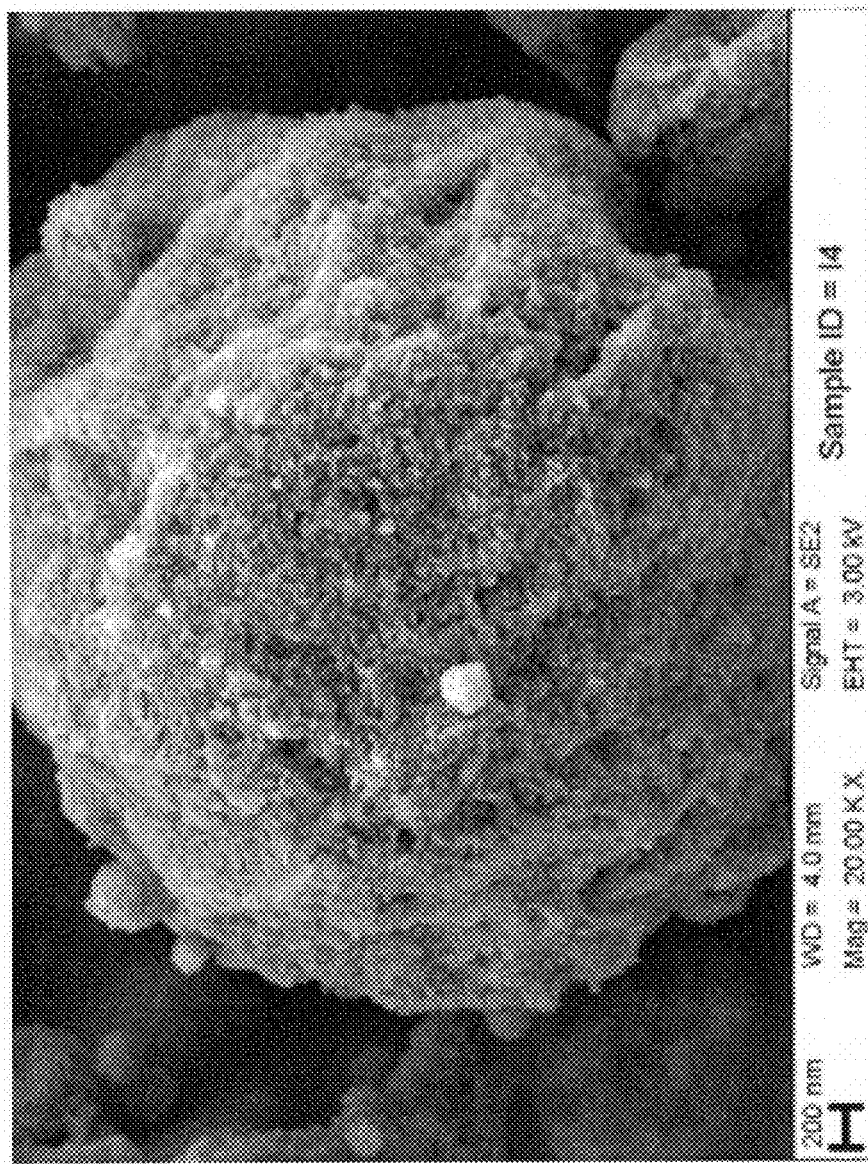
FIG. 1(a) is a SEM photograph of agglomerated BN particles (BN-A) in Example 1-1 and agglomerated BN particles in Preparation Example 3 before heat treatment.

Now, the present invention will be described in detail below. However, the present invention is by no means restricted to the following specific description, and various modifications are possible within the range of the scope of the present invention.

[Particles of Boron Nitride (BN Particles)]

The particles of boron nitride (BN particles) in the present invention may be particles of boron nitride having a specific crystal structure (specific crystalline BN particles) or may be agglomerated boron nitride particles (agglomerated BN particles) having boron nitride agglomerated by granulation. The specific crystalline BN particles may be used as the material of the agglomerated BN particles, however, the material of the agglomerated BN particles is not limited to the specific crystalline BN particles, and specific material primary particles which will be described in detail below may be used. The BN particles of the present invention have particularly remarkable effects when contained between layers of a three-dimensional integrated circuit.

<Specific Crystalline BN Particles>

The sizes of a crystallite in the present invention are crystallite sizes of the 002 plane and the 100 plane, respectively, and the crystallite size (Lc) of the 002 plane can be obtained by measuring the half value width of a peak at 2θ=26.5° in X-ray diffraction, and in accordance with the following formula (ii). The crystallite size (La) of the 100 plane can also be obtained by measuring the half value width of a peak at 2θ=41.5° in X-ray diffraction, and in accordance with the following formula (ii):

$$L(\text{Å}) = (0.9 \lambda \cdot 180)/(\beta \cdot \cos \theta \cdot \pi) \quad \text{(ii)}$$

λ: 1.54056 Å
β: Peak half value width

The specific crystalline BN particles of the present invention have a crystallite size (La) of the 100 plane of at least 500 [Å]. By the La being at least 500 [Å], the crystallite interface is sufficiently small, whereby high thermal conductivity can be obtained. The La is more preferably at least 550 [Å], particularly preferably at least 600 [Å], with a view to further increasing the thermal conductivity.

On the other hand, from the viewpoint of industrial productivity, the La is preferably at most 2,000 [Å], more preferably at most 1,000 [Å].

This La can be adjusted, in production of the specific crystalline BN particles of the present invention, by subjecting h-BN having La less than 500 Å for example to heat treatment in a non-oxidizing gas at a temperature of usually from 1,300 to 2,300° C., preferably from 1,500 to 2,100° C., more preferably from 1,800 to 2,000° C., and in order to increase La, heat treatment is carried out for a long time at a temperature as high as possible within the above temperature range.

The specific crystalline BN particles of the present invention have a crystallite size (Lc: hexagonal mesh lamination direction) of the 002 plane of at least 450 [Å]. By the Lc being at least 450 [Å], the crystallite interface is sufficiently small, whereby high thermal conductivity can be obtained. The Lc is more preferably at least 470 [Å], particularly preferably at least 500 [Å] with a view to further increasing the thermal conductivity.

On the other hand, from the viewpoint of industrial productivity, the Lc is preferably at most 2,000 [Å], more preferably at most 1,000 [Å].

This Lc can be adjusted, in production of the agglomerated BN particles of the present invention, by subjecting h-BN having Lc less than 450 Å for example to heat treatment in a non-oxidizing gas at a temperature of usually from 1,500 to 2,300° C., preferably from 1,800 to 2,100° C. In order to increase Lc, a method of using the above material h-BN having an oxygen content less than 1.0 wt % may preferably be employed.

Of the agglomerated BN particles of the present invention, the relation between the Lc and the La satisfies the following relational expression (i):

$$0.70 \leq Lc/La \qquad (i)$$

The above relational expression (i) indicates the shape anisotropy of the specific crystalline BN particles of the present invention, and the closer to 1 the Lc/La is, the smaller the shape anisotropy is.

By the specific crystalline BN particles of the present invention satisfying the above relational expression (i), an increase of the viscosity of a composition containing such particles and a resin can be prevented. Further, an increase in the viscosity of a composition containing agglomerated boron nitride particles formed by using the specific crystalline BN particles of the present invention as a material and a resin can be prevented.

The relation between Lc and La is more preferably $0.75 \leq Lc/La$, particularly preferably $0.78 \leq Lc/La$. On the other hand, the relation between Lc and La is preferably $Lc/La \leq 1.2$ from the viewpoint of reducing the shape anisotropy.

The specific crystalline BN particles of the present invention has an oxygen content of at most 0.30 wt %. By the specific crystalline BN particles having an oxygen content of at most 0.30 wt %, a composition containing such particle and a resin has a preferred coefficient of thermal conductivity. The oxygen content is more preferably at most 0.25 wt %, particularly preferably at most 0.15 wt %. On the other hand, the lower limit of the oxygen content is usually 0.01 wt %.

An oxygen content of the specific crystalline BN particles of the present invention within such a range can be achieved, in the process for producing the specific crystalline BN particles, by firing in a non-oxidizing gas atmosphere. Firing in a nitrogen gas atmosphere is particularly preferred to reduce the oxygen content.

The oxygen content of the specific crystalline BN particles of the present invention can be measured by an oxygen/nitrogen analyzer manufactured by HORIBA, Ltd. by an inert gas fusion-infrared absorption method.

The specific crystalline BN particles of the present invention preferably have an average particle size of at most 10 μm. Further, the specific crystalline BN particles of the present invention more preferably have an average particle size of at most 7 μm, further preferably at most 5 μm, particularly preferably at most 4 μm. On the other hand, the average particle size is preferably at least 0.1 μm, with a view to obtaining favorable thermal conductivity and favorable fluidity.

The average particle size of the specific crystalline BN particles of the present invention can be measured by a laser diffraction/scattering type particle size distribution measuring apparatus LA-920 manufactured by HORIBA, Ltd. with respect to a dispersion of the specific crystalline BN particles in a proper solvent. The average particle size of the specific crystalline BN particles can be obtained from the obtained particle size distribution. The average particle size here is a volume-based average particle size. The average particle size of the specific crystalline BN particles in a filling interlayer composition can also be measured by the same apparatus as above with respect to a dispersion in a proper solvent.

(Process for Producing Specific Crystalline BN Particles)

As the material to be used to obtain the specific crystalline BN particles of the present invention, any of commercially available hexagonal boron nitride, commercially available α- or β-boron nitride, boron nitride prepared by a reduction nitridation method of a boron compound and ammonia, boron nitride prepared from a boron compound and a nitrogen-containing compound such as melamine, and boron nitride prepared from sodium borohydride and ammonium chloride may be used without any restriction, and hexagonal boron nitride is particularly preferably used.

Among such materials, in order that the specific crystalline BN particles of the present invention have predetermined crystallite sizes, the material is particularly preferably hexagonal boron nitride particularly having La of at least 300 [Å], and more preferably having Lc of at least 250 [Å] and Lc/La of from 0.8 to 1.0.

The specific crystalline BN particles of the present invention can be obtained by firing the above materials in a non-oxidizing gas atmosphere at a temperature of from 1,800 to 2,300° C.

The non-oxidizing gas may, for example, be nitrogen gas, helium gas, argon gas, ammonia gas or carbon monoxide, and is particularly suitably nitrogen gas.

The firing time is at a level of from 1 to 20 hours, more preferably from 3 to 15 hours, particularly preferably from 5 to 15 hours.

The firing temperature and the firing time may properly be adjusted so that both Lc and La of the specific crystalline BN particles of the present invention are large.

Further, a furnace to be used for firing is particularly preferably a carbon furnace, and a crucible in which hexagonal boron nitride is put at the time of firing is particularly preferably made of carbon.

Further, at the time of firing, an additive may be added within a range not to impair the desired crystal growth of hexagonal boron nitride.

Further, the specific crystalline BN particles immediately after production may not satisfy the above range of the particle size since the obtained particles are further agglomerated. Accordingly, the specific crystalline BN particles are preferably ground to satisfy the above range of the particle size.

The method for grinding the specific crystalline BN particles is not particularly limited, and a known grinding method such as a method of stirring and mixing the particles together with grinding media such as zirconia beads or jet spraying may be employed.

In a case where the specific crystalline BN particles of the present invention are contained in a composition, such specific crystalline BN particles may be used alone, or two or more kinds of the specific crystalline BN particles differing in the physical properties may be used in combination, or further, the agglomerated BN particles of the present invention may be used in combination.

<Agglomerated BN Particles>

The agglomerated boron nitride particles (agglomerated BN particles) of the present invention have a specific surface area of 10 $m^2/g$ and a total pore volume of at most 2.15 $cm^3/g$, and their surface is constituted by boron nitride primary particles having an average particle size of at least 0.05 µm and at most 1 µm.

The agglomerated BN particles of the present invention have an average particle size of preferably at most 10 µm, more preferably at most 7 µm, further preferably at most 5 µm, particularly preferably at most 4 µm. On the other hand, the average particle size is preferably at least 0.1 µm, with a view to obtaining favorable thermal conductivity and favorable fluidity.

The average particle size of the agglomerated BN particles of the present invention may be measured by a laser diffraction/scattering type particle size distribution measuring apparatus LA-920 manufactured by HORIBA, Ltd. with respect to a dispersion of the agglomerated BN particles in a proper solvent. The average particle size of the agglomerated BN particles can be obtained from the obtained particle size distribution.

The average particle size here is a volume-based average particle size. The average particle size of the agglomerated boron nitride particles BN particles in the composition can also be measured by the same apparatus as above with respect to a dispersion in a proper solvent.

The agglomerated BN particles of the present invention usually have a total pore volume of at most 2.15 $cm^3/g$. By the total pore volume being small, the agglomerated BN particles are densely agglomerated, whereby the interface which inhibits thermal conductivity can be made small, and agglomerated BN particles having further higher thermal conductivity can be obtained.

The total pore volume of the agglomerated BN particles is usually at most 2.15 $cm^3/g$, preferably at least 0.3 $cm^3/g$ and at most 2.00 $cm^3/g$, more preferably at least 0.5 $cm^3/g$ and at most 1.95 $cm^3/g$. Further, the specific surface area of the agglomerated BN particles is usually at least 20 $m^2/g$, and is preferably at least 20 $m^2/g$ and at most 50 $m^2/g$, more preferably at least 25 $m^2/g$ and at most 30 $m^2/g$.

The total pore volume of the agglomerated BN powder may be measured by a mercury intrusion technique, and the specific surface area may be measured by a BET one point method (absorption gas: nitrogen).

The total pore volume and the specific surface area of the agglomerated BN powder can be measured specifically by the method disclosed in the after-mentioned Examples.

The agglomerated BN particles of the present invention are preferably spherical. In the present invention, "spherical" means particles granulated by agglomerating the after-mentioned material BN powder into a shape with an aspect ratio (the ratio of the major axis to the minor axis) being at least 1 and at most 2, preferably at least 1 and at most 1.5, not primary particles. That is, in the present invention, "spherical" or "spherical shape" mean an aspect ratio being at least 1 and at most 2. This aspect ratio is preferably at least 1 and at most 1.5. The aspect ratio of the granulated agglomerated BN particles is determined by optionally selecting at least 200 particles from an image taken by a scanning electron microscope (SEM), obtaining the ratios of the major axis to the minor axis of the respective particles and calculating their average.

The particle size of the granulated particle obtained by granulation is preferably from 2 to 20 µm, particularly preferably from 5 to 10 µm in terms of the volume-based average particle size $D_{50}$, in order that the agglomerated BN particles of the present invention after heat treatment have a preferred volume-based maximum particle size within a range of from 0.1 to 25 µm. The volume-based average particle size $D_{50}$ of the granulated particles can be measured, for example, by "Microtrac HRA" manufactured by NIKKISO CO., LTD.

The agglomerated BN particles immediately after production may not satisfy the above range of the particle size in some cases since the obtained particles are further agglomerated. Thus, the agglomerated BN particles are preferably ground to satisfy the above range of the particle size.

The method for grinding the agglomerated BN particles is not particularly limited, and a known grinding method such as a method of stirring and mixing the particles together with grinding media such as zirconia beads or jet spraying may be employed.

In a case where the agglomerated BN particles of the present invention are contained in a composition, such agglomerated BN particles may be used alone, or two or more kinds of the agglomerated BN particles differing in the physical properties may optionally be combined, or further, the specific crystalline BN particles of the present invention may be used in combination.

For example, two or more kinds of the agglomerated BN particles differing in the average particle size may be used. That is, by use of agglomerated BN particles having a relatively small particle size, for example, from 0.1 to 2 µm, preferably from 0.2 to 1.5 µm, and agglomerated BN particles having a relatively large average particle size, for example, from 1 to 5 µm, preferably from 1 to 3 µm, in combination, thermally conductive paths of the agglomerated BN particles having a large average particle size are connected by the agglomerated BN particles having a small average particle size, high filling becomes possible as compared with a case of using only one having a single average particle size, and higher thermal conductivity can be obtained.

In such a case, it is preferred to use the agglomerated BN particles having a small average particle size and the agglomerated BN particles having a large particle size in a weight ratio of from 10:1 to 1:10, in view of formation of thermally conductive paths.

Further, in a case where the agglomerated BN particles are used as the filler (B) to be used for a composition containing the after-mentioned resin (A), the agglomerated BN particles may be properly subjected to surface treatment to increase the dispersibility in the resin (A) or in the coating liquid.

<Process for Producing Agglomerated BN Particles>

In the present invention, the process for producing the agglomerated BN particles is not limited, however, it preferably comprises a grinding step of grinding boron nitride as the material (hereinafter this boron nitride together with one obtained by grinding this boron nitride will sometimes be referred to as material BN powder), a granulation step of agglomerating the powder, and a heating step of subjecting the granules to heat treatment. More specifically, the material BN powder is once dispersed in a medium to prepare a slurry of the material BN powder (hereinafter sometimes referred to as "BN slurry"), followed by grinding treatment, and using the obtained slurry, spherical particles are granulated, and heat treatment is carried out for crystallization of the agglomerated BN granulated particles.

(Material BN Powder)

In the present invention, as boron nitride (material BN powder) as the material in production of the agglomerated BN particles, any of commercially available h-BN, commercially available α- or β-BN, BN prepared by a reduction nitridation method of a boron compound and ammonia, BN prepared from a boron compound and a nitrogen-containing compound such as melamine, and BN prepared from sodium borohydride and ammonium chloride may be used without any restriction, and h-BN is particularly preferably used.

From the viewpoint of the h-BN crystal growth, oxygen is preferably present to a certain extent in the material BN powder such as h-BN to be the material, and for the agglomerated BN particles of the present invention, it is preferred to use as the material BN powder one having a total oxygen content of at least 1 wt % and at most 10 wt %, more preferably at least 3 wt % and at most 10 wt %, further preferably at least 3 wt % and at most 9 wt %.

With the material BN powder having a total oxygen content within the above range, crystals are likely to grow by the heat treatment since the primary particle size is small and the crystals have not been developed in many cases. In the present invention, it is preferred to grow BN crystals by subjecting agglomerated BN particles having the material BN powder agglomerated by granulation to heat treatment, and by using the material BN powder having a total oxygen content within the above range, the primary particles of the BN crystal can be grown in a normal direction so that the a-axes face outward, that is, the BN primary particles can be radially arranged on the agglomerated BN particle surface.

If the total oxygen content of the material BN powder is less than the above lower limit, since the purity and the crystallinity of the material BN powder itself are good, the crystal growth of the C-plane will not sufficiently be achieved, the BN primary particles cannot be radially arranged on the agglomerated BN particle surface, and on the other hand, if the total oxygen content exceeds the above upper limit, the oxygen content is high even after the heat treatment, and when the resulting agglomerated particles are used as the filler (B) of a composition, high thermal conductivity cannot be achieved.

Accordingly, when such agglomerated BN particles are used as a thermally conductive filler (B) of a composition to form a filling interlayer, thermally conductive paths are likely to form by contact of highly thermally conductive planes (C-planes) of h-BN via the a-axes in the filling interlayer, and thus highly thermally conductivity even in a direction of the thickness of the filling interlayer can be obtained.

To adjust the total oxygen content of the material BN powder within the above range, a method of preparing BN at a low temperature of at most 1,800° C. may, for example, be mentioned.

Further, as the material BN powder having a total oxygen content within the above preferred range, commercially available products may be used, and for example, h-BN "ABN" manufactured by NISSHIN REFRATECH CO., LTD. or h-BN "AP170S" manufactured by MARUKA CORPORATION may be mentioned.

The oxygen content of the material BN powder used in the present invention may be measured by an oxygen/nitrogen analyzer manufactured by HORIBA, Ltd. by an inert gas fusion-infrared absorption method.

Further, the material BN powder preferably satisfies the following (1) and/or (2):

(1) the total pore volume is at most 1.0 $cm^3/g$;
(2) the specific surface area is at least 20 $m^2/g$.

By the total pore volume being at most 1.0 $cm^3/g$, the material BN powder is dense, whereby such a powder is used as primary particles constituting the agglomerated BN particles, granulation with high sphericity can be achieved. Further, by the specific surface area being at least 20 $m^2/g$, the dispersed particle size in the BN slurry to be used at the time of formation into spheres by granulation can be made small, such being favorable.

Usually, the total pore volume of the material BN powder is at most 1.0 $cm^3/g$, and is preferably at least 0.3 $cm^3/g$ and at most 1.0 $cm^3/g$, more preferably at least 0.5 $cm^3/g$ and at most 1.0 $cm^3/g$. Further, usually, the specific surface area of the material BN powder is at least 20 $m^2/g$, and is preferably at least 20 $m^2/g$ and at most 500 $m^2/g$, more preferably at least 50 $m^2/g$ and at most 200 $m^2/g$.

The total pore volume of the material BN powder may be measured by a mercury intrusion technique, and the specific surface area may be measured by a BET one point method (adsorption gas: nitrogen).

The total pore volume and the specific surface area of the material BN powder are specifically measured by the method disclosed in the after-mentioned Examples.

Further, the above material BN powder also preferably has particularly La of at least 300[Å], Lc of at least 250[Å] and Lc/La of from 0.8 to 1.0, in order that the agglomerated BN particles of the present invention have predetermined crystallite sizes.

(Preparation of BN Slurry)

The medium to be used for preparation of the BN slurry is not particularly limited, and water and/or various organic solvents may be used, and in view of easiness of spray drying, simplification of an apparatus, etc., water (pure water) is preferably used.

The amount of use of water is preferably from 1 to 20 times by weight, particularly preferably from 1 to 10 times by weight, to the material BN powder, since if it is too large, a load at the time of spray drying tends to increase, and if it is too small, uniform dispersion tends to be difficult.

(Surfactant)

To the BN slurry, various surfactants may be added with a view to suppressing an increase in the viscosity of the slurry at the time of after-mentioned grinding treatment and from the viewpoint of the dispersion stability (suppression of agglomeration) of the BN particles.

As the surfactant, an anionic surfactant, a cationic surfactant, a nonionic surfactant and the like may be used, and they may be used alone or as a mixture of at least two.

In a case where a surfactant is added to the BN slurry, the surfactant concentration of the BN slurry is preferably at least 0.1 wt % and at most 10 wt %, particularly preferably at least 0.5 wt % and at most 5 wt %. By the BN slurry concentration being at least the lower limit, the above effects by addition of a surfactant will sufficiently be obtained, and when the BN slurry concentration being at most the upper limit, the influence of the remaining carbon can be minimized at the time when a BN slurry having a high material BN powder content is prepared, followed by granulation and heat treatment.

The surfactant may be added before the following grinding treatment or may be added after the grinding treatment.
(Binder)

The BN slurry preferably contains a binder in order to effectively granulate the material BN powder into agglomerated particles. A binder basically acts to firmly bind the material BN powder, the particles of which have no adhesion to one another, and to stabilize the shape of the granulated particles.

The binder to be used for the BN slurry is not limited so long as it increases the adhesion of the BN particles, and in the present invention, since the granulated particles are subjected to heat treatment after being agglomerated, the binder is preferably one having heat resistance to the high temperature conditions in the heat treatment procedure.

Such a binder is preferably a metal oxide, and specifically, preferably used is aluminum oxide, magnesium oxide, yttrium oxide, calcium oxide, silicon oxide, boron oxide, cerium oxide, zirconium oxide, titanium oxide or the like. Among them, from the viewpoint of the thermal conductivity and the heat resistance as an oxide, the binding power to bind the BN particles, etc., aluminum oxide or yttrium oxide is suitable. Further, as the binder, a liquid binder such as alumina sol may be used.

Such binders may be used alone or as a mixture of at least two.

The amount of use of the binder (in a case of a liquid binder, the amount of use as the solid content) is preferably at least 1 wt % and at most 30 wt %, more preferably at least 1 wt % and at most 20 wt %, further preferably at least 5 wt % and at most 20 wt % to the material BN powder in the BN slurry. If the amount of use of the binder is less than the above lower limit, the effects to bind the BN particles tend to be small, whereby the granulated particles may not maintain the shape after granulation, and if it exceeds the upper limit, the content of BN in the granulated particles tends to be low, whereby not only the crystal growth is influenced but also when such particles are used as a thermally conductive filler, the effect to improve the coefficient of thermal conductivity may be small.
(Grinding Treatment)

The BN slurry may be subjected to a granulation step by spray drying as it is, however, it is preferred, prior to granulation, to subject the BN particles of the material BN powder in the slurry to grinding treatment to make the BN particles smaller, and by grinding the BN particles and making them smaller, agglomeration will smoothly be carried out.

That is, depending on the particle size of the material BN powder, if the material BN powder is dispersed as it is in a medium, many particles will not be granulated in the agglomeration step since the BN particles are in a plate shape, however, by making the BN particles smaller, effective agglomeration will be carried out.

For grinding, a conventional grinding method by a bead mill, a ball mill, a pin mill or the like may be employed, and preferred is a bead mill from the viewpoint such that a large quantity of a slurry is capable of circulating grinding and the ground particle size can easily be controlled. Further, since the viscosity of the BN slurry is increased by making the BN particles smaller by grinding, one capable of grinding at a higher concentration with a high viscosity is preferred, and in addition, since the temperature of the BN slurry is also increased along with progress of grinding, one equipped with a cooling system is preferred. Such an apparatus may, for example, be "OB Mill" manufactured by FREUND-TURBO CORPORATION or "Star Mill LMZ series" manufactured by Ashizawa Finetech Ltd.

In the present invention, the BN powder is ground so that the volume-based average particle size $D_{50}$ of the material BN powder in the slurry is at most ⅕ of the volume-based average particle size $D_{50}$ of spherically granulated BN particles. If the volume-based average particle size $D_{50}$ of the material BN powder in the BN slurry is larger than ⅕ of the volume-based average particle size $D_{50}$ of the granulated particles, since the BN particles are in a plate shape, many particles will not be granulated into spheres in the granulation step of forming the particles into spheres, and the strength of the particles after granulation tends to be weak. Considering the grinding effect and the load of grinding, the volume-based average particle size $D_{50}$ of the material BN powder in the BN slurry to be subjected to grinding is preferably from 1/100 to ⅕, particularly preferably from 1/50 to ⅕ of the volume-based average particle size $D_{50}$ of the granulated particles obtained by granulation of the BN slurry.

The volume-based average particle size $D_{50}$ of the material BN powder in the BN slurry can be measured by a laser diffraction/scattering type particle size distribution measuring apparatus (e.g. "LA-920" manufactured by HORIBA, Ltd., Microtrac "FRA", "HRA", "MT3300EX", "UPA-EX150" manufactured by NIKKISO CO., LTD., or Nanotrac "UPA-EX150" manufactured by NIKKISO CO., LTD.), for example, with respect to a dispersion of the slurry after grinding in a proper solvent.

The volume-based average particle size $D_{50}$ of the material BN powder in the BN slurry may specifically be measured by the method disclosed in the after-mentioned Examples.
(Granulation (Agglomeration))

To obtain granulated particles as the agglomerated BN particles from the BN slurry, a spray drying method is preferably used. By the spray drying method, it is possible to produce granulated particles having a desired size, and it is also possible to obtain spherical granulated particles, by controlling the concentration of the slurry as the material, the liquid amount per unit time send to the apparatus, and the air pressure and the air amount at the time of spraying the sent slurry. The spray drying apparatus to be used for formation into spheres is not particularly limited, and in order to obtain further smaller spherical BN granulated particles, most preferred is one having a four-fluid nozzle. Such an apparatus may, for example, be "MDL-050M" manufactured by Fujisaki Electric Co., Ltd.
(Heat Treatment)

The granulated particles of boron nitride obtained by granulation are preferably further subjected to heat treatment in a non-oxidizing gas atmosphere.

Here, the non-oxidizing gas atmosphere is an atmosphere of e.g. nitrogen gas, helium gas, argon gas, ammonia gas, hydrogen gas, methane gas, propane gas or carbon monoxide gas. The rate of crystallization of the agglomerated BN particles varies depending upon the type of the atmospheric gas used, and for example, in an argon gas, the rate of crystallization tends to be low, and the heat treatment time will be long. In order to carry out crystallization in short time, particularly a nitrogen gas or a mixed gas of a nitrogen gas with another gas is preferably used. To properly select the heat treatment conditions is also important to arrange boron nitride primary particles having an average particle size of at most 1 μm on the surface and radially in addition, while the specific surface area and the total pore volume of the agglomerated BN particles of the present invention are within specific ranges.

The heat treatment temperature is usually from 1,300 to 2,100° C., preferably from 1,300 to 2,000° C., further preferably from 1,400 to 2,000° C. If the heat treatment temperature is less than the following lower limit, crystallization of h-BN tends to be insufficient, an amorphous portion where crystallization is undeveloped remains, and the effect to improve the coefficient of thermal conductivity when the particles are used as a thermally conductive filler tends to be small. If the heat treatment temperature exceeds the above upper limit, the added binder component tends to be molten/decomposed and the agglomerated BN particles are agglomerated, whereby the original shape may not be maintained, or decomposition of BN may occur.

The heat treatment time is usually at least 1 hour and at most 50 hours, more preferably from 3 to 40 hours, particularly preferably from 5 to 30 hours. Further, it is preferred to introduce a holding step particularly at from 1,300 to 1,500° C. for at least 3 hours within the above heat treatment time. By introducing a holding step within the above temperature, crystallization of h-BN will be carried out more efficiently, whereby the above heat treatment temperature tends to be decreased. If the heat treatment time is less than the above lower limit, crystallization tends to be insufficient, and if it exceeds the above upper limit, h-BN may partially be decomposed.

The heat treatment is preferably carried out in a non-oxidizing gas atmosphere, and for this purpose, it is usually preferred that a furnace is heated while it is evacuated of air with a vacuum pump until decompose gas and the like due to heating are reduced, and then while a non-oxidizing gas is introduced, the furnace is continuously heated to the desired temperature. The temperature at which the furnace is evacuated of air with a vacuum pump is at a level of from 200 to 500° C., for example, it is preferred that the furnace is heated to the vicinity of 400° C. in from about 30 to about 60 minutes, and the furnace is evacuated of air for from about 30 to about 60 minutes while the temperature is maintained, and the furnace is vacuumed to a degree of vacuum of at most 10 Pa, and then, a non-oxidizing gas is introduced. The flow rate of the non-oxidizing gas depends on the size of the furnace and is usually at least 2 L (liter)/min. Then, while the non-oxidizing gas is introduced, the furnace is heated to about 1,500° C. at a rate of from 50 to 100° C./hour and then heated from 1,500° C. to the predetermined heat treatment temperature at a rate of from 30 to 50° C. The granulated particles are preferably heated at the above temperature for the above heat treatment time and then cooled to room temperature at a rate of from about 5 to about 50° C./min.

For example, in the case of heat treatment in a nitrogen gas atmosphere, heat treatment is carried out at about 2,000° C. for about 5 hours, and in the case of an argon gas atmosphere, the heat treatment is carried out at about 2,000° C. for from about 5 to about 15 hours, whereby the primary particles of the BN crystal can have an average particle size of at most 1 μm and can be grown radially.

A firing furnace for the heat treatment may be a batch furnace such as a muffle furnace, a tube furnace or an atmosphere furnace, or a continuous furnace such as a rotary kiln, a screw conveyer furnace, a tunnel furnace, a belt furnace, a pressure furnace or a vertical continuous furnace, depending upon the purpose of use.

(Classification)

The agglomerated BN particles after the above heat treatment are preferably subjected to classification treatment in order to decrease the average particle size and to suppress an increase in the viscosity when the particles are blended in a composition. This classification is usually carried out after the heat treatment of the granulated particles, however, the granulated particles before the heat treatment may be subjected to classification and then subjected to the heat treatment.

The classification may be either wet classification or dry classification, however, with a view to suppressing decomposition of h-BN, dry classification is preferred. Particularly in a case where the binder is water-soluble, dry classification is preferably employed.

Dry classification may be classification by sieving and in addition, air classification utilizing a difference between the centrifugal force and the fluid drag, and from the viewpoint of classification accuracy, air classification is preferred, and a classifier such as a swirling airflow type classifier, a forced vortex centrifugal classifier or a hemi-free vortex centrifugal classifier may be used. The classifier may properly be selected depending upon the particle size of the particles to be classified, for example, a swirling airflow type classifier for classification of small fine particles in a submicron to a single micron region, and a hemi-free vortex centrifugal classifier for classification of relatively large particles larger than the above.

In the present invention, preferably, classification operation is carried out by using a swirling airflow type classifier in order to obtain agglomerated BN particles having a volume-based maximum particle size of at least 0.1 urn and at most 25 μm.

<Agglomerated BN Particles>

As described above, by granulating the material BN powder and carrying out heat treatment, it is possible to grow crystals of h-BN while the shape is maintained, and to arrange boron nitride primary particles having an average particle size of at most 1 μm on the surface while the specific surface area and the total pore volume are within specific ranges, and to prepare agglomerated BN particles of the present invention in which BN primary particles having an average particle size of at most 1 μm are radially arranged from the center toward the surface side of each agglomerated particle on the agglomerate particle surface, that is, the primary particles of the BN crystal are arranged in a normal direction so that the a-axes face outward.

Here, on the surface of the agglomerated BN particles of the present invention, boron nitride primary particles having an average particle size of at most 1 μm are present, and "at most 1 μm" of "the BN primary particles having an average particle size of at most 1 μm" means the length corresponding to the particle size of the BN primary particles. This size of the crystal of the BN primary particles can be obtained in such a manner that the primary particles are observed with a scanning electron microscope (SEM) at a magnification of about 20,000 times, maximum particle sizes of optional 100 particles observed on the surface are measured, and their average is obtained.

In the agglomerated BN particles of the present invention, how the crystal growth is an important factor in application to a highly thermally conductive filler.

In the case of the agglomerated BN particles of the present invention, by such specific crystal growth, such effects as the isotropy of the thermal conductivity, the kneading property with a resin, and excellent disintegration resistance are achieved.

The agglomerated BN particles of the present invention are most characterized by the surface being covered with fine BN primary crystals having an average particle size of at most 1 μm, and further have a specific surface area and a total pore volume within specific ranges. Further, fine BN primary crystals having an average particle size of at most 1 μm are radially arranged, that is, primary particles of the BN crystal are arranged in a normal direction so that the a-axes face outward.

As one means for preparing such agglomerated BN particles, it is important to use a h-BN powder having a total oxygen content of at least 1 wt % and at most 10 wt % as the material and to control the heat treatment conditions as described above.

That is, agglomerated BN particles prepared by using a h-BN powder having a total oxygen content less than 1 wt % as the material and the agglomerated BN particles of the present invention are totally different in the crystal structure on the agglomerated BN surface, and are totally different in the crystal growth direction of h-BN.

Specifically, in the agglomerated BN particles of the present invention, h-BN crystal grows radially from the center to each sphere, that is, primary particles of the BN crystal grow in a normal direction so that the a-axes face outward, whereas in a case where material h-BN having a total oxygen content less than 1 wt % is used, the crystal grows in a circumferential direction (so that the C-planes of h-BN face outward), and as a result, the specific surface area is small and the total pore volume is large.

Further, when the agglomerated BN of the present invention is blended in a composition as a filler (B), assuming that the packing amount is same, the coefficient of thermal conductivity in a direction of the thickness of the filling interlayer to be formed can drastically be improved. This is estimated to be because in h-BN of the present invention, effective thermally conductive paths are likely to form in the filling interlayer by the contact of highly thermally conductive planes (C-planes or 002 planes) of fine h-BN primary particles on the surface of spheres via the a-axes. Such crystal growth is attained by a relatively high total oxygen content of the material h-BN powder itself and by re-crystallization from a state with low crystallinity, and in a case where a h-BN material having a low total oxygen content and good crystallinity is used, radial h-BN crystal growth will not substantially occur.

Further, by using a material having a high total oxygen content and low crystallinity, formation into fine particles at the time of grinding will smoothly be carried out, and in addition, improvement in the sphericity by granulation will be achieved, and effective classification into a volume-based maximum particle size within a range of at least 0.1 μm and at most 25 μm will easily be carried out in the classification step after heat treatment.

Further, the agglomerated BN particles of the present invention are obtained by using a metal oxide as a binder and have a relatively small pore volume and a relatively high bulk density as granulated particles, whereby they are excellent in a miscibility with a resin and can be packed densely, and further, their disintegration at the time of kneading with a resin can be prevented.

As described above, when the agglomerated BN particles of the present invention in which the BN crystal is grown radially from the center side of each spherical particle, are used for a composition, by formation of thermally conductive paths derived from the direction of growth of the BN crystal, a remarkably high effect to improve the thermal conductivity can be obtained even though the particles are fine particles.

Further, in the filling interlayer formed by using the agglomerated BN particles of the present invention, anisotropy of the thermal conductivity which has been problematic can remarkably be improved.

(Crystal Structure of Agglomerated BN Particles, their Surface and Average Particle Size)

In the present invention, the crystal structure of the agglomerated BN particle can be confirmed by powder X-ray diffraction measurement, and the direction of crystal growth of the BN primary particles on the surface of the agglomerated BN particles can be confirmed by a scanning electron microscope (SEM).

Further, the average particle size of agglomerated BN can be measured e.g. by a laser diffraction/scattering type particle size distribution measuring apparatus with respect to a sample having the agglomerated BN particles dispersed in pure water medium containing sodium hexamethaphosphoric acid as a dispersion stabilizer.

(Volume-Based Maximum Particle Size)

The agglomerated BN particles of the present invention have a volume-based maximum particle size of preferably from 0.1 to 25 μm, particularly preferably from 2 to 10 μm, especially preferably from 4 to 10 μm. By the maximum particle size of the agglomerated BN particles being at most the above upper limit, when such particles are used as the filler (B) for a composition, a filling interlayer without surface roughening can be formed. Further, formation of a thin filling interlayer is possible, and such a composition is suitably used for application of a thin film, and the thermal conductivity in a direction of the thickness of the coating film can be increased. By the agglomerated BN having a maximum particle size smaller than the above lower limit, the effect to improve the thermal conductivity as a thermally conductive filler tends to be small.

Here, the volume-based average particle size $D_{50}$ of the agglomerated BN particles of the present invention is not particularly limited, and from the same reason as for the above volume-based maximum particle size, it is preferably from 1 to 20 μm, particularly preferably from 1 to 10 μm.

Particularly the agglomerated BN particles as a filler (B) preferably have an average particle size $D_{50}$ of from 0.1 to 5 μm and a maximum particle size of at most 10 μm, more preferably an average particle size $D_{50}$ of from 0.3 to 4.5 μm and a maximum particle size of at most 9.5 μm, further preferably an average particle size $D_{50}$ of from 0.5 to 4 μm and a maximum particle size of at most 9 μm.

Usually, in a three-dimensional integrated circuit, for further improvement in the performance such as speeding up and an increase in the capacity, the distance between the respective chips is so small as a level of from 10 to 50 μm. In the filling interlayer between the chips, the maximum particle size of the filler to be blended is preferably at most ½ to ⅓ of the thickness of the filling interlayer.

If the maximum particle size of the filler (B) exceeds 10 μm, the filler (B) may protrude on a surface of the filling interlayer after curing, whereby the surface state of the filling interlayer tends to be deteriorated.

On the other hand, if the particle size of the filler (B) is too small, the number of necessary thermal conductive paths tends to increase, whereby the probability of the thermal conductive paths being connected from top to bottom in the thickness direction between the chips tends to be low, and the coefficient of thermal conductivity in the thickness direction of the filling interlayer may be insufficient even if combined with a resin (A) having high thermal conductivity.

Further, if the particle size of the filler (B) is too small, the filler (B) is likely to agglomerate, thus deteriorating the dispersibility in the composition or in the coating liquid. Further, by the average particle size $D_{50}$ of the filler (B) within the above range, excessive agglomeration of the filler particles can be suppressed, and a filling interlayer having a sufficient coefficient of thermal conductivity in the thickness direction can be obtained.

The volume-based maximum particle size and the average particle size $D_{50}$ of the agglomerated BN particles of the present invention may specifically be measured by a method disclosed in the after-mentioned Examples.

(Total Pore Volume)

Of the agglomerated BN particles of the present invention, the total pore volume is an important factor in application to the thermally conductive filler (B) of a composition for a filling interlayer.

The total pore volume of the agglomerated BN particles of the present invention is usually at most 2.15 cm$^3$/g. If the total pore volume of the agglomerated BN particles is larger than 2.15 cm$^3$/g, when such particles are used as the filler (B) of a composition, the resin is included in the pores, thus increasing the apparent density, and formation of the composition or application of a coating liquid tends to be difficult.

The lower limit of the total pore volume of the agglomerated BN particles is not particularly limited and is usually 0.1 cm$^3$/g.

The total pore volume of the agglomerated BN may be measured by a mercury intrusion method, and specifically, it is measured by the method disclosed in the after-mentioned Examples.

(Bulk Density)

Of the agglomerated BN particles of the present invention, the bulk density is also an important factor in application to the filler (B) for a composition for a filling interlayer.

In a case where the agglomerated BN particles of the present invention are used as the filler (B), in order to minimize the amount of the resin included, the bulk density of the agglomerated BN is preferably higher, and is usually preferably at least 0.3 g/cm$^3$, more preferably at least 0.35 g/cm$^3$, further preferably at least 0.4 g/cm$^3$.

In a case where the bulk density of the agglomerated BN particles is less than 0.3 g/cm$^3$, the powder handling efficiency will remarkably be deteriorated. The upper limit of the bulk density of the agglomerated BN particles is not particularly limited but is usually at most 0.95 g/cm$^3$.

The bulk density of the agglomerated BN may be measured by a conventional apparatus or method for measuring the bulk density of a powder, and specifically, it is measured by the method disclosed in the after-mentioned Examples.

The above agglomerated BN particles may be used alone or in combination of two or more kinds of agglomerated BN particles differing in the physical properties.

For example, two or more kinds of agglomerated BN particles differing in the average particle size $D_{50}$ may be used. That is, by using agglomerated BN particles having a relatively small average particle size $D_{50}$ of from 0.1 to 2 μm for example, preferably from 0.2 to 1.5 μm and agglomerated BN particles having a relatively large average particle size $D_{50}$ of from 1 to 5 μm for example, preferably from 1 to 3 μm in combination, thermally conductive paths of the agglomerated BN particles having a large average particle size $D_{50}$ are connected by the agglomerated BN particles having a small average particle size $D_{50}$, whereby high filling becomes possible as compared with a case of using only one having a single volume average particle size $D_{50}$, and higher thermal conductivity can be obtained.

In such a case, it is preferred to use the agglomerated BN particles having a small average particle size $D_{50}$ and the agglomerated BN particles having a large average particle size $D_{50}$ in a weight ratio of from 10:1 to 1:10, in view of formation of thermally conductive paths.

Further, the agglomerated BN particles as the filler (B) may be properly subjected to surface treatment to increase the dispersibility in the resin (A) or in the coating liquid.

[Composition for Three-Dimensional Integrated Circuit]

The composition for a three-dimensional integrated circuit of the present invention comprises a resin (A) having a melt viscosity at 120° C. of at most 100 100 Pa·s and the BN particles of the present invention.

Now, the respective components will be described.

[Resin (A)]

A three-dimensional integrated circuit to which the composition of the present invention is preferably applicable, comprises a semiconductor substrate laminate having at least two semiconductor substrates each having a semiconductor device layer formed thereon laminated, and a layer containing the composition of the present invention between the semiconductor substrates. Usually, to electrically connect the semiconductor substrates, the layer having the composition of the present invention is formed between the semiconductor substrates and they are temporarily bonded and then main bonding is carried out. In order to melt the resin by heating to connect electrical connection terminals in the main bonding, the resin (A) is required to have a melt viscosity at 120° C. of at most 100 Pa·s, and the melt viscosity is preferably at most 20 Pa·s. That is, by the melt viscosity of the resin (A) at 120° C. being at most 100 Pa·s, the resin is melted and its viscosity is significantly reduced before solder bumps are fused, whereby temporary bonding of the solder bumps and land terminals by heat pressing is possible, and by pressure bonding a filler film formed on the semiconductor substrate at 200° C. or higher, the solder bumps are fused and their electrical connection to land terminals can be realized. The method for measuring the melt viscosity in the present invention is not particularly limited, and the melt viscosity (parallel plate dynamic viscosity) may be measured by a viscoelasticity measuring apparatus Physica MCR301 manufactured by Anton Paar Japan.

Specifically for example, the solvent is removed from the resin to be measured to obtain a solid, followed by press forming of the solid to obtain a plate sample having a thickness of about 1 mm. This sample is placed between a parallel plate dish and a parallel plate (25 mm in diameter) and the parallel plate dynamic viscosity is measured. As the measurement conditions, preferably, 20% of sine wave distortion is applied to the above sample, the angular frequency of the distortion is 10 rad/sec, and the viscosity in a step of raising the temperature at a rate of 3° C. per minute is measured at from 40° C. to 200° C.

On that occasion, it is preferred to add the after-mentioned curing agent (C), whereby the composition will not be cured at a temperature for the B-stage formation or bonding the solder bumps, the composition has fluidity in a short time after bonding the solder bumps and then gelated and then completely cured, whereby a stable filling interlayer can be formed.

Further, in order to carry out positioning of the substrate to be bonded after formation of a thin film of the composition on the semiconductor substrate and before temporally bonding, the resin (A) has a melt viscosity at 50° C. of preferably at least 2,000 Pa·s, more preferably at least 1,000 Pa·s. That is, by the melt viscosity at 50° C. of the resin (A) being at least 2,000 Pa·s, the tack property at room temperature after the B-stage formation can be reduced, and by positioning at the time of laminating the substrates, temporary bonding of the laminated substrates for a three-dimensional integrated circuit will easily be carried out.

Further, in order to obtain a filling interlayer having high thermal conductivity by using the resin (A) in combination with the filler (B), the coefficient of thermal conductivity of the resin (A) in the composition of the present invention is preferably at least 0.2 W/mK, particularly preferably at least 0.22 W/mK.

In the present invention, the coefficient of thermal conductivity of the resin (A) is a value obtained by the following method with respect to a cured film formed in accordance with a conventional curing method using, among components constituting the composition of the present invention, only the resin (A) and the organic solvent and further, in a case where the coating liquid contains a curing agent (C), the curing agent (C).

<Method for Measuring Coefficient of Thermal Conductivity of Resin>

With respect to the cured film of the resin, using the following apparatus, the heat diffusivity, the specific gravity and the specific heat were measured, and these measured values were multiplied to determine the coefficient of thermal conductivity.

(1) Thermal diffusivity: "ai-Phase Mobile 1u" manufactured by ai-Phase Co., Ltd.

(2) Specific gravity: "Balance XS-204" (using solid specific gravity measuring kit) manufactured by Mettler-Toredo International Inc.

(3) Specific heat: "DSC320/6200" manufactured by Seiko Instruments Inc.

In the present invention, the resin (A) as the matrix of the composition, either of a curable resin and a thermoplastic resin may be used without any restriction. The curable resin may be any crosslinkable resin such as a thermosetting resin, a photocurable resin or an electron beam-curable resin, and in view of the heat resistance, the water absorptivity, the dimensional stability, etc., it is preferably a thermosetting resin.

The thermosetting resin may, for example, be a polyimide type resin such as a polyimide resin, a polyaminobismaleimide (polybismaleimide) resin, a bismaleimide/triazine resin, a polyamideimide resin or a polyetherimide resin; a polybenzoxazole type resin; a polyether resin; a benzocyclobutene resin; a silicone-type resin; or an epoxy-type resin such as a phenol-type epoxy resin or an alcohol-type epoxy resin. Further, a corresponding precursor such as a monomer, a dimer or an oligomer to be the material of such a resin may also be used.

Among them, in view of high thermal conductivity and favorable solubility in an organic solvent, preferred is an epoxy resin, a polyether resin, a benzocyclobutene resin or a silicone resin, particularly preferred is an epoxy resin.

Such resins may be used alone or in an optional combination of two or more in an optional proportion.

Further, the resin to be used for the composition of the present invention may be a thermoplastic resin. The thermoplastic resin may, for example, be a polyolefin resin such as a polyethylene resin, a polypropylene resin, an ethylene/ vinyl acetate copolymer resin, a polyester resin such as a polyethyleneterephthalate resin, a polybutyleneterephthalate resin or a liquid crystal polyester resin, a polyvinyl chloride resin, a phenoxy resin, an acrylic resin, a polycarbonate resin, a polyphenylene sulfide resin, a polyphenylene ether resin, a polyamide resin, a polyamide imide resin, a polyimide resin, a polyetheramide imide resin, a polyetheramide resin or a polyetherimide resin. Further, a copolymer thereof such as a block copolymer or a graft copolymer may also be included. They may be used alone or as a mixture of at least two.

Further, the resin may be a rubber component, and the rubber component may, for example, be natural rubber, polyisoprene rubber, styrene/butadiene copolymer rubber, polybutadiene rubber, ethylene/propylene copolymer rubber, ethylene/propylene/diene copolymer rubber, butadiene/ acrylonitrile copolymer rubber, isobutylene/isoprene copolymer rubber, chloroprene rubber, silicon rubber, fluorine-containing rubber, chlorosulfonated polyethylene or polyurethane rubber. They may be used alone or as a mixture of at least two.

<Epoxy Resin>

Now, an epoxy resin suitable as the resin (A) (hereinafter sometimes referred to as "epoxy resin (a)") will be described.

As the epoxy resin (a), only an epoxy resin having one type of structural units may be used, however, so long as the above melt viscosity conditions are met, a plurality of epoxy resins differing in the structural units may be used in combination.

In order not only to achieve coating film properties or film forming properties and adhesion but also to reduce voids at the time of bonding to obtain a highly thermally conductive cured film and further, to obtain the fluidity of a film at the time of bonding, preferably at least the after-mentioned phenoxy resin is contained as the epoxy resin (a). A phenoxy resin is usually a resin obtained by reacting an epihalohydrin with a dihydric phenol compound or a resin obtained by reacting a bivalent epoxy compound with a dihydric phenol compound.

In the present invention, among them, preferred is an epoxy resin having at least two epoxy groups in its molecule (hereinafter sometimes referred to as "epoxy resin (a1)"), and the epoxy resin (a1) has, with a view to controlling the melt viscosity, an epoxy equivalent of preferably at least 100 g/equivalent and less than 650 g/equivalent, more preferably at least 125 g/equivalent and at most 600 g/equivalent. One having an epoxy equivalent less than 100 tends to be inferior in the heat resistance, and an epoxy resin having an epoxy equivalent higher than 650 tends to have a high melting point, thus decreasing the workability.

The epoxy resin (a1) may, for example, be a bisphenol A epoxy resin, a bisphenol F epoxy resin, a naphthalene epoxy resin, a phenol novolac epoxy resin, a cresol novolac epoxy resin, a phenol aralkyl epoxy resin, a biphenyl epoxy resin, a triphenylmethane epoxy resin, a dicyclopentadiene epoxy resin, a glycidyl ester epoxy resin, a glycidyl amine epoxy resin or a bifunctional phenol epoxy resin.

The epoxy resin (a1) has, with a view to controlling the melt viscosity, a weight average molecular weight of preferably from 100 to 5,000, more preferably from 200 to 2,000. An epoxy resin having a weight average molecular weight lower than 100 tends to be inferior in the heat resistance, and an epoxy resin having a weight average molecular weight higher than 5,000 tends to have a high melting point, thus decreasing the workability.

As described above, the epoxy resin (a) may contain a plurality of epoxy resins differing in the structural units. The epoxy resin other than the epoxy resin (a1) is preferably a phenoxy resin (hereinafter sometimes referred to as "epoxy resin (a2)") which is an epoxy resin having an epoxy equivalent of at least 650 g/equivalent and at most 30,000 g/equivalent.

The epoxy resin (a2) is preferably a phenoxy resin having at least one skeleton selected from the group consisting of a naphthalene skeleton, a fluorene skeleton, a biphenyl skeleton, an anthracene skeleton, a pyrene skeleton, a xanthene skeleton, an adamantane skeleton and a dicyclopentadiene skeleton. Among them, particularly preferred is a phenoxy resin having a fluorene skeleton and/or a biphenyl skeleton, whereby the heat resistance will further be increased.

In the present invention, among them, a phenoxy resin which is a high molecular weight epoxy resin having a weight average molecular weight of at least 10,000 is particularly preferred.

Here, the weight average molecular weight is a value as calculated as polystyrene measured by gel permeation chromatography (GPC).

The epoxy resin (a1) and the epoxy resin (a2) may respectively be used alone or in an optional combination of two or more in an optional proportion.

Further, the epoxy resin (a) may comprise an epoxy resin (hereinafter referred to as "other epoxy resin") other than the epoxy resin (a1) and the epoxy resin (a2) within a range not to impair the object. The content of other epoxy resin is usually at most 50 wt %, preferably at most 30 wt % to the total amount of the epoxy resin (a1) and the epoxy resin (a2).

In the present invention, the proportion of the epoxy resin (a1) in all the epoxy resins (a) including the epoxy resin (a1) and the epoxy resin (a2) is preferably from 5 to 95 wt %, more preferably from 10 to 90 wt %, further preferably from 20 to 80 wt % based on the total amount of 100 wt %. Further, "all the epoxy resins (a) including the epoxy resin (a1) and the epoxy resin (a2)" means, in a case where the epoxy resins (a) comprises only the epoxy resin (a1) and the epoxy resin (a2), the total of the epoxy resin (a1) and the epoxy resin (a2), and in a case where other epoxy resin is further contained, the total of the epoxy resin (a1), the epoxy resin (a2) and other epoxy resin.

By the proportion of the epoxy resin (a1) in the epoxy resins (a) being at least the above lower limit, the effect to improve the fluidity by incorporating the epoxy resin (a1) will sufficiently be obtained, and desired fluidity and high thermal conductivity can be obtained. By the proportion of the epoxy resin (a) in the epoxy resin (a2) being at most the upper limit and the proportion of the epoxy resin (a2) particularly being at least 10 wt %, the effect by incorporation of the epoxy resin (a2) will be obtained, and sufficient curing property and physical properties of a cured film will be obtained.

Further, the epoxy resin (a) used in the present invention preferably comprises an epoxy resin (a1) having an epoxy equivalent of at least 100 g/equivalent and less than 650 g/equivalent, and further preferably comprises an epoxy resin (a2) having an epoxy equivalent of at least 650 g/equivalent and at most 30,000 g/equivalent.

The epoxy resin (a1) is effective to impart fluidity to the composition, the polyfunctional phenol epoxy resin is a component preferred to impart curing property and crosslinkability, and the epoxy resin (a2) is preferred to improve the film physical properties.

Further, in order to lower the viscosity of the composition, to make high filling of the filler (B) possible and to increase the thermal conductivity, it is preferred to use an epoxy resin having a bisphenol A/bisphenol F structure, and in order to control the higher-order structure by self alignment of molecules thereby to achieve high thermal conductivity of the composition, an epoxy resin having a biphenyl structure having mesogen is preferred.

[Filler]

The composition for a three-dimensional integrated circuit of the present invention contains as the filler (B) at least one member selected from the boron nitride particles, the agglomerated boron nitride particles and the agglomerate boron nitride particles produced by the specific process, according to the present invention.

In recent years, for further improvement in the performance of three-dimensional integrated circuits such as speeding up and an increase in a capacity, the distance between chips is so small as a level of from 10 to 50 μm, and in the filling interlayer between the chips, the maximum particle size of the filler to be blended is preferably at a level of at most ⅓ of the thickness of the filling interlayer.

If the maximum particle size of the filler (B) exceeds 10 μm, the filler (B) may protrude on the surface of the filling interlayer after curing, whereby the surface state of the filing interlayer tends to be deteriorated.

On the other hand, if the particle size of the filler (B) is too small, the number of necessary thermally conductive paths tends to increase, whereby the probability of the thermally conductive paths being connected from top to bottom in the thickness direction between the chips tends to be low, and the coefficient of thermal conductivity in the thickness direction of the filling interlayer may be insufficient even if combined with the resin (A) having high thermal conductivity.

Further, if the particle size of the filler (B) is too small, the filler (B) is likely to agglomerate, thus deteriorating the dispersibility in the composition or in the coating liquid.

In the present invention, by the average particle size of the agglomerated BN particles to be used as the filler (B) being within the above range, excessive agglomeration of the filler particles can be suppressed, and a filling interlayer having a favorable coefficient of thermal conductivity can be obtained.

{Filler (B)}

The filler (B) used in the present invention may be agglomerated boron nitride particles which has a specific surface area of at least 10 m$^2$/g, the surface of which is constituted by boron nitride primary particles having an average particle size of at least 0.05 μm and at most 1 μm, agglomerated boron nitride particles produced by a specific material or a specific production process, or boron nitride particles which have a crystallite size (Lc) of the 002 plane of at least 450 [Å], a crystallite size (La) of the 100 plane of at least 500 [Å], the crystallite size (Lc) and the crystallite size (La) satisfying the following formula (i), and has an oxygen content of at most 0.30 wt %:

$$0.70 \leq Lc/La \qquad (i)$$

The composition of the present invention, which contains the filler (B) excellent in the anisotropy of the coefficient of thermal conductivity, can impart high thermal conductivity to a filling interlayer to be formed even in its thickness direction, and by promoting thermal conductivity between the semiconductor substrates thereby to lower the temperature of the semiconductor device substrate and to prevent accumulation of heat, the semiconductor device can stably be operated.

{Other filler (B')}

Further, the composition of the present invention may contain one or more filler other than the filler (B) (hereinafter referred to as "other filler (B')") within a range not to impair the effects of the present invention. For example, a thermally conductive filler other than the BN particles of the present invention may be used.

Such a thermally conductive filler may, for example, be an inorganic material having a coefficient of thermal conductivity of at least 2 W/mK, such as alumina ($Al_2O_3$, coefficient of thermal conductivity: 30 W/mK), aluminum nitride (AlN, coefficient of thermal conductivity: 260 W/mK), boron nitride other than the BN particles of the present invention (BN, coefficient of thermal conductivity: 3 W/mK (thickness direction), 275 W/mK (in-plane direction)) or silicon nitride ($Si_3N_4$, coefficient of thermal conductivity: 23 W/mK).

Further, the filler (B') preferably has stability against oxygen, water or high temperature exposure and low dielectric property, in addition to the high coefficient of thermal conductivity, in view of the reliability of a device bonded. Among the above inorganic materials, as the filler (B'), preferred is $Al_2O_3$ having high chemical stability or BN other than the BN particles of the present invention, and particularly preferred is boron nitride other than the BN particles of the present invention, having a lower dielectric constant.

Further, such other filler (B') may be added for the purpose of adjusting the viscosity, not improving the thermal conductivity. In such a case, silica ($SiO_2$, coefficient of thermal conductivity: 1.4 W/mK) which is a general purpose filler having a not so high coefficient of thermal conductivity, may be used.

However, the average particle size and the maximum particle size of other filler (B') should be within the same ranges as those of the filler (B).

{Content}

In the present invention, the content of the filler (B) is at least 40 parts by weight and at most 400 parts by weight, particularly preferably from 45 to 350 parts by weight, especially preferably from 50 to 300 parts by weight per 100 parts by weight of the resin (A). By such a content, the composition of the present invention has sufficient thermal conductivity and can maintain a viscosity to such an extent that a uniform coating film can be formed.

If the content of the filler (B) is less than the above lower limit, no sufficient thermal conductivity of a filling interlayer to be formed may be obtained in some cases, and if it exceeds the above upper limit, the viscosity of the composition or the coating liquid tends to be high, and no uniform coating film may be formed.

Further, in a case where the above other filler (B') is used in combination, the total content of the filler (B) and other filler (B') is preferably at most the above lower limit, and in order to sufficiently obtain the effect to improve the thermal conductivity by use of the filler (B), the amount of other filler (B') is preferably at most 50 wt %, particularly preferably at most 40 parts by weight, for example, from 5 to 40 wt %, to the total filler amount with the filler (B).

[Curing Agent (C)]

The composition of the present invention may contain a curing agent (C) as the case requires.

The curing agent (C) used in the present invention is a substance which contributes to the crosslink reaction between crosslinkable groups of the resin (A), such as epoxy groups of an epoxy resin.

For the epoxy resin, as the case requires, a curing agent and a curing accelerator for an epoxy resin are used.

The curing accelerator is properly selected depending upon the type of the resin or the curing agent to be used. For example, as the curing accelerator for an acid anhydride curing agent, for example, boron trifluoride monoethylamine, 2-ethyl-4-methylimidazole, 1-isobutyl-2-methylimidazole or 2-phenyl-4-methylimidazole may be mentioned. They may be used alone or as a mixture of at least two. Such a curing accelerator is usually used in an amount of from 0.1 to 5 parts by weight per 100 parts by weight of the epoxy resin.

The curing agent (C) is not particularly limited and is selected depending upon the type of the thermosetting resin to be used. In a case where the thermosetting resin in an epoxy resin, usually any one known as an epoxy resin curing agent may be used. It may, for example, be a phenol type curing agent, an amine type curing agent such as an aliphatic amine, a polyether amine, an alicyclic amine or an aromatic amine, an acid anhydride type curing agent, an amide type curing agent, a tertiary amine, imidazole or a derivative thereof, an organic phosphine, a phosphonium salt, a tetraphenylborate salt, an organic acid dihydrazide, a boron halide amine complex, a polymercaptan type curing agent, an isocyanate type curing agent or a blocked isocyanate type curing agent.

The phenol type curing agent may, for example, be specifically bisphenol A, bisphenol F, 4,4'-dihydroxy diphenyl methane, 4,4'-dihydroxy diphenyl ether, 1,4-bis(4-hydroxyphenoxy)benzene, 1,3-bis(4-hydroxyphenoxy)benzene, 4,4'-dihydroxy diphenyl sulfide, 4,4'-dihydroxy diphenyl ketone, 4,4'-dihydroxy diphenyl sulfone, 4,4'-dihydroxybiphenyl, 2,2'-dihydroxybiphenyl, 10-(2,5-dihydroxyphenyl)-10H-9-oxa-10-phosphaphenanthrene-10-oxide, phenol novolak, bisphenol A novolak, o-cresol novolak, m-cresol novolak, p-cresol novolak, xylenol novolak, poly-p-hydroxystyrene, hydroquinone, resorcin, catechol, t-butylcatechol, t-butylhydroquinone, phloroglucinol, pyrogallol, t-butylpyrogallol, allylated pyrogallol, polyallylated pyrogallol, 1,2,4-benzenetriol, 2,3,4-trihydroxybenzophenone, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,4-dihydroxynaphthalene, 2,5-dihydroxynaphthalene, 2,6-dihydroxynaphthalene, 2,7-dihydroxynaphthalene, 2,8-dihydroxynaphthalene, an allylated product or polyallylated product of the above dihydroxynaphthalene, allylated bisphenol A, allylated bisphenol F, allylated phenol novolak or allylated pyrogallol.

As specific examples of the amine type curing agent, the aliphatic amine may, for example, be ethylenediamine, 1,3-diaminopropane, 1,4-diaminopropane, hexamethylenediamine, 2,5-dimethylhexamethylenediamine, trimethylhexamethylenediamine, diethylenetriamine, iminobispropylamine, bis(hexamethylene)triamine, triethylenetetramine, tetraethylenepentamine, pentaethylenehexamine, N-hydroxyethylethylenediamine or tetra(hydroxyethyl)ethylenediamine. The polyether amine may, for example, be triethylene glycol diamine, tetraethylene glycol diamine, diethylene glycol bis(propylamine), polyoxypropylene diamine or polyoxypropyrene triamine. The alicyclic amine may, for example, be isophorone diamine, menthenediamine, N-aminoethylpiperazine, bis(4-amino-3-methyldicyclohexyl)methane, bis(aminomethyl)cyclohexane, 3,9-bis(3-aminopropyl)-2,4,8,10-tetraoxaspiro(5,5)undecane or norbornenediamine. The aromatic amine may, for example, be tetrachloro-p-xylene diamine, m-xylene diamine, p-xylene diamine, m-phenylenediamine, o-phenylenediamine, p-phenylenediamine, 2,4-diaminoanisole, 2,4-toluenediamine, 2,4-diaminodiphenylmethane, 4,4'-diaminodiphenylmethane, 4,4'-diamino-1,2-diphenylethane, 2,4-diaminodiphenylsulfone, 4,4'-diaminodiphenylsulfone, m-aminophenol, m-aminobenzylamine, benzyldimethylamine, 2-dimethylaminomethyl)phenol, triethanolamine, methylbenzylamine, α-(m-aminophenyl)ethylamine, α-(p-aminophenyl)ethylamine, diaminodiethyldimethyldiphenylmethane or α,α'-bis(4-aminophenyl)-p-diisopropylbenzene.

The acid anhydride type curing agent may, for example, be specifically dodecenyl succinic anhydride, polyadipic anhydride, polyazelaic anhydride, polysebacic anhydride, poly(ethyloctadecanedioic) anhydride, poly(phenylhexadecanedioic) anhydride, methyltetrahydrophthalic anhydride, methylhexahydrophthalic anhydride, hexahydrophthalic anhydride, methyihimic anhydride, tetrahydrophthalic anhydride, trialkyltetrahydrophthalic anhydride, methylcyclohexane dicarboxylic anhydride, methylcyclohexenetetracarboxylic anhydride, phthalic anhydride, trimellitic anhydride, pyromellitic anhydride, benzophenonetetracarboxylic anhydride, ethylene glycol bistrimellitate dianhydride, HET anhydride, Nadic anhydride, methyl Nadic anhydride, 5-(2,5-dioxotetrahydro-3-furanyl)-3-methyl-3-cyclohexane-1,2-dicarboxylic anhydride, 3,4-dicarboxy-1,2,3,4-tetrahydro-1-naphthalene succinic dianhydride, or 1-methyl-dicarboxy-1,2,3,4-tetrahydro-1-naphthalene succinic dianhydride.

The amide type curing agent may, for example, be dicyandiamide or a polyamide resin.

The tertiary amine may, for example, be 1,8-diazabicyclo(5,4,0)undecene-7, triethylenediamine, benzyldimethylamine, triethanolamine, dimethylaminoethanol or tris(dimethylaminomethyl)phenol.

The imidazole or its derivative may, for example, be 1-cyanoethyl-2-phenylimidazole, 2-phenylimidazole, 2-ethyl-4(5)-methylimidazole, 2-phenyl-4-methylimidazole, 1-benzyl-2-methylimidazole, 1-benzyl-2-phenylimidazole, 1-cyanoethyl-2-undecylimidazole, 1-cyano-2-phenylimidazole, 1-cyanoethyl-2-undecylimidazole trimellitate, 1-cyanoethyl-2-phenylimidazolium trimellitate, 2,4-diamino-6-[2'-methylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazine isocyanuric acid adduct, 2-phenylimidazole isocyanuric acid adduct, 2-phenyl-4,5-dihydroxymethylimidazole, 2-phenyl-4-methyl-5-hydroxymethylimidazole or an adduct of an epoxy resin with the above imidazole.

The organic phosphine may, for example, be tributylphosphine, methyldiphenylphosphine, triphenylphosphine, diphenylphosphine or phenylphosphine, the phosphonium salt may, for example, be tetraphenylphosphonium tetraphenylborate, tetraphenylphosphonium ethyltriphenylborate or tetrabutyiphosphonium tetrabutylborate, and the tetraphenylborate salt may, for example, be 2-ethyl-4-methylimidazole tetraphenylborate or N-methylmorpholine tetraphenylborate.

Such curing agents (C) may be used alone or as a mixture of at least two in optional combination and proportion.

Among the above curing agents, the imidazole or its derivative or a dicyanediamine compound is suitably used.

In a case where as the after-mentioned flux (D), an organic carboxylate from which an organic carboxylic acid as the decomposition product has a function to cure the epoxy resin is used, such an organic carboxylate may be used as the curing agent (C).

The content of the curing agent (C) in the composition of the present invention is preferably from 0.1 to 60 parts by weight, more preferably from 0.5 to 40 parts by weight per 100 parts by weight of the resin (A).

Particularly in a case where the curing agent (C) is a phenol type curing agent, an amine type curing agent or an acid anhydride type curing agent, it is preferably used so that the equivalent ratio of the functional groups in the curing agent and the epoxy groups in the epoxy resin is within a range of from 0.8 to 1.5. If it is out of this range, unreacted epoxy groups or functional groups in the curing agent may remain, whereby no desired physical properties may be obtained.

Further, in a case where the curing agent is an amide type curing agent, a tertiary amine, an imidazole or its derivative, an organic phosphine, a phosphonium salt, a tetraphenylborate salt, an organic acid dihydrazide, a boron halide amine complex, a polymercaptane type curing agent, an isocyanate type curing agent, a blocked isocyanate type curing agent or the like, it is preferably used in an amount of from 0.1 to 20 parts by weight, more preferably from 0.5 to 10 parts by weight per 100 parts by weigh of the epoxy resin.

Further, in the case of a dicyanediamine compound, it is used in an amount of preferably from 0.1 to 10 parts by weight, more preferably from 0.5 to 6 parts by weight per 100 parts by weight of the epoxy resin (A1).

[Flux (D)]

The composition of the present invention may contain a flux (D).

The flux (D) is, specifically, a compound which has flux functions to dissolve and remove the surface oxide film on metal electric signal terminals such as solder bumps and lands, to improve the wettability on the land surface of the solder bumps and further, to prevent reoxidation on the metal terminal surface of the solder bumps, at the time of soldering of the metal terminals.

More specifically, it is a compound which gives favorable results in evaluation of the solder ball melting properties in Reference Example 2-1.

The flux (D) is preferably one which has high solubility in the monomer, oligomer or polymer as the resin (A) component in e.g. the epoxy resin (A1) and in an organic solvent, and which is capable of forming a uniform composition by mixing. Further, if the flux (D) has a function as a curing agent to the resin (A) component of e.g. the epoxy resin (A1), it may cause curing of the resin at a temperature before the B-stage formation or bonding of the solder bumps, and inhibit bonding of e.g. the solder bumps and the lands, and accordingly the flux is preferably one not having such a function as a curing agent.

The flux (D) used in the present invention may, for example, be a monocarboxylic acid such as lactic acid, acetic acid, propionic acid, butyric acid, oleic acid, stearic acid, benzoic acid, abietic acid or rosin; a dicaroboxylic acid such as oxalic acid, malonic acid, succinic acid, glutaric acid, adipic acid, malic acid, tartaric acid, isophthalic acid pyromellitic acid, maleic acid, fumaric acid or itaconic acid; tricarboxylic acid such as citric acid, 1,2,4-trimellitic acid or tris(2-carboxyethyl)isocyanurate; a tetracarboxylic acid such as pyromellitic acid or butanetetracarboxylic acid; an organic carboxylate which is a hemiacetal ester having an organic carboxylic acid converted by reaction with an alkyl vinyl ether; an organic halogen compound such as glutamic acid hydrochloride, aniline hydrochloride, hydrazine hydrochloride, cetyl pyridine bromide, phenylhydrazine hydrochloride, tetrachloronaphthalene, methylhydrazine hydrochloride, methylamine hydrochloride, ethylamine hydrochloride, diethylamine hydrochloride or butylamine hydrochloride; an amine such as urea or diethylene triamine hydrazine, a polyhydric alcohol such as ethylene glycol, diethylene glycol, triethylene glycol, tetraethylene glycol, hexaethylene glycol, glycerin, trimethylolethane, trimethylolpropane, 2,3,4-trihydroxybenzophenone, triethanolamine, erythritol, pentaerythritol, bis(2-hydroxymethyl)iminotris-(hydroxymethyl)methane or ribitol; an inorganic acid such as hydrochloric acid, hydrofluoric acid, phosphoric acid or fluoroboric acid; a fluoride such as potassium fluoride, sodium fluoride, ammonium fluoride, copper fluoride, nickel fluoride or zinc fluoride, a chloride such as potassium chloride, sodium chloride, cuprous chloride, nickel chloride, ammonium chloride, zinc chloride or stannous chloride; or a bromide such as potassium bromide, sodium bromide, ammonium bromide, tin bromide or zinc bromide. These compounds may be used as they are or may be used in the form of microcapsules using a covering agent of e.g. an organic polymer or an inorganic compound. These compounds may be used alone or as a mixture of at least two in an optional combination and proportion.

Among them, in view of the solubility in the resin (A) such as the epoxy resin (A1) or various organic solvents, preferred is a polyhydric alcohol, an organic carboxylic acid or an organic carboxylic acid derivative such as a carboxylate. Further, in view of low foaming property at the time of heating of the resin (A) such as the epoxy resin (A1), particularly preferred is an organic carboxylic acid. Among them, as the reactivity as the flux, particularly preferred is an organic carboxylic acid having at least two carboxy groups.

The organic carboxylate may be obtained by reacting an organic carboxylic acid and an alkyl vinyl ether at room temperature under normal pressure or as the case requires, by heating in accordance with the following reaction formula (1). Since the reaction of the formula (1) is a static reaction, in order to increase the proportion of an organic carboxylic acid to be converted to an organic carboxylate, it is preferred to add the alkyl vinyl ether in an equivalent amount or more relative to the carboxy groups in the organic carboxylic acid to carry out the reaction:

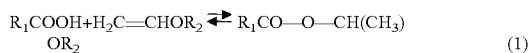
$$R_1COOH + H_2C=CHOR_2 \rightleftharpoons R_1CO-O-CH(CH_3)OR_2 \quad (1)$$

In the above formula (1), $R_1$ is a remaining molecular chain having one carboxy group in a carboxylic acid removed, and $R_2$ is a $C_{1-6}$ alkyl group.

The organic carboxylate is decomposed by heating to form an organic carboxylic acid and a vinyl ether in the composition or in the coating liquid. The organic carboxylic acid formed by the decomposition has surface activating function (flux function) for solder balls.

Further, some of organic carboxylic acids formed by the decomposition may have a function to cure the resin (A) such as the epoxy resin. This is because hydrogen ions released from carboxy groups by their dissociation may have a function to cure the epoxy resin. To suppress generation of hydrogen ions by dissociation of the carboxy groups, an organic carboxylate having an organic carboxylic acid protected by an alkyl vinyl ether is preferably used.

On the other hand, even when an organic carboxylate is used, if its decomposition temperature is too low, the resin (A) such as the epoxy resin may be cured at the time of temporary boding by pressure heating during the production. Accordingly, the decomposition temperature of the organic carboxylate as the flux (D) is preferably at least 130° C. in order to avoid or suppress decomposition at the time of temporary boding, and is more preferably at least 140° C., further preferably at least 160° C., most preferably at least 180° C. Further, the upper limit of the decomposition temperature is 220° C.

As the organic carboxylic acid as the material of the organic carboxylate, a monocarboxylic acid such as lactic acid, acetic acid, propionic acid, butyric acid, oleic acid, stearic acid, benzoic acid, abietic acid or rosin; a dicarboxylic acid such as oxalic acid, malonic acid, succinic acid, glutaric acid, adipic acid, malic acid, tartaric acid, isophthalic acid, pyromellitic acid, maleic acid, fumaric acid or itaconic acid; a tricarboxylic acid such as citric acid, 1,2,4-trimellitic acid or tris(2-carboxyethyl)isocyanurate; or a tetracarboxylic acid such as pyromellitic acid or butane tetracarboxylic acid may, for example, be used. Among them, in view of the reactivity as the flux, preferred is an organic carboxylic acid having at least two carboxy groups.

Further, as the alkyl vinyl ether as the material of the organic carboxylate, $R_2$ in the formula (1) is preferably a $C_{1-6}$ alkyl group, particularly preferably a methyl group, an ethyl group, a propyl group or a butyl group. Among these alkyl groups, preferred is a secondary or primary alkyl group, since the lower the electron-donating properties of an alkyl group, the higher the high temperature dissociation properties.

Among such organic carboxylates, as commercially available products, Santacid G (dialkyl vinyl ether block bifunctional polymer type carboxylic acid), Santacid H (monoalkyl vinyl ether block bifunctional low molecular weight type carboxylic acid), Santacid I (monoalkyl vinyl ether block bifunctional carboxylic acid), each manufactured by NOF Corporation), and the like may be preferably used.

In the composition of the present invention, the content of the flux (D) is usually at least 0.1 part by weight and at most 10 parts by weight, preferably at least 0.5 part by weight and at most 8 parts by weight per 100 parts by weight of the resin (A). If the content of the flux (D) is less than the above lower limit, solder connection failure may occur due to a decrease in the oxide film removability, and if it exceeds the above upper limit, connection failure may occur due to an increase in the viscosity of the coating liquid.

[Other Additives]

The composition of the present invention may contain various additives (other additives) for the purpose of further improving its functions, within a range not to impair the effects of the present invention.

Such other additives may, for example, be a functional resin having functionality imparted to the above resin, such as a liquid crystalline epoxy resin, nitride particles such as aluminum nitride, silicon nitride or fibrous boron nitride, an insulating metal oxide such as alumina, fibrous alumina, zinc oxide, magnesium oxide, beryllium oxide or titanium oxide, an insulating carbon component such as diamond or fullerene, a resin curing agent, a resin curing accelerator, a viscosity-adjusting agent or a dispersion stabilizer.

Further, such other additives may, for example, be a coupling agent such as a silane coupling agent or a titanate coupling agent, as an additive component to improve the bonding property to a substrate or the bonding property between the matrix resin and the inorganic filler, an ultraviolet inhibitor to improve the storage stability, an antioxidant, a plasticizer, a flame retardant, a coloring agent, a dispersing agent, a fluidity-improving agent or an agent to improve the adhesion to a substrate.

Further, to the composition of the present invention, with a view to improving the fluidity at the time of forming and improving the adhesion to the substrate, a thermoplastic oligomer may be added.

In addition, a surfactant, an emulsifier, a viscosity-lowering agent, a diluent, a defoaming agent, an ion trapping agent or the like, which improves diffusion property of the respective components in the composition or in the coating liquid, may be added.

Each of these additives may be used alone or as a mixture of at least two in optional combination and proportion.

Further, to the composition of the present invention, within a range not to impair the effects, an organic filler such as aluminum hydroxide or magnesium hydroxide, a surface treating agent such as a silane coupling agent which improves the surface adhesive strength between the inorganic filler and the matrix resin, a reducing agent or the like may be added.

In the case of the inorganic filler, the total content with the agglomerated BN particles of the present invention in the composition is preferably at most 90 wt %, in order to maintain the molding processability of a composite material composition.

The amount of the other additives is not particularly limited, and they are used in amounts for a conventional resin composition to such an extent that necessary functions are obtained.

Among the above additives, with a view to improving the adhesion between the resin component and the filler (B), a coupling agent is preferably contained.

The silane coupling agent may, for example, be an epoxysilane such as γ-glycidoxypropyltrimethoxysilane, γ-glycidoxypropyltriethoxysilane or β-(3,4-epoxycyclohexyl)ethyltrimethoxysilane; an aminosilane such as γ-aminopropyltriethoxysilane, N-β(aminoethyl)γ-aminopropyltrimethoxysilane, N-β(aminoethyl)γ-aminopropylmethyldimethoxysilane, γ-aminopropyltrimethoxysilane or γ-ureido propyltriethoxysilane; a mercaptosilane such as 3-mercaptopropyltrimethoxysilane; a vinylsilane such as p-styryltrimethoxysilane, vinyltrichlorosilane, vinyltris(β-methoxyethoxy)silane, vinyltrimethoxysilane, vinyltriethoxysilane or γ-methacryloxypropyltrimethoxysilane, or a polymer type silane such as an epoxy type, an amino type or a vinyl type.

The titanate coupling agent may, for example, be isopropyltriisostearoyl titanate, isopropyltri(N-aminoethyl-aminoethyl)titanate, diisopropylbis(dioctyl phosphate)titanate, tetraisopropylbis(dioctyl phosphite)titanate, tetraoctylbis(ditridecyl phosphite)titanate, tetra(2,2-diallyloxymethyl-1-butyl)bis(ditridecyl)phosphite titanate, bis(dioctyl pyrophosphate)oxyacetate titanate or bis(dioctyl pyrophosphate)ethylene titanate.

Such coupling agents may be used alone or as a mixture of at least two in optional combination and proportion.

The addition amount of the coupling agent is preferably from about 0.1 to about 2.0 wt %, more preferably from 0.5 to 1.5 wt % to the composition. If the amount of the coupling agent is small, no sufficient effect of improving the adhesion between the matrix resin and the inorganic filler by blending the coupling agent may be obtained, and if it is too large, the coupling agent may bleed out from the obtainable cured film.

The thermoplastic oligomer may, for example, be a C5 or C9 petroleum resin, a styrene resin, an indene resin, an indene/styrene copolymer resin, an indene/styrene/phenol copolymer resin, an indene/coumarone copolymer resin, an indene/benzothiophene copolymer resin. The addition amount is usually within a range of from 2 to 30 parts by weight, preferably from 5 to 15 parts by weight per 100 parts by weight of the resin (A).

As the surfactant, any one of known anionic surfactant, nonionic surfactant and cationic surfactant may be used.

For example, a polyoxyethylene alkyl ether, a polyoxyethylene alkyl aryl ether, a polyoxyethylene alkyl ester, a sorbitan alkyl ester, a monoglyceride alkyl ester, an alkylbenzene sulfonate, an alkylnaphthalene sulfonate, an alkyl sulfate, an alkyl sulfonate, a sulfosuccinate, an alkylbetain or an amino acid may, for example, be mentioned.

Further, a fluorinated surfactant having some or all of CH bonds in such a surfactant converted to CF bonds may also be preferably used.

Such surfactants may be used alone or as a mixture of at least two in optional combination and proportion.

The amount of addition of the surfactant is preferably about 0.001 to 5 wt %, more preferably from 0.005 to 3 wt % to the composition. If the amount of addition of the surfactant is less than the above lower limit, no desired film thickness uniformity may be obtained in some cases, and if it exceeds the above upper limit, phase separation with the thermosetting resin component may occur in some cases, such being unfavorable.

Further, the composition of the present invention preferably contains, as a dispersing agent, a dispersing agent (F) having an amine value (mg-KOH/g) of at least 10 and at most 300, to increase the dispersion property of the filler (B) in the composition or in the coating liquid to uniformly disperse the filler (B) thereby to improve the coating property of the coating liquid and the film properties and surface smoothness of a coating film to be formed.

The dispersing agent (F) having an amine value (mg-KOH/g) of at least 10 and at most 300 is not particularly limited so long as the objects of the present invention are achieved, and is preferably one having a tertiary amino group as a functional group, in view of excellent effect to improve the coating property of the coating liquid and effect to improve the coating film properties.

If the amine value of the dispersing agent (F) is lower than 10 mg-KOH/g, the dispersion property of the filler (B) tends to be insufficient, and if it is higher than 300 mg-KOH/g, e.g. agglomeration of the filler may occur, and in either case, the objects of the present invention cannot be achieved.

The amine value of the dispersing agent (F) is preferably from 20 to 200 mg-KOH/g, particularly preferably from 30 to 100 mg-KOH/g.

Here, "amine value" is a value represented by mg of KOH corresponding to the acid value obtained by acid-base titration of basic groups with an acid.

Examples of such a dispersing agent include an acrylic type dispersing agent and a urethane type dispersing agent.

The urethane type dispersing agent may, for example, be preferably a dispersed resin obtained by reacting a polyisocyanate compound, a compound having one or two hydroxy groups in one molecule and having a number average molecular weight of from 300 to 10,000, and a compound having active hydrogen and a tertiary amino group in one molecule.

The above polyisocyanate compound may, for example, be an aromatic diisocyanate such as p-phenylene diisocyanate, 2,4-tolylene diisocyanate, 2,6-tolylene diisocyanate, 4,4'-diphenylmethane diisocyanate, naphthalene-1,5-diisocyanate or tolidine diisocyanate; an aliphatic diisocyanate such as hexamethylene diisocyanate, lysine methylester diisocyanate, 2,4,4-trimethylhexamethylene diisocyanate or dimer acid diisocyanate; an alicyclic diisocyanate such as isophorone diisocyanate, 4,4'-methylenebis(cyclohexyl isocyanate) or ω,ω'-diisocyanate dimethylcyclohexane; an aliphatic diisocyanate having an aromatic ring such as xylylene diisocyanate or α,α,α',α'-tetramethylxylylene diisocyanate; a triisocyanate such as lysine ester triisocyanate, 1,6,11-undecane triisocyanate, 1,8-diisocyanate-4-isocyanatemethyloctane, 1,3,6-hexamethylene triisocyanate, bicycloheptane triisocyanate, tris(isocyanatephenylmethane) or tris (isocyanatephenyl)thiophosphate; or a trimer or water adduct thereof, or a polyol adduct thereof. The polyisocyanate is preferably a trimer of an organic diisocyanate, most preferably a trimer of tolylene diisocyanate or a trimer of isophorone diisocyanate. They may be used alone or as a mixture of at least two.

To produce a trimer of an isocyanate, a method may be mentioned wherein the above polyisocyanate is subjected to partial trimerization of isocyanate groups with a proper trimerization catalyst such as a tertiary amine, a phosphine, an alkoxide, a metal oxide or a carboxylic acid salt, trimerization is terminated by addition of a catalyst poison, unreacted polyisocyanate is extracted with a solvent and removed by thin film distillation to obtain the desired isocyanurate group-containing polyisocyanate.

The compound having one or two hydroxy groups in one molecule and having a number average molecular weight of from 300 to 10,000 may be a glycol such as polyether glycol, polyester glycol, polycarbonate glycol or polyolefin glycol, a compound having one terminal hydroxy group of such a compound alkoxylated with a $C_{1-25}$ alkyl group, or a mixture of at least two of such compounds.

The polyether glycol may be polyether diol, polyether ester diol or a mixture of at least two of such compounds.

The polyether diol may be one obtained by homopolymerization or copolymerization of an alkylene oxide, such as polyethylene glycol, polypropylene glycol, polyethylene/propylene glycol, polyoxytetramethylene glycol, polyoxyhexamethylene glycol, polyoxyoctamethylene glycol or a mixture of at least two of such compounds.

The polyether ester diol may be one obtained by reacting an ether group-containing diol or its mixture with other glycol with a dicarboxylic acid or an anhydride thereof, or one obtained by reacting a polyester glycol with an alkylene oxide, for example, poly(polyoxytetramethylene)adipate.

Most preferred as the polyether glycol is polyethylene glycol, polypropylene glycol, polyoxytetramethylene glycol or a compound having one terminal hydroxy group of such a compound alkoxylated with a $C_{1-25}$ alkyl group.

The polyester glycol may be one obtained by polycondensation of a dicarboxylic acid (such as succinic acid, glutaric acid, adipic acid, sebacic acid, fumaric acid, maleic acid or phthalic acid) or an anhydride thereof and a glycol (such as an aliphatic glycol such as ethylene glycol, diethylene glycol, triethylene glycol, propylene glycol, dipropylene glycol, tripropylene glycol, 1,2-butanediol, 1,3-butanediol, 1,4-butanediol, 2,3-butanediol, 3-methyl-1,5-pentanediol, neopentyl glycol, 2-methyl-1,3-propanediol, 2-methyl-2-propyl-1,3-propanediol, 2-butyl-2-ethyl-1,3-propanediol, 1,5-pentanediol, 1,6-hexanediol, 2-methyl-2,4-pentanediol, 2,2,4-trimethyl-1,3-pentanediol, 2-ethyl-1,3-hexanediol, 2,5-dimethyl-2,5-hexanediol, 1,8-octamethylene glycol, 2-methyl-1,8-octamethylene glycol or 1,9-nonanediol; an alicyclic glycol such as bishydroxymethylcyclohexane; an aromatic glycol such as xylylene glycol or bishydroxyethoxybenzene; or an N-alkyldialkanolamine such as N-methyldiethanolamine). For example, it may be an adipate such as polyethylene adipate, polybutylene adipate, polyhexamethylene adipate or polyethylene/propylene adipate; a polylactone diol or polylactone monool obtained by using the above diol or a $C_{1-25}$ monohydric alcohol as an initiator, such as polycaprolactone glycol or polymethylvalerolactone; or a mixture of at least two of such compounds. Most preferred as the polyester glycol is polycaprolactone glycol or a polycaprolactone obtained by using a $C_{1-25}$ alcohol as the initiator. More specifically, it is a compound obtained by ring-opening addition polymerization of ε-caprolactone to a monool.

The polycarbonate glycol may, for example, be poly(1,6-hexylene)carbonate or poly(3-methyl-1,5-pentylene)carbonate.

The polyolefin glycol may, for example, be polybutadiene glycol, hydrogenated polybutadiene glycol or hydrogenated polyisoprene glycol.

The number average molecular weight of the compound having one or two hydroxy groups in one molecule is from 300 to 10,000, preferably from 500 to 6,000, more preferably from 1,000 to 4,000.

In the compound having active hydrogen and a tertiary amino group in one molecule to be used in the present invention, the active hydrogen i.e. the hydrogen atom directly bonded to an oxygen atom, a nitrogen atom or a sulfur atom may be a hydrogen atom in a functional group such as a hydroxy group, an amino group or a thiol group, and is preferably a hydrogen atom in an amino group particularly a primary amino group. The tertiary amino group is not particularly limited. The tertiary amino group may be an amino group having a $C_{1-4}$ alkyl group, or a heterocyclic structure, more specifically, an imidazole ring or a triazole ring.

Such a compound having active hydrogen and a tertiary amino group in one molecule may, for example, be N,N-dimethyl-1,3-propanediamine, N,N-diethyl-1,3-propanediamine, N,N-dipropyl-1,3-propanediamine, N,N-dibutyl-1,3-propanediamine, N,N-dimethylethylenediamine, N,N-diethylethylenediamine, N,N-dipropylethylenediamine, N,N-dibutylethylenediamine, N,N-dimethyl-1,4-butanediamine, N,N-diethyl-1,4-butanediamine, N,N-dipropyl-1,4-butanediamine or N,N-dibutyl-1,4-butanediamine.

Further, the compound wherein the tertiary amino group is a nitrogen-containing hetero ring may be a N-containing hetero 5-membered ring such as a pyrazole ring, an imidazole ring, a triazole ring, a tetrazole ring, an indole ring, a carbazole ring, indazole ring, a benzimidazole ring, a benzotriazole ring, a benzoxazole ring, a benzothiazole ring or a benzothiadiazole ring, or a nitrogen-containing hetero 6-membered ring such as a pyridine ring, a pyridadine ring, a pyrimidine ring, a triazine ring, a quinoline ring, an acridine ring, or an isoquinoline ring. Preferred as such a nitrogen-containing hetero ring is an imidazole ring or a triazole ring.

The compound having an imidazole ring and a primary amino group may, for example, be specifically 1-(3-aminopropyl)imidazole, histidine, 2-aminoimidazole or 1-(2-aminoethyl)imidazole. Further, the compound having a triazole ring and an amino group may, for example, be specifically 3-amino-1,2,4-triazole, 5-(2-amino-5-chlorophenyl)-3-phenyl-1H-1,2,4-triazole, 4-amino-4H-1,2,4-triazole-3,5-diol, 3-amino-5-phenyl-1H-1,3,4-triazole, 5-amino-1,4-diphenyl-1,2,3-triazole or 3-amino-1-benzyl-1H-2,4-triazole. Among them, preferred is N,N-dimethyl-1,3-propanediamine, N,N-diethyl-1,3-propanediamine, 1-(3-aminopropyl)imidazole or 3-amino-1,2,4-triazole.

With respect to the preferred blend ratio of the materials for the urethane type dispersing agent, per 100 parts by weight of the polyisocyanate compound, the amount of the compound having one or two hydroxy groups in one molecule and having a number average molecular weight of from 300 to 10,000 is from 10 to 200 parts by weight, preferably from 20 to 190 parts by weight, further preferably from 30 to 180 parts by weight, and the amount of the compound having active hydrogen and a tertiary amino group in one molecule is from 0.2 to 25 parts by weight, preferably from 0.3 to 24 parts by weight.

The weight average molecular weight (Mw) of such a urethane type dispersing agent as calculated as polystyrene measured by GPC (gel permeation chromatography) is usually from 1,000 to 200,000, preferably from 2,000 to 100,000, more preferably from 3,000 to 50,000. If the molecular weight is less than 1,000, the dispersion property and the dispersion stability tend to be poor, and if it exceeds 200,000, the solubility tends to be decreased, the dispersion property tends to be poor and at the same time, control of the reaction tends to be difficult.

Production of such a urethane type dispersing agent is carried out in accordance with a known method in production of a polyurethane resin. As the solvent for production, usually, one or more of a ketone such as acetone, methyl ethyl ketone, methyl isobutyl ketone, cyclopentanone, cyclohexanone or isophorone; an ester such as ethyl acetate, butyl acetate or cellosolve acetate; a hydrocarbon such as benzene, toluene, xylene or hexane; some alcohols such as diacetone alcohol, isopropanol, secondary butanol and tertiary butanol; a chloride such as methylene chloride or chloroform; an ether such as tetrahydrofuran or diethyl ether; and an aprotic polar solvent such as dimethylformamide, N-methylpyrrolidone or dimethylsulfoxide may be used.

For the above production, a conventional urethane-forming reaction catalyst is used. Such a catalyst may, for example, be a tin type such as dibutyltin dilaurate, dioctyltin dilaurate, dibutyltin dioctoate or stannous octoate; an iron type such as iron acetyl acetonate or ferric chloride; or a tertiary amine such as triethylamine or triethylenediamine.

The amount of introduction of the compound having active hydrogen and a tertiary amino group in one molecule is preferably controlled to be within a range of the amine value after the reaction of from 10 to 300 mg-KOH/g, more preferably from 20 to 200 mg-KOH/g. If the amine value is lower than the above range, the dispersion capability tends to decrease, and if it exceeds the above range, the developing property tends to be low.

Further, in a case where isocyanate groups remain in the dispersed resin obtained by the above reaction, it is preferred to further protects the isocyanate groups with an alcohol or an amino compound, whereby the stability with time of the formed product tends to be high.

The acrylic type dispersing agent is preferably an A-B block copolymer and/or a B-AB block copolymer comprising an A block having a quaternary ammonium salt group in its side chains and a B block having no quaternary ammonium salt group.

The A block constituting the block copolymer of the acrylic type dispersing agent has a quaternary ammonium salt group, preferably a quaternary ammonium salt group represented by —N$^+$R$^1$R$^2$R$^3$.Y$^-$ (wherein each of R$^1$, R$^2$ and R$^3$ which are independent of one another, is a hydrogen atom or a cyclic or linear hydrocarbon which may be substituted, and two or more of R$^1$, R$^2$ and R$^3$ may mutually be bonded to form a cyclic structure, and Y$^-$ is a counter anion). This quaternary ammonium salt group may directly be bonded to the main chain or may be bonded to the main chain via a bivalent linking group.

In —N$^+$R$^1$R$^2$R$^3$, the cyclic structure formed by mutual bonding of two or more of R$^1$, R$^2$ and R$^3$ may, for example, be a 5- to 7-membered nitrogen-containing heteromonocyclic ring or a condensed ring having two such rings condensed. The nitrogen-containing heterocyclic ring is preferably one having no aromaticity, more preferably a saturated ring. Specifically, the following may be mentioned:

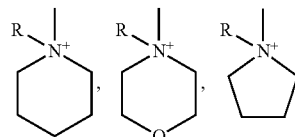

(R: either substituent of R$^1$ to R$^3$)

Such a cyclic structure may further have a substituent.

In —N$^+$R$^1$R$^2$R$^3$, more preferred as each of R$^1$, R$^2$ and R$^3$ is a C$_{1-3}$ alkyl group which may have a substituent, a phenyl group which may have a substituent or a benzyl group which may have a substituent.

The A block is particularly preferably one containing a partial structure represented by the following formula (I):

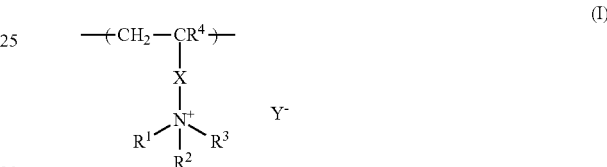

wherein each of R$^1$, R$^2$ and R$^3$ which are independent of one another, is a hydrogen atom, or a cyclic or linear hydrocarbon group which may be substituted, and two or more of R$^1$, R$^2$ and R$^3$ may be mutually bonded to form a cyclic structure, R$^4$ is a hydrogen atom or a methyl group, X is a bivalent linking group, and Y$^-$ is a counter anion.

In the formula (I), the bivalent linking group X may, for example, be a C$_{1-10}$ alkylene group, an arylene group, a —CONH—R$^7$— group, a —COO—R$^8$— group (wherein each of R$^7$ and R$^8$ which are independent of each other, is a direct bond, a C$_{1-10}$ alkylene group, or a C$_{1-10}$ ether group (—R'—O—R"—; each of R' and R" which are independent of each other, is an alkylene group)), and is preferably a —COO—R$^8$— group.

Two or more types of partial structures containing a specific quaternary ammonium salt group may be contained in one A block. In such a case, the two or more types of partial structures containing a quaternary ammonium salt group may be contained in either form of a random copolymer and a block copolymer in the A block. Further, a partial structure containing no quaternary ammonium salt group may be contained in the A block, and such a partial structure may, for example, be a partial structure derived from the after-mentioned (meth)acrylate monomer. The content of such a partial structure containing no quaternary ammonium salt group in the A block is preferably from 0 to 50 wt %, more preferably from 0 to 20 wt %, and it is most preferred that such a partial structure containing no quaternary ammonium salt group is not contained in the A block.

On the other hand, the B block constituting the block copolymer of the acrylic type dispersing agent may, for example, be a polymer structure obtained by copolymerizing a comonomer such as a styrene type monomer such as styrene or α-methylstyrene; a (meth)acrylate monomer such as methyl(meth)acrylate, ethyl(meth)acrylate, propyl(meth) acrylate, isopropyl(meth)acrylate, butyl(meth)acrylate, octyl(meth)acrylate, 2-ethylhexyl(meth)acrylate, glycidyl (meth)acrylate, benzyl(meth)acrylate, hydroxyethyl(meth) acrylate, glycidyl ethylacrylate or N,N-dimethylaminoethyl (meth)acrylate; a (meth)acrylic acid salt type monomer such as (meth)acrylic acid chloride; a (meth)acrylamide type monomer such as (meth)acrylamide, N-methylol acrylamide, N,N-dimethylacrylamide or N,N-dimethylaminoethylacrylamide; vinyl acetate; acrylonitrile; allyl glycidyl ether, glycidyl crotonate; or N-methacryloylmorpholine.

The B block is particularly preferably a partial structure derived from a (meth)acrylate type monomer represented by the following formula (II):

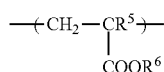
(II)

wherein $R^5$ is a hydrogen atom or a methyl group. $R^6$ is a cyclic or chain alkyl group which may have a substituent, an allyl group which may have a substituent, or an aralkyl group which may have a substituent.

Two or more types of the partial structures derived from the (meth)acrylate type monomer may be contained in one B block. Of course, the B block may further have another partial structure. In a case where two or more types of partial structures derived from a monomer are present in the B block containing no quaternary ammonium salt group, such partial structures may be contained in the B block in either form of a random copolymer and a block copolymer. In a case where a partial structure other than the partial structure derived from the (meth)acrylate type monomer is contained in the B block, the content of the partial structure other than the partial structure derived from the (meth)acrylate type monomer in the B block is preferably from 0 to 50 wt %, more preferably from 0 to 20 wt %, and it is most preferred that no partial structure other than the partial structure derived from the (meth)acrylate type monomer is not contained in the B block.

The acrylic type dispersing agent to be used in the present invention is preferably an A-B block or B-A-B block copolymer type polymer compound comprising such an A block and a B block, and such a block copolymer is prepared, for example, by the following living polymerization method.

The living polymerization method may be an anionic living polymerization method, a cationic living polymerization method or a radical living polymerization method, and among them, in the anionic living polymerization method, the polymerization active species is an anion, and the anion living polymerization method is represented, for example, by the following scheme:

(Anionic Living Polymerization Method)

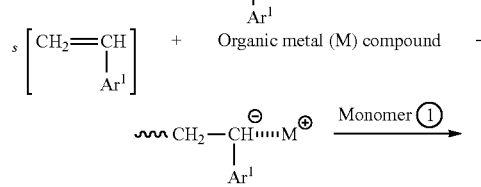

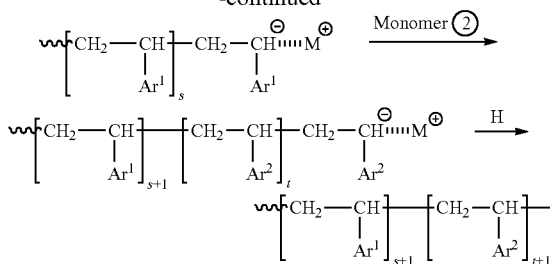

In the above formula, usually, $Ar^1$ is a phenyl group which may have a substituent, and M is an alkali metal. Each of s and t is an integer.

In the living polymerization method, the polymerization active species is a radical, and the radical living polymerization method is represented, for example, by the following scheme.

(Radical Living Polymerization Method)
(Nitroxyl Method)

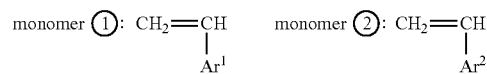

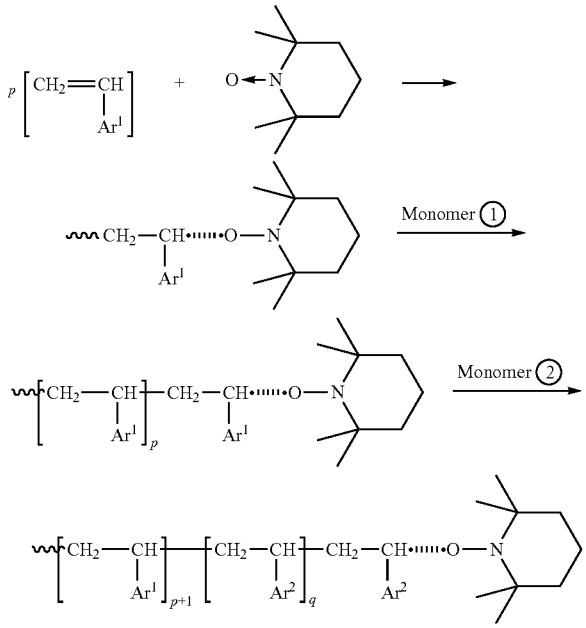

(ATRP Method)

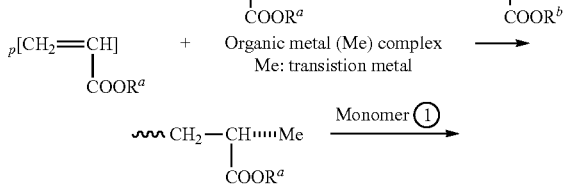

-continued

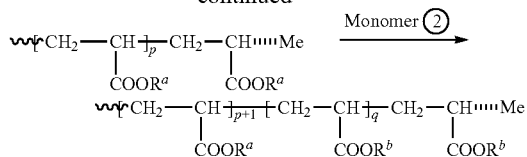

In the above formula, usually, each of $Ar^1$ and $Ar^2$ is a phenyl group which may have a substituent, M is an alkali metal, and each of p and q is an integer.

Further, usually, each of $R^a$ and $R^b$ is an alkyl group, and Me is a methyl group.

To prepare such an acrylic type dispersing agent, known methods may be employed as disclosed in e.g. JP-A-9-62002, P. Lutz, P. Masson et al, Polym. Bull. 12, 79 (1984), B. C. Anderson, G. D. Andrews et al, Macromolecules, 14, 1601 (1981), K. Hatada, K. Ute, et al, Polym. J. 17, 977 (1985), 18, 1037 (1986), Koichi Ute, Koichi Hatada, Polymer Application, 36, 366 (1987), Toshinobu Higashimura, Mitsuo Sawamoto, KOBUNSHI RONBUNSHU (Japanese Journal of Polymer Science and Technology), 46, 189 (1989), M. Kuroki, T. Aida, J. Am. Chem. Sic, 109, 4737 (1987), Takuzo Aida, Shohei Inoue, Journal of Synthetic Organic Chemistry, Japan, 43, 300 (1985) or D. Y. Sogoh, W. R. Hertler et al, Macromolecules, 20, 1473 (1987).

Regardless whether the acrylic type dispersing agent to be used in the present invention is an A-B block copolymer or a B-A-B block copolymer, the A block/B block ratio constituting the copolymer is preferably from 1/99 to 80/20, particularly preferably from 5/95 to 60/40 (weight ratio). Out of this range, favorable heat resistance and dispersion property may not be satisfied simultaneously.

The amount of the quaternary ammonium salt group in 1 g of the A-B block copolymer or the B-A-B block copolymer in the present invention is usually preferably from 0.1 to 10 mmol, more preferably from 2 to 8 mmol. Out of this range, favorable heat resistance and dispersion property may not be satisfied simultaneously.

Such a block copolymer usually contains amino groups resulting from the production procedure, and the amine value is at a level of from 5 to 500 mg-KOH/g, preferably at a level of from 10 to 300 mg-KOH/g. The amine value is, as described above, represented by mg of KOH corresponding to the acid value obtained by acid-base titration of the basic amino groups with an acid.

Further, the acid value of the block copolymer depends on the presence or absence and the type of acidic groups resulting from the acid value, but is usually preferably lower, and is usually at most 300 mg-KOH/g.

The molecular weight, by the weight average molecular weight (Mw) as calculated as polystyrene measured by GPC, is preferably within a range of from 1,000 to 100,000, more preferably from 5,000 to 50,000. If the weight average molecular weight of the block copolymer is less than 1,000, the dispersion stability tends to be decreased, and if it exceeds 100,000, the developing property and the resolution property tend to be low.

In the present invention, as the dispersing agent (F) having an amine value (mg-KOH/g) of at least 10 and at most 300, a commercially available urethane type and/or acrylic type dispersing agent having the same structure as above may be employed.

Such dispersing agents (F) having an amine value (mg-KOH/g) of at least 10 and at most 300 may be used alone or as a mixture of at least two in optional combination and proportion.

In the composition of the present invention, the content of the dispersing agent (F) having an amine value (mg-KOH/g) of at least 10 and at most 300 is preferably at least 0.05 wt % and at most 10 wt %, particularly preferably at least 0.25 wt % and at most 5 wt % to the total solid content in the composition, and is preferably at least 0.1 part by weight and at most 20 parts by weight, particularly preferably at least 0.5 part by weight and at most 10 parts by weight per 100 parts by weight of the total amount of the fillers in the composition containing the filler (B). If the content of the dispersing agent (F) having an amine value (mg-KOH/g) of at least 10 and at most 300 is less than the above lower limit, no sufficient effects to improve the coating property and the coating film properties will be obtained, and if it exceeds the above upper limit, layer separation or agglomeration of the filler may occur.

[Composition Coating Liquid]

The content of the agglomerated BN particles of the present invention contained in the composition of the present invention is usually preferably at least 20 wt % and at most 90 wt %, more preferably at least 20 wt % and at most 80 wt %, further preferably at least 30 wt % and at most 70 wt %. If the content of the agglomerated BN particles in the composition is less than the above lower limit, the composition tends to have a low viscosity and favorable molding processability, however, the effect to impart thermal conductivity tends to be low. If the content of the agglomerated BN particles in the composition exceeds the above upper limit, the viscosity of the composition tends to be high, and forming tends to be difficult.

Further, the composition coating liquid of the present invention further contains an organic solvent (E) in addition to the composition of the present invention. That is, the composition of the present invention contains no organic solvent, and one having an organic solvent added to the composition of the present invention is the composition coating liquid of the present invention.

[Organic Solvent (E)]

The organic solvent (E) in the composition coating liquid of the present invention is not particularly limited so long as the solid content of the composition coating liquid (component other than the organic solvent (E) of the composition coating liquid, corresponding to the composition of the present invention) can be uniformly dissolved or dispersed in it. The organic solvent (E) preferably comprises an organic solvent (Ea) having a boiling point of at least 60° C. and less than 120° C., more preferably comprises an organic solvent (Eb) having a boiling point of at least 120° C.

As the organic solvent (E), for example, one having a proper boiling point may be selected from the following alcohol type solvent, aromatic type solvent, amide type solvent, alkane type solvent, ethylene glycol ether and ether/ester type solvent, propylene glycol ether and ether/ester type solvent, ketone type solvent and ester type solvent.

(Alcohol Type Solvent)

Methanol (boiling point: 64.7° C.), ethanol (boiling point: 78.4° C.), butanol (boiling point: 117° C.), iso-propyl alcohol (boiling point: 82.4° C.), n-propyl alcohol (boiling point: 97.15° C.), tert-butanol (boiling point: 82.4° C.), 1,4-butanediol (boiling point: 230° C.), 2-ethylhexanol (boiling point: 183 to 185° C.), hexafluoroisopropanol, etc.

(Aromatic Type Solvent)

Toluene (boiling point: 110.6° C.), xylene (boiling point: 144° C.), monochlorobenzene, dichlorobenzene, trichlorobenzene, phenol, etc.

(Amide Type Solvent)

N,N-dimethylformamide (boiling point: 153° C.), N,N-dimethylacetamide (boiling point: 165° C.), etc.

(Alkane Type Solvent)

n-hexane (boiling point: 69° C.), iso-hexane (boiling point: 68 to 70° C.), cyclohexane (boiling point: 80.74° C.), methylcyclohexane (boiling point: 101° C.), n-heptane (boiling point: 98° C.), iso-octane (boiling point: 99° C.), n-decane (boiling point: 174.2° C.), etc.

(Ethylene Glycol Ether and Ether/Ester Type Solvent)

Ethylene glycol monomethyl ether (boiling point: 124° C.), ethylene glycol ethyl ether (boiling point: 135° C.), ethylene glycol n-butyl ether (boiling point: 171° C.), ethylene glycol mono-iso-butyl ether (boiling point: 160° C.), ethylene glycol hexyl ether (boiling point: 208° C.), ethylene glycol phenyl ether (boiling point: 242° C.), ethylene glycol monopropyl ether (boiling point: 149.5° C.), ethylene glycol mono-iso-propyl ether (boiling point: 141° C.), diethylene glycol monomethyl ether (boiling point: 194° C.), diethylene glycol dimethyl ether (boiling point: 162° C.), diethylene glycol monoethyl ether (boiling point: 202° C.), diethylene glycol diethyl ether (boiling point: 189° C.), diethylene glycol n-butyl ether (boiling point: 231° C.), diethylene glycol mono-iso-butyl ether (boiling point: 220° C.), diethylene glycol dibutyl ether (boiling point: 256° C.), diethylene glycol hexyl ether (boiling point: 259° C.), triethylene glycol monomethyl ether (boiling point: 249° C.), triethylene glycol monoethyl ether (boiling point: 256° C.), triethylene glycol monobutyl ether (boiling point: 271° C.), polyethylene glycol monomethyl ether (boiling point: 295° C.), etc.

(Propylene Glycol Ether and Ether/Ester Type Solvent)

Propylene glycol methyl ether (boiling point: 120° C.), dipropylene glycol methyl ether (boiling point: 190° C.), tripropylene glycol methyl ether (boiling point: 242° C.), propylene glycol n-propyl ether (boiling point: 150° C.), dipropylene glycol n-propyl ether (boiling point: 212° C.), tripropylene glycol n-propyl ether (boiling point: 274° C.), propylene glycol n-butyl ether (boiling point: 170° C.), propylene glycol-iso-butyl ether (boiling point: 157° C.), dipropylene glycol n-butyl ether (boiling point: 229° C.), tripropylene glycol n-butyl ether (boiling point: 274° C.), propylene glycol phenyl ether (boiling point: 243° C.), dipropylene glycol dimethyl ether (boiling point: 175° C.), propylene glycol phenyl ether (boiling point: 243° C.), etc.

(Ketone Type Solvent)

Acetone (boiling point: 56° C.), methyl ethyl ketone (hereinafter referred to as "MEK") (boiling point: 80° C.), methyl propyl ketone (boiling point: 102° C.), methyl n-butyl ketone (boiling point: 128° C.), methyl iso-butyl ketone (boiling point: 118° C.), methyl iso-amyl ketone (boiling point: 145° C.), methyl n-amyl ketone (boiling point: 152° C.), ethyl butyl ketone (boiling point: 149° C.), ethyl sec-amyl ketone (boiling point: 159° C.), acetylacetone (boiling point: 140° C.), diacetone alcohol (boiling point: 166° C.), di-iso-butyl ketone (boiling point: 169° C.), cyclohexanone (hereinafter referred to as "CHN") (boiling point: 157° C.), cyclohexyl cyclohexanone (boiling point: 261° C.), etc.

(Ester Type Solvent)

Methyl acetate (boiling point: 57° C.), ethyl acetate (boiling point: 77° C.), propyl acetate (boiling point: 102° C.), iso-propyl acetate (boiling point: 88° C.), butyl acetate (boiling point: 126° C.), iso-butyl acetate (boiling point: 117° C.), sec-butyl acetate (boiling point: 112° C.), amyl acetate (boiling point: 146° C.), methylamyl acetate (boiling point: 146° C.), 2-ethylhexyl acetate (boiling point: 199° C.), ethylene glycol ether methyl acetate (boiling point: 145° C.), ethylene glycol ether methyl acetate (boiling point: 145° C.), ethylene glycol ether ethyl acetate (boiling point: 156° C.), ethylene glycol ether n-butyl acetate (boiling point: 188° C.), diethylene glycol ether ethyl acetate (boiling point: 217° C.), diethylene glycol ether n-butyl acetate (boiling point: 245° C.), ethylene glycol diacetate (boiling point: 191° C.), iso-butyl-iso-butyrate (boiling point: 147° C.), ethyl lactate (boiling point: 154° C.), butyl lactate (boiling point: 188° C.), 3-methyl-3-methoxybutyl acetate (boiling point: 188° C.), ethyl lactate (boiling point: 155° C.), propylene glycol monomethyl ether acetate (hereinafter referred to as "PGMEA") (boiling point: 146° C.), propylene glycol diacetate (boiling point: 190° C.), propylene monomethyl ether methyl acetate (boiling point: 188° C.), etc.

The organic solvent (E) is used in an amount of from 0 to 10,000 parts by weight, preferably from 0 to 1,000 parts by weight per 100 parts by weight of the resin such as the epoxy resin.

<Organic Solvent (Ea)>

With respect to the composition coating liquid of the present invention, by using an organic solvent (Ea) having a boiling point less than 120° C., the efficiency of the evaporation of the organic solvent in the B-stage formation can be increased. However, if the boiling point of the organic solvent (Ea) is excessively low, evaporation roughness may occur, and accordingly the boiling point of the organic solvent (Ea) is preferably at least 60° C., particularly preferably from 65 to 115° C.

As such an organic solvent (Ea), one having a boiling point less than 120° C. is selected from the above various organic solvents. Particularly, in view of the boiling point within the above preferred range and favorable uniform mixing property with the organic solvent (Ea) and solubility of the resin, preferred is propyl alcohol, isopropyl alcohol, tert-butanol, methyl ethyl ketone, methyl propyl ketone, methyl isobutyl ketone, propyl acetate or isobutyl acetate.

Such organic solvents (Ea) may be used alone or in an optional combination of at least two in an optional proportion.

<Organic Solvent (Eb)>

The composition coating liquid of the present invention may contain an organic solvent (Eb) having a boiling point of at least 120° C. in combination with the organic solvent (Ea) having a boiling point less than 120° C. By using the organic solvent (Eb) having a boiling point of at least 120° C., evaporation roughness due to rapid evaporation of the organic solvent at the time of B-stage formation can be prevented, and a more homogeneous B-stage film can be formed.

That is, the heating temperature in the heat treatment for B-stage formation is usually from 50 to 150° C., preferably from 70 to 120° C., and at such a temperature, an organic solvent having a boiling point of at least 120° C. is evaporated and removed at an appropriate rate at which evaporation roughness will not occur. However, if the boiling point of the organic solvent (Eb) is excessively high, it tends to be difficult to efficiently and highly evaporate and remove the organic solvent in the coating film at the time of heat treatment in the B-stage formation, and accordingly the boiling point of the organic solvent (Eb) is preferably less than 180° C., particularly preferably at least 130° C. and less than 180° C., especially preferably from 140 to 170° C.

As the organic solvent (Eb), one having a boiling point of at least 120° C. is selected among the various organic solvents. Particularly, the organic solvent (Eb) is preferably propylene glycol methyl ether, methyl n-amyl ketone, cyclohexanone, PGMEA or ethyl lactate, which has a boiling point within the above preferred range, and provides favorable solubility of the resin and favorable stability of a mixed liquid.

Such organic solvents (Eb) may be used alone or in an optional combination of at least two in an optional proportion.

<Content>

In the composition coating liquid of the present invention, the proportion of the organic solvent (E) to the components other than the organic solvent (components other than the organic solvent (E) of the composition coating liquid, corresponding to the composition of the present invention) is not particularly limited, and is preferably at least 20 wt % and at most 70 wt %, particularly preferably at least 30 wt % and at most 60 wt %, to the other components.

Further, the solid content concentration in the coating liquid is preferably from 10 to 80 wt %, particularly preferably from 20 to 70 wt %.

By the above mixing ratio, a coating liquid having an appropriate viscosity and excellent handling efficiency, capable of forming a favorable coating film by an optional coating method, can be obtained.

If the mixing ratio of the organic solvent (E) is less than the above lower limit, the viscosity of the coating liquid may increase, whereby no favorable coating film may be obtained, and if it exceeds the above upper limit, problems may arise such that no desired film thickness can be obtained.

In a case where the organic solvent (Ea) and the organic solvent (Eb) are used in combination as the organic solvent (E), their total mixing ratio is preferably within the above range. Further, in order to obtain a synergistic effect by use of the organic solvent (Ea) and the organic solvent (Eb) in combination, the organic solvent (Ea) and the organic solvent (Eb) are preferably used, by wt %, in a ratio of organic solvent (Ea):organic solvent (Eb)=95 to 50:5 to 50, particularly 90 to 60:10 to 40 (total amount of the organic solvent (Ea) and the organic solvent (Eb) being 100 wt %).

[Process for Preparing Composition and Composition Coating Liquid]

The process for preparing the composition and the composition coating liquid of the present invention is not particularly limited, and a conventional process may be employed, and they can be prepared by mixing the constituents for the composition and the composition coating liquid. On that occasion, for the purpose of improving the uniformity of the composition and the composition coating liquid, defoaming, etc., mixing is carried out preferably by using a common kneading apparatus such as a paint shaker or a bead mill, a planetary mixer, a stirring type dispersing machine, a rotary and revolutionary stirring mixing machine, a three-roll mill, a kneader or a single screw or twin screw kneading machine.

The order of mixing the respective components is optional so long as there are no problem such that the reaction occurs or the precipitates form. Any two or more components are preliminarily mixed among the constituents for the composition or the composition coating liquid and then the other components are mixed, or all the components are mixed all at once.

[Process for Producing Molded Product]

The molded product of the present invention is obtained by molding the composition of the present invention. As the molding method for forming a molded product, a commonly employed method for molding a resin composition may be employed.

For example, in a case where the composition of the present invention has plasticity or fluidity, the composition in a desired shape, for example, in a state where it is filled in a mold, is cured and is thereby molded. Such a process for producing a molded product may be an injection molding method, an injection compression molding method, an extrusion method or a compression molding method.

Further, in a case where the composition of the present invention is a thermosetting resin composition such as an epoxy resin or a silicone resin, molding i.e. curing for forming a molded product may be carried out under curing temperature conditions corresponding to each composition.

Further, in a case where the composition of the present invention is a thermoplastic resin composition, molding for forming a molded product may be carried out at a temperature of at least the melting temperature of the thermoplastic resin at predetermined molding rate under predetermined pressure.

Further, the molded product of the present invention may be obtained also by curving a solid material obtained by molding and curing the composition of the present invention into a desired shape.

[Process for Producing Three-Dimensional Integrated Circuit]

Now, the process for producing a three-dimensional integrated circuit of the present invention will be described.

Using the composition of the present invention, the composition coating liquid of the present invention is applied to form a film between a plurality of semiconductor substrates, and such semiconductor substrates are pressure bonded and laminated to produce a three-dimensional integrated circuit.

Further, using the composition coating liquid of the present invention, the composition coating liquid of the present invention is applied to form a film between a plurality of semiconductor substrates, and such semiconductor substrates are pressure bonded and laminated to produce a three-dimensional integrated circuit. In such a case, more specifically, the process may comprise a coating step of applying the composition coating liquid of the present invention to the surface of a semiconductor substrate to form a coating film, and a bonding step of laminating the semiconductor substrate having a coating film formed thereon and another semiconductor substrate and pressurizing them, and may comprise a step of heating the coating film for B-stage formation (hereinafter referred to as "B-stage formation step") between the coating step and the bonding step.

Now, the process for producing a three-dimensional integrated circuit of the present invention using the composition coating liquid of the present invention will specifically be described.

<Coating Step>

First, a coating film of the composition coating liquid of the present invention is formed on the surface of a semiconductor substrate.

That is, using the composition coating liquid of the present invention, a coating film is formed by a dipping method, a spin coating method, a spray coating method, a blade method or another optional method.

To apply the composition coating liquid of the present invention, it is preferred to use a coating apparatus such as a spin coater, a slit coater, a die coater or a blade coater, whereby a coating film having a predetermined film thickness can uniformly be formed on the semiconductor substrate.

<B-Stage Formation Step>

The coating film formed by applying the coating liquid of the present invention is subjected to heat treatment at an optional temperature of usually from 50 to 150° C., preferably from 70 to 120° C. for from about 10 to about 120 minutes, to remove the solvent and low molecular weight components, thereby to form a B-stage film.

If the heating temperature for the B-stage formation is too low or if the heating time is too short, the organic solvent in the coating film may not sufficiently be removed, and the organic solvent remains in the obtainable B-stage film, the remaining organic solvent evaporates by the high temperature treatment in the subsequent bonding step, and evaporation spot of the remaining solvent makes voids, whereby a filling interlayer having high thermal conductivity, high insulating property, predetermined physical strength, etc. cannot be formed. On the other hand, if the heating temperature for the B-stage formation is too high or if the heating time is too long, curing of the resin will proceed, whereby no favorable B-stage film will be obtained. Accordingly, the heating conditions for B-stage formation are such that in a case where the B-stage film has a thickness of from 1 to 50 μm, heating is carried out at from 70 to 110° C., preferably from 80 to 100° C. for from about 30 to about 120 minutes, and in a case where the B-stage film has a thickness of from 50 to 200 μm, heating is carried out at from 80 to 120° C., preferably from 90 to 110° C. for from about 60 to about 120 minutes, although the heating conditions vary depending upon the thickness of the B-stage film to be formed, the boiling point of the organic solvent in the coating liquid, the type of the thermosetting resin used.

On that occasion, the heat treatment may be carried out at a certain temperature, or the heat treatment may be carried out under reduced pressure in order that removal of volatile components such as the organic solvent in the coating liquid smoothly proceed. Further, within a range where curing of the resin (A) will not proceed, heat treatment by stepwise heat increase may be carried out. For example, heat treatment may be carried out initially at from 50 to 70° C., for example at 60° C., then at from 70 to 90° C., for example at 80° C., and further at from 90 to 150° C., for example at 120° C., each for from about 5 to about 30 minutes.

Further, the composition or the composition coating liquid of the present invention has sufficient extensibility suitable for film forming, and accordingly it is formed into a film and the film is disposed on a semiconductor substrate for forming a film. The composition or the composition coating liquid of the present invention is capable of forming a homogeneous film while a decrease in the film property by evaporation roughness at the time of film forming is prevented.

<Bonding Step>

Then, the formed B-stage film is heated to develop tack property, and then subjected to temporary bonding with the semiconductor substrate to be bonded. The temporary bonding temperature depends on the resin (A), and the temporary bonding is carried out at a temperature of from 80 to 150° C., especially from 90 to 140° C. for from about 1 second to about 120 seconds.

In a case where a plurality of semiconductor substrates are to be bonded, temporary bonding may be repeatedly carried out for the respective substrates, or a plurality of substrates each having the B-stage film formed thereon are overlaid, and they are temporarily bonded by heating altogether. For the temporary bonding, as the case requires, a load of from 1 gf/cm$^2$ to 5 kgf/cm$^2$, preferably from 10 gf/cm$^2$ to 3 kgf/cm$^2$ is preferably applied to the laminate substrates.

After the temporary bonding, main bonding of the semiconductor substrates is carried out.

The main bonding is carried out in such a manner that the temporarily bonded semiconductor substrates are pressurized at a temperature of at least 200° C., preferably at least 220° C. for from about 10 to about 60 seconds, whereby the melt viscosity of the resin (A) in the B-stage film is lowered to accelerate connection of electric terminals between the semiconductor substrates and at the same time, the flux (D) in the B-stage film is activated, whereby solder bonding between the semiconductor substrates proceed. The upper limit of the heating temperature of the main bonding is a temperature at which the resin (A) to be used is not decomposed or denatured, is properly determined by the type and the grade of the resin, and is usually at most 300° C.

Further, at the time of heat bonding, as the case requires, a load of from 10 gf/cm$^2$ to 10 kgf/cm$^2$, more preferably from 100 gf/cm$^2$ to 5 kgf/cm$^2$ is applied to the substrates.

In a case where a three-dimensional integrated circuit is to be produced by using the composition of the present invention, a three-dimensional integrated circuit can be produced by carrying out B-stage formation and bonding in the same manner as above except that the composition of the present invention is applied to a semiconductor substrate by potting to form a film, which is subjected to heat treatment by a hotplate or a warm air oven to distill off the solvent.

EXAMPLES

Now, the present invention will be described in further detail with reference to Examples. However, it should be understood that the present invention is by no means restricted to the following Examples within the scope of the present invention.

[Component Blended]

Components blended for the composition used in Examples are as follows.

{Resin (A)}

<Epoxy Resin (a1)>

Epoxy resin (a1-1): "YL6800", tradename, manufactured by Mitsubishi Chemical Corporation (epoxy equivalent: 180 g/equivalent)

Epoxy resin (a1-2): "YX4000", tradename, manufactured by Mitsubishi Chemical Corporation (epoxy equivalent: 186 g/equivalent)

Epoxy resin (a1-3): "1001", tradename, manufactured by Mitsubishi Chemical Corporation (epoxy equivalent: 475 g/equivalent)

<Epoxy Resin (a2)>

Epoxy resin (a2-1): phenoxy resin prepared in the following Preparation Example 2-1, weight average molecular weight: 26,000, epoxy equivalent: 4,600 g/equivalent, 30 wt % methyl ethyl ketone/cyclohexanone solution Epoxy resin (a2-2): "1006", tradename, manufactured by Mitsubishi Chemical Corporation (epoxy equivalent: 1,000 g/equivalent)

<Epoxy Resin (a3)>

Epoxy resin (a3-1): "1032H60", tradename, manufactured by Mitsubishi Chemical Corporation (epoxy equivalent: 169 g/equivalent)

[Filler (B)]

Filler (B-1): boron nitride particles prepared in the Preparation Example 2-2

Filler (B-2): "R-BN", tradename, manufactured by NISSHIN REFRATECH CO., LTD. (coefficient of thermal conductivity: 3 W/mK (thickness direction), 275 W/mK (in-plane direction))

Filler (B-3): Silica "PLV-4", tradename, manufactured by Tatsumori Ltd.

[Curing Agent (C)]

2-phenyl-4,5-dihydroxymethyl imidazole, "2PHZ-PW", tradename, manufactured by SHIKOKU CHEMICALS CORPORATION

[Flux (D)]

Adipic acid, special grade chemicals, manufactured by Wako Pure Chemical

Industries, Ltd.

[Organic Solvent (E)]

Organic solvent (Ea): methyl ethyl ketone (MEK) (boiling point: 80° C.), special grade chemicals, manufactured by Wako Pure Chemical Industries, Ltd.

Organic solvent (Eb): cyclohexanone (CHN) (boiling point: 155° C.), special grade chemicals, manufactured by Wako Pure Chemical Industries, Ltd.

{Method for Measuring Physical Properties}

The method for measuring various physical properties, etc. are as follows. In the following, "the volume-based average particle size $D_{50}$" will be referred to simply as "$D_{50}$".

Further, the total oxygen content of the material BN powder was based on values in catalogues.

<Total Pore Volume of Material h-BN Powder>

Using "AutoPore IV9520" manufactured by Micrometrics, the h-BN powder was subjected to vacuum treatment under reduced pressure (at most 50 μmHg) for 10 minutes, and then a mercury intrusion-extrusion curve was measured to obtain the total pore volume with pore sizes of from 10 nm to 500 μm.

<Specific Surface Area of Material h-BN Powder>

The h-BN powder was subjected to pretreatment in a nitrogen gas flow at 250° C. for 15 minutes, and then the specific surface area was measured by a BET one point method (adsorption gas: nitrogen) using "Macsorb HM MODEL-1201" manufactured by Mountech Co., Ltd.

<$D_{50}$ of h-BN Particles in BN Slurry>

The BN slurry was added to 30 mL of a 0.2 wt % aqueous solution of sodium hexamethaphosphate so that the transmittance would be at least 90%, and further 0.1 g of a 10 wt % aqueous solution of a nonionic surfactant "TritonX100" manufactured by Aldrich was added, followed by irradiation with ultrasonic waves of 150 W for one minute to prepare a dispersion for particle size distribution measurement. This dispersion was subjected to measurement using "Nanotrac UPA-EX150" manufactured by NIKKISO CO., LTD.

<$D_{50}$ of Granulated Particle>

The granulated particles were added to 30 mL of a 0.2 wt % aqueous solution of sodium hexamethaphosphate so that the transmittance would be at least 90%, and further 0.1 g of a 10 wt % aqueous solution of a nonionic surfactant "TritonX100" manufactured by Aldrich was added, followed by irradiation with ultrasonic waves of 150 W for one minute to prepare a dispersion for particle size distribution measurement. This dispersion was subjected to measurement using "Microtrac HRA" manufactured by NIKKISO CO., LTD.

<$D_{50}$ and Maximum Particle Size of Agglomerated NB Particles after Heat Treatment and Classification>

The agglomerated BN particles after classification were added to 30 mL of a 0.2 wt % aqueous solution of sodium hexamethaphosphate so that the transmittance would be at least 90%, and further 0.1 g of a 10 wt % aqueous solution of a nonionic surfactant "TritonX100" manufactured by Aldrich was added, followed by irradiation with ultrasonic waves of 150 W for one minute to prepare a dispersion for particle size distribution measurement. $D_{50}$ of this dispersion was measured by a laser diffraction/scattering type particle size distribution measuring apparatus "Microtrac MT3300EX" manufactured by NIKKISO CO., LTD. Further, in the measured volume-based particle size distribution, the particle size of the largest particle was taken as the maximum particle size.

<Total Pore Volume of Agglomerated BN Particles after Heat Treatment and Classification>

Using "AutoPore IV 9520" manufactured by Micrometrics, the agglomerated BN particles were subjected to vacuum treatment under reduced pressure (at most 50 μmHg) for 10 minutes, and then a mercury intrusion-extrusion curve was measured to obtain a total pore volume with pore sizes of from 10 nm to 500 μm.

<Bulk Density of Agglomerated BN Particles after Heat Treatment and Classification>

Using "AutoPore IV 9520" manufactured by Micrometrics, weighed agglomerated BN particles as a sample were put in a dedicated cell the capacity of which was preliminarily measured, the weight including the cell was measured, and this cell was subjected to deaeration treatment under reduced pressure (at most 50 μmHg) at room temperature for 10 minutes. Then, mercury was introduced to the treated cell, the cell after introduction of mercury was weighed, the volume of mercury was calculated from the weight of mercury introduced, this volume of mercury was subtracted from the preliminarily obtained capacity of the cell to calculate the volume of the powder sample, and the weight of the agglomerated BN particles as a sample was divided by the volume of the powder sample to determine the bulk density.

<Method for Measuring Viscosity of Composition>

The viscosity of the composition was measured under the following conditions using a dynamic viscoelasticity measuring apparatus ARES manufactured by TA Instruments Japan Inc. The viscosity here means an absolute value of the complex viscosity.

Temperature: 25° C.

Angular frequency: 1 rad/s

Strain: 9.5%

$$|\eta^*|=\{(G''/\omega)^2+(G'/\omega)^2\}^{1/2}$$

Here, $\eta^*$ is the complex viscosity (unit: Pa·s), $G''$ is the loss elastic modulus (unit: Pa), $G'$ is the storage elastic modulus (unit: Pa) and $\omega$ is the angular frequency (unit: rad/s).

<Coefficient of Thermal Conductivity of Cured Product in Thickness Direction>

The thermal diffusivity, the specific gravity and the specific heat of a cured sample were measured by the following apparatus, and these three measured values were multiplied to obtain the coefficient of thermal conductivity in the thickness direction.

(1) Thermal diffusivity: A sample was cut into a disk-shaped specimen having a diameter of 12 mm and a thickness of about 0.5 mm, and the thermal diffusivity in the thickness direction was measured by using automatic laser flash method thermal constant measuring system "TC-7000" manufactured by ULVAC-RIKO, Inc.

(2) Specific gravity: Measured by Balance "XS204" manufactured by Mettler-Toredo International Inc. (using solid specific gravity measuring kit).

(3) Specific heat: The specific heat at 25° C. at a heating rate of 10° C./min was measured by differential scanning calorimetry "DSC7" manufactured by PerkinElmer Japan Co., Ltd., with software DSC7.

<Coefficient of Thermal Conductivity of Composition Film>

The thermal diffusivity, the specific gravity and the specific heat of a composition film were measured by the following apparatus, and these three measured values were multiplied to obtain the coefficient of thermal conductivity.

(1) Thermal diffusivity: A sample was cut into a disk-shaped specimen having a diameter of 10 mm and a thickness of about 0.5 mm, and the thermal diffusivity in the thickness direction was measured by using "ai-Phase Mobile 1u" manufactured by ai-Phase Co., Ltd.

(2) Specific gravity: Measured by "Balance XS-204" manufactured by Mettler-Toredo International Inc. (using solid specific gravity measuring kit).

(3) Specific heat: The specific heat at 25° C. at a heating rate of 10° C./min was measured by "DSC320/6200" manufactured by Seiko Instruments Inc., with software DSC7.

<Measurement of Crystallite Size of Boron Nitride Particles by X-Ray Diffraction>

The crystallite size (Lc) of the 002 plane of boron nitride particles was obtained by measuring the half value width of a peak at $2\theta=26.5°$ by X-ray diffraction, in accordance with the above formula (2). Likewise, the crystallite size (La) of the 100 plane was also obtained by measuring the half value width of a peak at $2\theta=41.5°$ by X-ray diffraction in accordance with the above formula (ii). As the X-ray diffraction apparatus, PW1700 manufactured by PANalytical was used.

<Measurement of Oxygen Content of Boron Nitride Particles>

The oxygen content of the boron nitride particles was measured by quantitative analysis by an inert gas fusion-infrared absorption method. As the analytical apparatus, an oxygen/nitrogen analyzer (EMGA-620W) manufactured by HORIBA Ltd. was used.

<Method for Measuring Melt Viscosity>

The melt viscosity (parallel plate dynamic viscosity) was measured by using viscoelasticity measuring apparatus Physica MCR301 manufactured by Anton Paar Japan.

First, the solvents were removed from the epoxy resin to be measured to obtain a solid, followed by press forming of the solid to obtain a plate sample having a thickness of about 1 mm. This sample was placed between a parallel plate dish and a parallel plate (25 mm in diameter) and the parallel plate dynamic viscosity was measured.

As the measurement conditions, 20% of sine wave distortion was applied to the above sample, the angular frequency of the distortion was 10 rad/sec, and the viscosity in a step of raising the temperature at a rate of 3° C. per minute was measured at from 40° C. to 200° C.

Examples 1-1 and 1-2 and Comparative Example 1-1

Preparation and Grinding of BN Slurry

<BN Slurry A>

The BN slurry A was prepared in the following blend ratio.

(Blend Ratio of BN Slurry A)

h-BN powder ("ABN" manufactured by NISSHIN REFRATECH CO., LTD., total oxygen content: 4 wt %): 500 g, pure water: 4,250 g, binder ("Alumina sol 520", manufactured by Nissan Chemical Industries, Ltd., solid content concentration: 20 wt %): 250 g, and surfactant (anionic surfactant "DEMOL NL" manufactured by Kao Corporation): 50 g.

The obtained BN slurry was thoroughly mixed, charged into "OB mill" manufactured by FREUND-TURBO CORPORATION, and subjected to circulating grinding at a rotor revolution number of 2,000 rpm at a circulating liquid amount of 0.5 L/min for 160 minutes. For grinding, zirconia beads having a diameter of 0.5 mm were used.

The total oxygen content, the total pore volume and the specific surface area of the material h-BN powder used for preparation of the BN slurry A, and $D_{50}$ of dispersed particles of h-BN in the obtained BN slurry A are as shown in Table 1-A.

<BN Slurry B>

The BN slurry B was prepared in the following blend ratio.

(Blend Ratio of BN Slurry B)

h-BN powder ("AP170S" manufactured by MARUKA CORPORATION, LTD., total oxygen content: 7.5 wt %): 500 g, pure water: 4,250 g, binder ("Alumina sol 520", manufactured by Nissan Chemical Industries, Ltd., solid content concentration: 20 wt %): 250 g, and surfactant (anionic surfactant "DEMOL NL" manufactured by Kao Corporation): 50 g.

The obtained BN slurry was thoroughly mixed, charged into "OB mill" manufactured by FREUND-TURBO CORPORATION, and subjected to circulating grinding at a rotor revolution number of 2,000 rpm at a circulating liquid amount of 0.5 L/min for 120 minutes. For grinding, zirconia beads having a diameter of 1.0 mm were used.

The total oxygen content, the total pore volume and the specific surface area of the material h-BN powder used for preparation of the BN slurry B, and $D_{50}$ of dispersed particles of h-BN in the obtained BN slurry B are as shown in Table 1-A.

<BN Slurry C>

The BN slurry C was prepared in the following blend ratio.

(Blend Ratio of BN Slurry C)

h-BN powder ("RBN" manufactured by NISSHIN REFRATECH CO., LTD., total oxygen content: 0.4 wt %): 500 g, pure water: 4,250 g, binder ("Alumina sol 520", manufactured by Nissan Chemical Industries, Ltd., solid content concentration: 20 wt %): 250 g, and surfactant (anionic surfactant "DEMOL NL" manufactured by Kao Corporation): 50 g.

The obtained BN slurry was thoroughly mixed, charged into "OB mill" manufactured by FREUND-TURBO CORPORATION, and subjected to circulating grinding at a rotor revolution number of 2,800 rpm at a circulating liquid amount of 0.5 L/min for 160 minutes. For grinding, zirconia beads having a diameter of 0.3 mm were used.

The total oxygen content, the total pore volume and the specific surface area of the material h-BN powder used for preparation of the BN slurry C, and $D_{50}$ of dispersed particles of h-BN in the obtained BN slurry C are as shown in Table 1-A.

[Formation into Spheres]

Each of the BN slurries A to C was subjected to formation into spheres by spray drying using a spray dryer "MDL-050M" manufactured by Fujisaki Electric Co., Ltd., setting the granulation conditions to achieve a granulated particle size $D_{50}$ of 10 μm. Each slurry was sprayed at a liquid sending rate of 30 ml/min (15 ml/min×2) under an air pressure of 0.7 MPa at an air flow rate of 92 L/min (46 L/min×2), and the drying temperature after nozzle injection was set at 200° C.

$D_{50}$ of the granulated particles obtained from each slurry was as shown in Table 1-A.

[Heat Treatment]

Each BN granulated particles after the above formation into spheres were subjected to heat treatment in a nitrogen gas flow using an atmosphere furnace at 2,000° C. for 5 hours.

The temperature increase and the temperature decrease at the time of the heat treatment were carried out as follows.

The temperature was increased from room temperature to 400° C. over a period of 20 minutes while the furnace was evacuated of air, and the temperature was maintained at 400° C. for 30 minutes while the furnace was evacuated of air. The degree of vacuum was from $10^{-1}$ to $10^{-2}$ Pa. Then, a nitrogen gas was introduced at 2.0 L/min to recover the pressure, and while introduction of nitrogen gas was continued, the temperature was increased to 1,500° C. at a rate of 100° C./hour and further increased to 1,500 to 2,000° C. at 50° C./hour. After the temperature reached 2,000° C., the temperature was maintained for 5 hours. Then, the temperature was decreased to room temperature at 7° C./min.

[Classification]

Each BN granulated particles after the above heat treatment were subjected to classification using a swirling air flow type classifier "AERO FINE CLASSIFIER (AC-20)" manufactured by NISSHIN ENGINEERING INC.

Hereinafter agglomerated BN particles obtained from BN slurry A will be referred to as "BN-A", agglomerated BN particles obtained from BN slurry B as "BN-B", and agglomerated BN particles obtained from BN slurry C as "BN-C".

BN-A are agglomerated BN particles in Example 1-1, BN-B are agglomerated BN particles in Example 1-2, and BN-C correspond to agglomerated BN particles in Comparative Example 1-1.

Results of measurement of $D_{50}$, the maximum particle size, the total pore volume and the bulk density of the respective agglomerated BN particles are shown in Table 1-B.

[Observation of Crystallinity and State of Agglomerated BN Particles]

In order to confirm the difference in the crystal growth direction among material h-BN powders, the crystallinity was confirmed (XRD), and the change of the state was observed by a SEM, as between before and after the heat treatment, with respect to BN-A prepared by using a h-BN powder having a total oxygen content of 4 wt %, BN-B prepared by using a h-BN powder having a total oxygen content of 7.5 wt % and BN-C prepared by using a h-BN powder having a total oxygen content of 0.4 wt %.

As a result, it was found that with respect to BN-A and BN-B prepared from a h-BN powder having a total oxygen content of at least 1 wt % as a material, h-BN underwent crystal growth radially, that is, primary particles of BN crystal underwent crystal growth in a normal direction so that a-axes faced outward, and crystals of fine BN primary particles having an average particle size of at most 1 μm were formed, on the surface of the agglomerated BN particles.

On the other hand, it was found with respect to BN-C prepared by using a h-BN powder having a total oxygen content less than 1 wt % as a material, the crystal growth direction was in a circumferential direction, that is, the C-plane of h-BN faced outward.

Figure 1B:
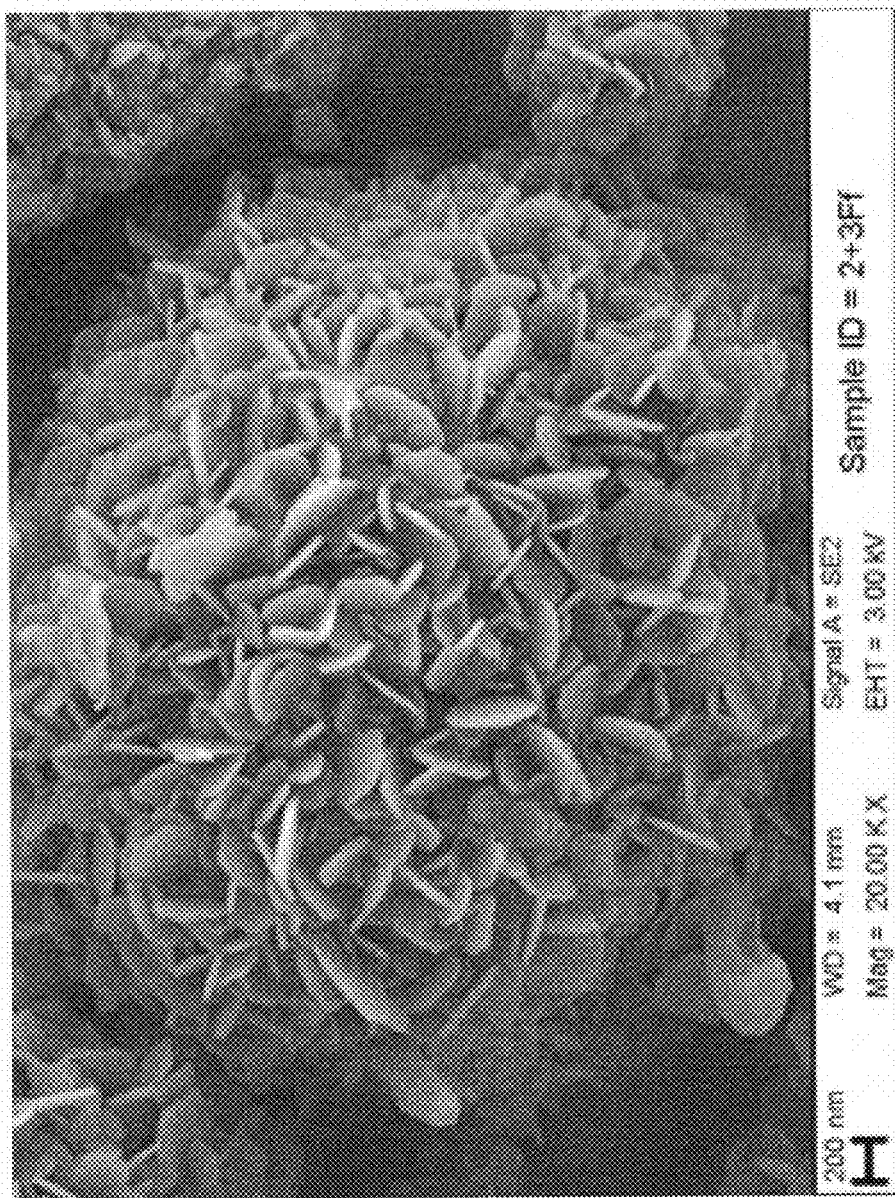
FIG. 1(b) is a SEM photograph of the same particles after heat treatment.
Figure 2A:
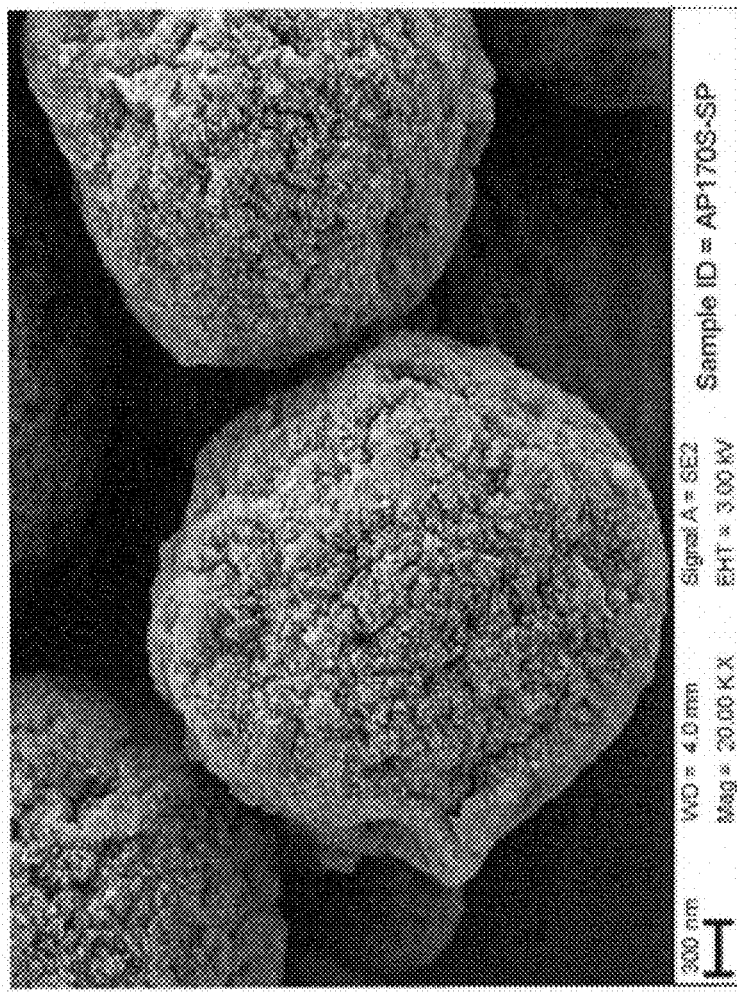
FIG. 2(a) is a SEM photograph of agglomerated BN particles (BN-B) in Example 1-2 before heat treatment.
Figure 2B:
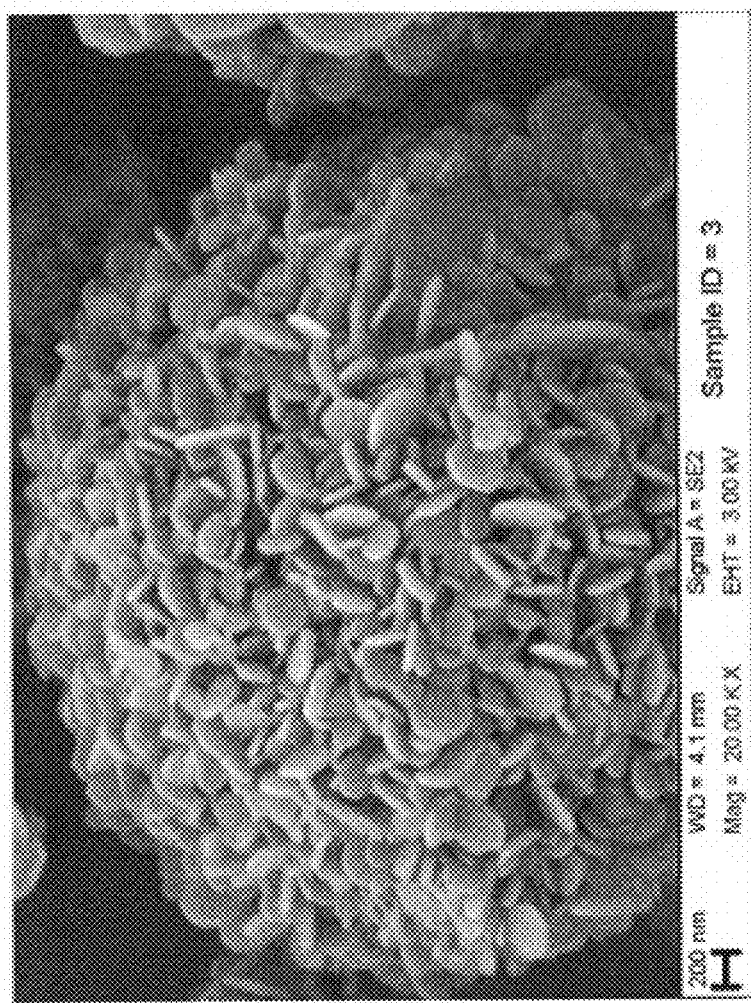
FIG. 2(b) is a SEM photograph of the particles after heat treatment.
Figure 3A:
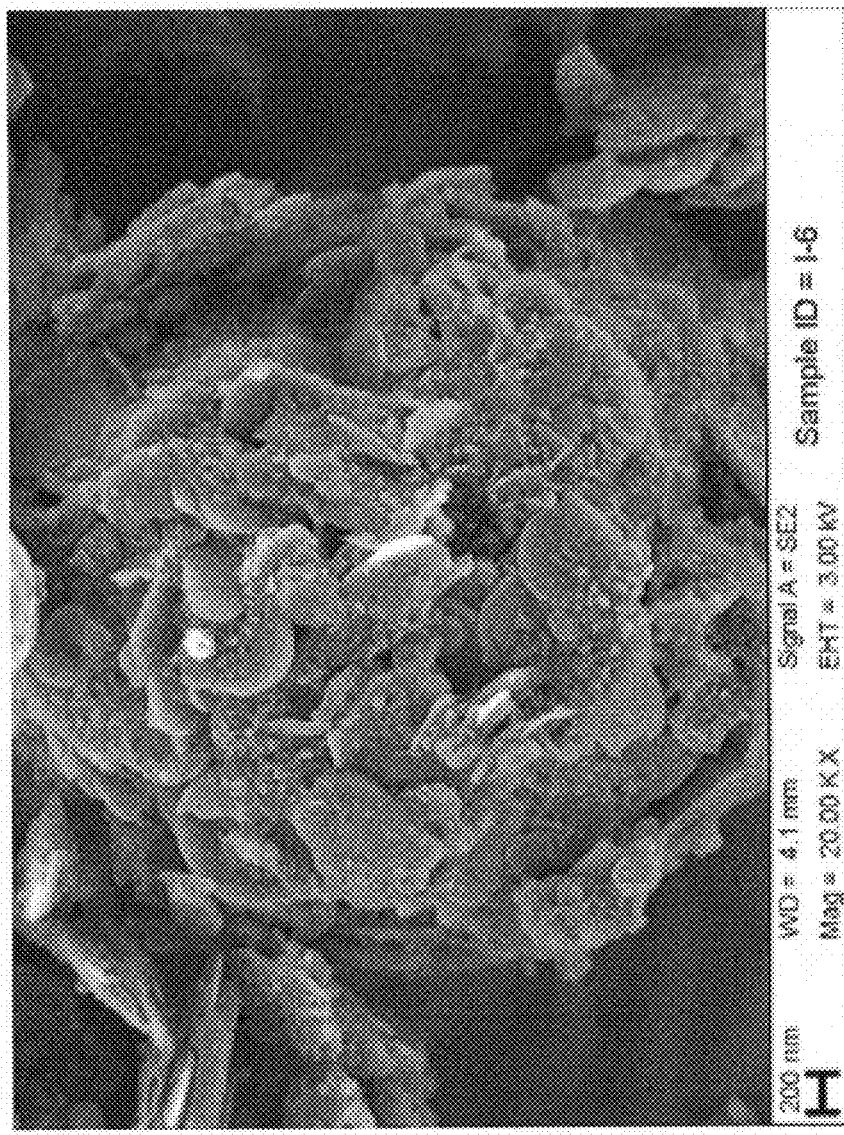
FIG. 3(a) is a SEM photograph of agglomerated BN particles (BN-C) in Comparative Example 1-1 before heat treatment.
Figure 3B:
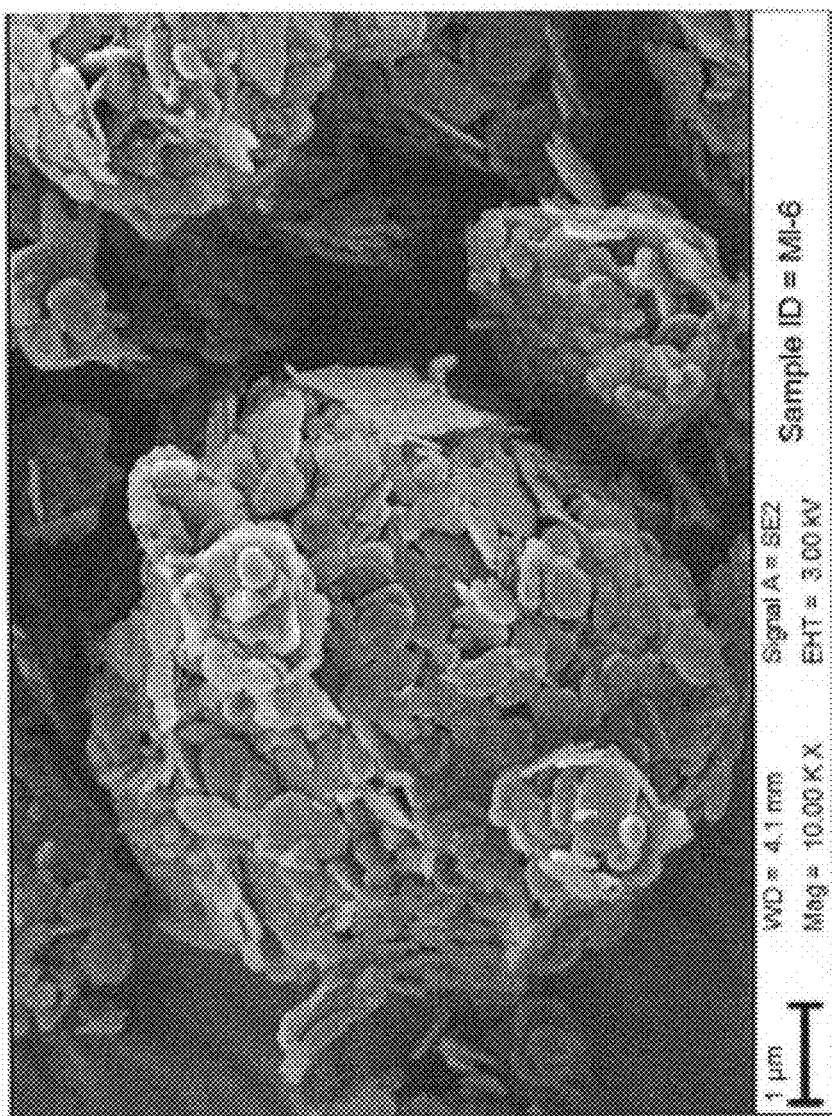
FIG. 3(b) is a SEM photograph of the same particles after heat treatment.

SEM photographs before and after heat treatment of BN-A, BN-B and BN-C are shown respectively in FIG. 1, FIG. 2 and FIG. 3.

Further, the above results are shown in Tables 1-1A and 1-1B.

TABLE 1-1A

| | | | Material BN powder | | | | |
|---|---|---|---|---|---|---|---|
| | Sample | Type of BN | BN total oxygen content (wt %) | Total pore volume (cm³/g) | Specific surface area (m²/g) | $D_{50}$ (μm) of h-BN particles in slurry | $D_{50}$ (μm) of granulated particles |
| Ex. 1-1 | BN-A | ABN | 4.0 | 0.944 | 127 | 0.44 | 8.9 |
| Ex. 1-2 | BN-B | AP170S | 7.5 | 0.754 | 116 | 0.48 | 7.5 |
| Comp. Ex. 1-1 | BN-C | RBN | 0.4 | 1.622 | 9.69 | 0.58 | 3.2 |

TABLE 1-1B

| | | | Agglomerated BN subjected to heat treatment after granulation | | | | | | |
|---|---|---|---|---|---|---|---|---|---|
| | Sample | Binder | Binder concentration (wt %) | $D_{50}$ particle size (μm) | Maximum particle size (μm) | Total pore volume (cm³/g) | Bulk density (cm³/g) | Specific surface area (m²/g) | Judgment of formation into spheres by SEM | Crystal growth direction |
| Ex. 1-1 | BN-A | Al₂O₃ | 10 | 4.1 | 9.3 | 2.00 | 0.36 | 26.7 | ◯ | Radial (FIG. 1) |
| Ex. 1-2 | BN-B | Al₂O₃ | 10 | 4.9 | 9.3 | 1.71 | 0.42 | 22.9 | ◯ | Radial (FIG. 2) |
| Comp. Ex. 1-1 | BN-C | Al₂O₃ | 10 | 4.0 | 7.8 | 2.18 | 0.35 | 19.4 | ◯ | Circumferential (FIG. 3) |

Examples 1-3 and 1-4, Comparative Examples 1-2, 1-3 and 1-4

Preparation and Evaluation of Composition

<Preparation of Composition>

Using BN-A, BN-B and BN-C, they are blended in a proportion as shown in Table 2.

As the epoxy resin, an epoxy resin composition having an epoxy resin "1750" manufactured by Mitsubishi Chemical Corporation and an epoxy resin "YED216" manufactured by Mitsubishi Chemical Corporation mixed in a weight ratio of "1750":"YED216"=90:10 (weight ratio) was used.

The above epoxy resin composition and BN-A, BN-B or BN-C were mixed in a ratio shown in Table 1-2 using a rotary and revolutionary stirring machine (ARV-310 manufactured by THINKY CORPORATION)).

The obtained mixture was kneaded by letting it pass through a three-roll mill (manufactured by Kodaira Seisakusho Co., Ltd.) adjusted to a gap distance of 20 μm five times to obtain a composition (Examples 1-3 and 1-4 and Comparative Example 1-2).

To 2.5 g of the obtained composition, 2-ethylmethylimidazole as a curing agent was added in an amount of 2 parts by weight per 100 parts by weight of the epoxy resin, and the mixture was uniformly stirred and mixed using the above rotary and revolutionary stirring machine, and the obtained composition containing the curing agent was sandwiched between molds having a release PET overlaid on a glass plate and adjusted to a gap of 500 μm with silicone rubber, and heat-cured at 100° C. for one hour and then at 150° C. for 4 hours to obtain a cured product sample (3 cm×4 cm×thickness shown in Table 1-2) for evaluation of coefficient of thermal conductivity having a thickness shown in Table 1-2. Then, the coefficient of thermal conductivity in a thickness direction of this cured sample was measured.

In Comparative Examples 1-3 and 1-4, using commercially available plate BN "PT110" manufactured by Momentive Performance Materials Inc. or commercially available agglomerated BN particles "PTX25" manufactured by Momentive Performance Materials Inc., in the same manner as above, a composition was prepared in a blend ratio as shown in Table 1-2, and the same treatment as above was carried out, and the coefficient of thermal conductivity was measured.

With respect to "PT110", it was ground to adjust $D_{50}$=11.0 μm and used. In the ground "PT110", large particles having a maximum particle size of 100 μm in a particle size distribution were present.

"PTX25" particles were classified by "AERO FINE CLASSIFIER (AC-20)" manufactured by NISSHIN ENGINEERING INC. to adjust $D_{50}$=7.9 μm (maximum particle size of at most 25 μm) and used. "PTX25" particles were spherical before classification, however, as a result of observation with a SEM after classification, the spheres were disintegrated, and plate-shaped particles of primary particles were observed. As the h-BN primary particles constituting the agglomerated BN particles are large (at least 10 μm), they have no sufficient strength, and agglomerated BN particles having the same size as that in the present invention could not be obtained.

The above results together with physical properties of the agglomerated BN particles used are shown in Table 1-2.

TABLE 1-2

| | BN particles used | | | Composition blend ratio (wt %) | | Sample | Measurement results | |
|---|---|---|---|---|---|---|---|---|
| | Type | Shape | $D_{50}$ (μm) | BN particles (wt %) | Epoxy resin (wt %) | thickness (μm) | Coefficient of thermal conductivity (W/mK) | Viscosity of composition (Pa · s) |
| Ex. 1-3 | BN-A | Spherical | 4.1 | 30 | 70 | 450 | 1.18 | 3.0E+00 |
| | | | | 40 | 60 | 469 | 1.61 | 4.1E+02 |
| | | | | 50 | 50 | 516 | 2.02 | 9.3E+04 |
| Ex. 1-4 | BN-B | Spherical | 4.9 | 30 | 70 | 384 | 0.93 | 1.9E+00 |
| | | | | 40 | 60 | 509 | 1.39 | 8.5E+00 |
| | | | | 50 | 50 | 493 | 1.90 | — |
| Comp. Ex. 1-2 | BN-C | Spherical | 4.0 | 30 | 70 | 388 | 0.71 | 1.4E+02 |
| | | | | 40 | 60 | 392 | 0.85 | 3.0E+03 |
| | | | | 50 | 50 | 484 | 1.06 | 6.2E+05 |
| Comp. Ex. 1-3 | PT110 | Plate | 11.0 | 30 | 70 | 438 | 0.72 | 3.1E+02 |
| | | | | 40 | 60 | 455 | 0.87 | 8.8E+03 |
| | | | | 50 | 50 | 450 | 1.22 | — |
| Comp. Ex. 1-4 | PTX25 | Plate | 7.9 | 30 | 70 | 447 | 1.00 | 4.9E+03 |
| | | | | 40 | 60 | 430 | 1.14 | — |
| | | | | 50 | 50 | — | — | — |

With respect to 50 wt % in Comparative Example 1-4, sample could not be prepared due to high viscosity.

As shown in Table 1-2, by using the agglomerated BN particles of the present invention, a high coefficient of thermal conductivity in a thickness direction could be achieved with a smaller blend amount as compared with a conventional product.

Preparation Example 2-1

The phenoxy resin solution as the epoxy resin (a2-1) was prepared as follows.

215 parts by weight of YL6121H (epoxy equivalent 171 g/equivalent, a 1:1 mixture of 4,4'-biphenol type epoxy resin and 3,3',5,5'-tetramethyl-4,4'-biphenol type epoxy resin (manufactured by Mitsubishi Chemical Corporation)), 127 parts by weight of 3,3'-dimethyl-4,4'-biphenol (OH equivalent: 107 g/equivalent, manufactured by Honshu Chemical Industry Co., Ltd.), 0.32 part by weight of a 27 wt % tetramethylammonium hydroxide aqueous solution and 228 parts by weight of cyclohexanone as a reaction solvent were put in a pressure resistant reactor equipped with a stirrer, and reacted in a nitrogen gas atmosphere at 180° C. for 5 hours. Then, 171 parts by weight of cyclohexanone and 399 parts by weight of methyl ethyl ketone were added as diluting solvents to adjust the solid content concentration. The solvents were removed from the reaction product by a known method to obtain a 30 wt % resin solution.

Preparation Example 2-2

Boron nitride particles as the filler (B-1) were prepared as follows.

200 g of R-BN manufactured by NISSHIN REFRATECH CO., LTD. (hexagonal boron nitride having a crystallite size of the 002 plane of 299 Å and the crystallite size of the 100 plane of 339 Å as measured by X-ray diffraction) was put in a carbon crucible, and baked in a nitrogen gas atmosphere at 2,100° C. for 15 hours using a carbon furnace. The average particle size of the obtained boron nitride particles was 3.5 μm.

Results of evaluation of physical properties of R-BN (filler (B-2)) manufactured by NISSHIN REFRATECH CO., LTD. before baking and the boron nitride particles (filler (B-1)) obtained by baking are shown in Table 2-1.

TABLE 2-1

| Boron nitride powder | Lc (002) plane | | La (100) plane | | (002)/(100) crystallite size ratio (Lc/La) | Oxygen content (wt %) |
|---|---|---|---|---|---|---|
| | Half value width (°) | Crystallite size (Å) | Half value width (Å) | Crystallite size (Å) | | |
| Filler (B-1) (after baking) | 0.156 | 524 | 0.130 | 653 | 0.802 | 0.02 |
| Filler (B-2) (not baked) | 0.273 | 299 | 0.251 | 339 | 0.882 | 0.40 |

TABLE 2-2

| | Flux solution | | |
|---|---|---|---|
| No. | Flux concentration (wt %) | Type of flux | Melting properties of solder balls |
| 1 | 1 | Malonic acid | ○ |
| 2 | 1 | Succinic acid | ○ |
| 3 | 1 | Adipic acid | ○ |
| 4 | 1 | Malic acid | ○ |
| 5 | 1 | Tartaric acid | ○ |
| 6 | 1 | Citric acid | ○ |
| 7 | 5 | Abietic acid | ○ |
| 8 | 5 | Rosin *1 | ○ |
| 9 | 1 | Santacid G *2 | ○ |
| 10 | 5 | Santacid H *3 | ○ |
| 11 | 5 | Santacid I *4 | ○ |
| 12 | 1 | Glycine | X |
| 13 | 1 | Alanine | X |
| 14 | 1 | Glutamic acid | X |
| 15 | 5 | 2E4MZ *5 | X |
| 16 | 5 | C11Z-CN *6 | X |

*1 Rosin/abietic acid mixture (manufactured by Wako Pure Chemical Industries, Ltd.)
*2 Santacid G: dialkyl vinyl ether block bifunctional polymer type carboxylic acid (manufactured by NOF Corporation)
*3 Santacid H: monoalkyl vinyl ether block bifunctional low molecular weight type carboxylic acid (manufactured by NOF Corporation)
*4 Santacid I: monoalkyl vinyl ether block bifunctional carboxylic acid (manufactured by NOF Corporation)
*5 2E4MZ: 2-ethyl-4-methylimidazole (manufactured by SHIKOKU CHEMICALS CORPORATION)
*6 C11Z-CN: 1-cyanoethyl-2-undecyl imidazole (manufactured by SHIKOKU CHEMICALS CORPORATION)

Reference Example 2-1

A flux shown in Table 2-2 and an organic solvent (a mixture of methyl ethyl ketone and cyclohexanone in a blend weight ratio of 35:65) were blended at the flux concentration shown in Table 2-2 and stirred and mixed to obtain a flux solution.

50 μL of this flux solution was dropped on a copper substrate of 10 mm×10 mm, and solder balls (Sn-3.0Ag-0.5Cu, diameter: 300 μm) were added to the flux droplet. This substrate was heated on a hotplate at 120° C. for one minute to distill off the solvent.

Then, this substrate was heated at 250° C. for 10 seconds on a hotplate of 250° C., and melting properties of the solder balls to the copper substrate were evaluated (good: ○, poor: x). The results are shown in Table 2-2.

As evident from Table 2-2, when an organic carboxylic acid or an organic carboxylate was used as the flux, the solder balls were melted at the predetermined temperature and favorably bonded to the copper substrate. On the other hand, an amino acid has low solubility in a solvent, and an imidazole has a low function as a flux, and the solder balls and the copper substrate could not be bonded.

Example 2-1

5.81 g of the organic solvent (Eb) was added to 2.50 g of the epoxy resin (a1-1), 1.43 g (70 wt % cyclohexane solution) of the epoxy resin (a1-3), 3.33 g (30 wt % methyl ethyl ketone/cyclohexanone=5/5 solution) of the epoxy resin (a2-1), and 0.63 g (80 wt % cyclohexanone solution) of the epoxy resin (a3-1) as the epoxy resin (A1), and they were stirred and mixed by using a rotary and revolutionary stirring machine (ARV-310 manufactured by THINKY CORPORATION). 5.00 g of the filler (B-1) was added to the mixture, and 24.0 g of zirconia balls (YTZ-2) having a diameter of 2 mm were further added, and the mixture was stirred by using the rotary and revolutionary stirring machine at 2,000 rpm for 33 minutes. After completion of stirring, the beads were removed by filtration, 0.20 g of the curing agent (C) and 0.10 g of the flux (D) were added, and the mixture was further stirred by the rotary and revolutionary stirring machine for 6 minutes to obtain a paste (composition coating liquid).

The melt viscosity of the epoxy resin (A1) used in Example 2-1 at 120° C. was 2.1 Pa·s.

This coating liquid was applied to a glass substrate subjected to release treatment, heated under reduced pressure at 120° C. for 30 minutes to distill off the solvent thereby to form a coating film. On the coating film, a glass substrate subjected to release treatment was further placed to sandwich the coating film, and they were pressed (pressure: 1 MPa) at 150° C. for one hour and then at 200° C. for one hour to form and cure the coating film thereby to obtain a composition film having a thickness of 500 μm.

The coefficient of thermal conductivity of the obtained film was measured, whereupon it was 1.4 W/(m·K).

Comparative Example 2-1

A composition film was obtained in the same manner as in Example 2-1 except that the filler (B-2) was used as the filler. The coefficient of thermal conductivity was measured in the same manner as in Example 2-1, whereupon it was 0.9 W/(m·K).

Comparative Example 2-2

A composition film was obtained in the same manner as in Example 2-1 except that the filler (B-3) was used as the filler. The coefficient of thermal conductivity was measured in the same manner as in Example 2-1, whereupon it was 0.4 W/(m·K).

Example 2-2

0.10 g of the dispersing agent (F) and 5.90 g of the organic solvent (Eb) were added to 2.50 g of the epoxy resin (a1-1), 0.71 g (70 wt % cyclohexane solution) of the epoxy resin (a1-3), 3.33 g (30 wt % methyl ethyl ketone/cyclohexanone=5/5 solution) of the epoxy resin (a2-1), and 1.25 g (80 wt % cyclohexanone solution) of the epoxy resin (a3-1) as the epoxy resin (A1), and they were stirred and mixed by using the rotary and revolutionary stirring machine. 5.00 g of the filler (B-1) was added to the mixture, and 24.0 g of zirconia balls (YTZ-2) having a diameter of 2 mm were further added, and the mixture was stirred by using the rotary and revolutionary stirring machine at 2,000 rpm for 33 minutes. After completion of stirring, the beads were removed by filtration, 0.20 g of the curing agent (C) and 0.10 g of the flux (D) were added, and the mixture was further stirred by the rotary and revolutionary stirring machine for 6 minutes to obtain a paste (composition coating liquid).

The melt viscosity of the epoxy resin (A1) used in Example 2-2 at 120° C. was 2.1 Pa·s.

Using the composition coating liquid, a composition film having a thickness of 50 μm was formed in the same manner as in Example 2-1, and the coefficient of thermal conductivity was measured in the same manner as in Example 2-1, whereupon it was 1.2 W/(m·K).

Further, 25 μL of the composition coating liquid was applied to a solder bump substrate made of silicon (CC80 Model I) manufactured by WALTS, and heated on a hotplate at 60° C. for 15 minutes, at 80° C. for 15 minutes and at 120° C. for 30 minutes to distill off the solvent, and further heated on a hotplate at 150° C. for 10 minutes to form a B-stage film.

The above solder bump substrate and an organic interposer (CC80 Model I) manufactured by WALTS, were bonded by heat pressing by heating up to 250° C. using a flip chip bonder (FC3000S) manufactured by Toray Engineering Co., Ltd. and then cooled and cured at 165° C. for 2 hours to form a laminate. The electric resistance of a daisy chain in the interior of the laminate was measured by a digital multimater (2400 manufactured by Keithley Instruments), whereupon it was at most 10Ω.

Comparative Example 2-3

A composition film was obtained in the same manner as in Example 2-2 except that the filler (B-2) was used as the filler. The coefficient of thermal conductivity was measured in the same manner as in Example 2-1, whereupon it was 0.9 W/(m·K).

Example 2-3

2.50 g of the epoxy resin (a3-1), 6.25 g of the epoxy resin (a1-2) and 3.75 g of the epoxy resin (a2-2) as the epoxy resin (A1) were dissolved in 12.5 g of the organic solvent (Eb) with stirring. To the solution, 0.25 g of the dispersing agent (F), 0.25 g of the flux (D) and 11.75 g of the solvent (E1) were added, and further, 12.5 g of the filler (B-1) and 100 g of zirconia balls (YTZ-0.5) having a diameter of 0.5 mm were added, and the mixture was stirred by using the rotary and revolutionary stirring machine at 2,000 rpm for 10 minutes. After completion of stirring, the beads were removed by filtration, 0.25 g of the curing agent (C) was added, and the mixture was further stirred by the rotary and revolutionary stirring machine for 6 minutes to obtain a paste (composition coating liquid).

The melt viscosity of the epoxy resin (A1) used in Example 2-3 at 120° C. was less than 2.1 Pa·s.

Further, using the composition coating liquid, B-stage formation was carried out in the same manner as in Example 2-2, and further, a laminate was formed, and the electric resistance of a daisy chain in the interior of the laminate was measured, whereupon it was at most 20Ω.

Preparation Example 3-1

The phenoxy resin solution as the epoxy resin (a2-1) in Preparation Example 3-1 was prepared in the same manner as in Preparation Example 2-1.

Preparation Example 3-2

The agglomerated BN particles as the filler (B-1) were prepared and evaluate in the same manner as "BN-A" as the agglomerated BN particles in Example 1-1. The crystallinity and evaluation results of the obtained agglomerated BN particles were the same as those of BN-A in Example 1-1.

Further, of the obtained agglomerated BN particles, $D_{50}$ was 4.1 μm, the maximum particle size was 9.3 μm, the total pore volume was 2.00 cm$^3$/g, and the bulk density was 0.36 g/cm$^3$.

Example 3-1

0.60 g of the dispersing agent (F) and 5.05 g of the organic solvent (Eb) were added to 3.50 g of the epoxy resin (a1-1), 1.00 g (70 wt % cyclohexane solution) of the epoxy resin (a1-3), 4.67 g (30 wt % methyl ethyl ketone/cyclohexanone=5/5 solution) of the epoxy resin (a2-1), and 1.75 g (80 wt % cyclohexanone solution) of the epoxy resin (a3-1) as the epoxy resin (A1), and they were stirred and mixed by using the rotary and revolutionary stirring machine. 3.01 g of the filler (B-1) was added to the mixture, and 24.0 g of zirconia balls (YTZ-2) having a diameter of 2 mm were further added, and the mixture was stirred by using the rotary and revolutionary stirring machine at 2,000 rpm for 10 minutes. After completion of stirring, the beads were removed by filtration, 0.28 g of the curing agent (C) and 0.14 g of the flux (D) were added, and the mixture was further stirred by the rotary and revolutionary stirring machine for 6 minutes to obtain a paste (composition coating liquid).

The melt viscosity of the epoxy resin (A1) used in Example 3-1 at 120° C. was 2.1 Pa·s.

25 μL of the composition coating liquid was applied to a solder bump substrate made of silicon (CC80 Model I) manufactured by WALTS, and heated on a hotplate at 60° C. for 15 minutes, at 80° C. for 15 minutes and at 120° C. for 30 minutes to distill off the solvent, and further heated on a hotplate at 150° C. for 10 minutes to form a B-stage film.

The above solder bump substrate and an organic interposer (CC80 Model I) manufactured by WALTS, were bonded by heat pressing by heating up to 250° C. using a flip chip bonder (FC3000S) manufactured by Toray Engineering Co., Ltd. and then cooled and cured at 165° C. for 2 hours to form a laminate. The electric resistance of a daisy chain in the interior of the laminate was measured by a digital multimater, whereupon it was at most 10Ω.

Example 3-2

0.10 g of the dispersing agent (F) and 5.90 g of the organic solvent (Eb) were added to 2.50 g of the epoxy resin (a1-1), 0.71 g (70 wt % cyclohexane solution) of the epoxy resin (a1-3), 3.33 g (30 wt % methyl ethyl ketone/cyclohexanone=5/5 solution) of the epoxy resin (a2-1), and 1.25 g (80 wt % cyclohexanone solution) of the epoxy resin (a3-1) as the epoxy resin (A1), and they were stirred and mixed by using the rotary and revolutionary stirring machine. 5.00 g of the filler (B-1) was added to the mixture, and 24.0 g of zirconia balls (YTZ-2) having a diameter of 2 mm were further added, and the mixture was stirred by using the rotary and revolutionary stirring machine at 2,000 rpm for 10 minutes. After completion of stirring, 0.20 g of the curing agent (C) and 0.10 g of the flux (D) were added, and the mixture was further stirred by the rotary and revolutionary stirring machine for 6 minutes to obtain a paste (composition coating liquid). The melt viscosity of the epoxy resin (A1) used in Example 3-2 at 120° C. was 2.1 Pa·s.

This coating liquid was applied to a glass substrate subjected to release treatment, heated under reduced pressure at 120° C. for 30 minutes to distill off the solvent thereby to form a coating film. On the coating film, a glass substrate subjected to release treatment was further placed to sandwich the coating film, and they were pressed (pressure: 1 MPa) at 150° C. for one hour and then at 200° C. for one hour to form and cure the coating film thereby to obtain a composition film having a thickness of 500 μm.

The coefficient of thermal conductivity of the obtained film was measured, whereupon it was 1.4 W/(m·K).

Example 3-3

1.00 g of the epoxy resin (a3-1), 2.50 g of the epoxy resin (a1-2) and 1.50 g of the epoxy resin (a2-2) as the epoxy resin (A1) were dissolved in 5.00 g of the organic solvent (Eb) with stirring. To the solution, 0.05 g of the dispersing agent (F), 0.10 g of the flux (D) and 2.44 g of the organic solvent (Eb) were added, and further, 2.14 g of the filler (B-1) was added, and further 24.0 g of zirconia balls (YTZ-2) having a diameter of 2 mm were added, and the mixture was stirred by a rotary and revolutionary stirring machine at 2,000 rpm for 10 minutes. After completion of stirring, 0.10 g of the curing agent (C) was added, followed by stirring by the rotary and revolutionary stirring machine for 6 minutes to obtain a paste (composition coating liquid).

The melt viscosity of the epoxy resin (A1) used in Example 3-3 at 120° C. was less than 2 Pa·s.

Using the coating liquid, in the same manner as in Example 3-1, B-stage formation was carried out, a laminate was formed, and the electric resistance of a daisy chain in the interior of the laminate was measured, whereupon it was at most 20Ω.

Comparative Example 3-1

2.50 g of the epoxy resin (a3-1), 6.25 g of the epoxy resin (a1-2) and 3.75 g of the epoxy resin (a2-2) as the epoxy resin (A1) were dissolved in 12.5 g of the organic solvent (Eb) with stirring. To the solution, 0.25 g of the dispersing agent (F), 0.25 g of the flux (D) and 11.75 g of the organic solvent (Eb) were added, and further, 12.5 g of the filler (B-3) and 100 g of zirconia balls (YTZ-0.5) having a diameter of 0.5 mm were added, and the mixture was stirred by a rotary and revolutionary stirring machine at 2,000 rpm for 10 minutes. After completion of stirring, the beads were removed by filtration, 0.25 g of the curing agent (C) was added, followed by stirring by the rotary and revolutionary stirring machine for 6 minutes to obtain a paste (composition coating liquid).

The melt viscosity of the epoxy resin (A1) used in Comparative Example 3-1 at 120° C. was less than 2 Pa·s.

Using this coating liquid, in the same manner as in Example 3-2, a film of the composition having a thickness of 50 μm was formed, and the coefficient of thermal conductivity of the film was measured, whereupon it was 0.4 W/(m·K).

Comparative Example 3-2

A paste (composition coating liquid) was prepared in the same manner as in Comparative Example 3-1 except that the filler (B-2) was used as the filler. Using this composition coating liquid, in the same manner as in Example 3-2, a film of the composition having a thickness of 50 μm was formed, and the coefficient of thermal conductivity of the film was measured, whereupon it was 0.9 W/(m·K).

Comparative Example 3-3

A paste (composition coating liquid) was obtained in the same manner as in Example 3-2 except that the filler (B-2) was used as the filler, 25 g of zirconia balls (YTZ-2) having a diameter of 2 mm were added, followed by stirring by the rotary and revolutionary stirring machine at 2,000 rpm for 33 minutes, and then the beads were removed by filtration, and 0.20 g of the curing agent (C) and 0.10 g of the flux (D) were added, followed by stirring by the rotary and revolutionary stirring machine for 6 minutes.

Then, using the composition coating liquid, in the same manner as in Example 3-2, a film of a composition having a thickness of 50 μm was formed. In the same manner as in Example 3-2, the coefficient of thermal conductivity of the film was measured, whereupon it was 0.9 W/(m·K).

Comparative Example 3-4

2.50 g of the epoxy resin (a3-1), 0.25 g of the epoxy resin (a1-2) and 3.75 g of the epoxy resin (a2-2) as the epoxy resin (A1) were dissolved in 12.5 g of the organic solvent (Eb) with stirring. To the solution, 0.25 g of the dispersing agent (F), 0.25 g of the flux (D) and 11.75 g of the organic solvent (Eb) were added, and further, 12.5 g of the filler (B-2) and 100 g of zirconia balls (YTZ-0.5) having a diameter of 0.5 mm were added, and the mixture was stirred by the rotary and revolutionary stirring machine at 2,000 rpm for 10 minutes. After completion of stirring, the beads were removed by filtration, 0.25 g of the curing agent (C) was added, followed by stirring by the rotary and revolutionary stirring machine for 6 minutes to obtain a paste (composition coating liquid).

The melt viscosity of the epoxy resin (A1) used in Comparative Example 3-4 at 120° C. was less than 2 Pa·s.

Then, using the composition coating liquid, in the same manner as in Example 3-2, a film of a composition having a thickness of 50 μm was formed. In the same manner as in Example 3-2, the coefficient of thermal conductivity of the film was measured, whereupon it was 0.9 W/(m·K).

INDUSTRIAL APPLICABILITY

By using the composition and the composition coating liquid of the present invention, it is possible to form a high quality filling interlayer having high thermal conductivity simultaneously with bonding of solder bumps or the like and lands between semiconductor device substrates, and a semiconductor substrate laminate having such a filling interlayer is useful as a laminate for a three-dimensional integrated circuit.

This application is a continuation of PCT Application No. PCT/JP2012/080959, filed on Nov. 29, 2012, which is based upon and claims the benefit of priority from Japanese Patent Application No. 2011-260238 filed on Nov. 29, 2011, Japanese Patent Application No. 2012-103216 filed on Apr. 27, 2012 and Japanese Patent Application No. 2012-103217 filed on Apr. 27, 2012. The contents of those applications are incorporated herein by reference in their entireties.

What is claimed is:

1. Agglomerated boron nitride particles which have a specific surface area from at least 10 m$^2$/g to at most 30 m$^2$/g and a total pore volume of at least 0.1 cm$^3$/g and at most 2.15 cm$^3$/g, and the surface of which is constituted by boron nitride primary particles having an average particles size of at least 0.05 μm and at most 1 μm.

2. The agglomerated boron nitride particles according to claim 1, wherein the volume-based maximum particle size of the agglomerated boron nitride particles is within a range of at least 0.1 μm and at most 25 μm.

3. The agglomerated boron nitride particles according to claim 1, wherein the bulk density is at least 0.3 g/cm$^3$.

4. A composition, comprising:
a resin (A) having a melt viscosity at 120° C. of at most 100 Pa·s; and
a filler (B) comprising the agglomerated boron nitride particles as defined in claim 1.

5. The composition according to claim 4, which contains the filler (B) in an amount of at least 40 parts by weight and at most 400 parts by weight per 100 parts by weight of the resin (A).

6. The composition according to claim 1, further comprising a curing agent (C).

7. The composition according to claim 4, further comprising a flux (D).

8. The composition according to claim 4, wherein the resin (A) is a thermosetting resin.

9. The composition according to claim 8, wherein the thermosetting resin is an epoxy resin (a).

10. The composition according to claim 9, wherein the epoxy resin (a) comprises an epoxy resin (a1) having an epoxy equivalent of at least 100 g/equivalent and less than 650 g/equivalent.

11. The composition according to claim 9, wherein the epoxy resin (a) comprises an epoxy resin (a2) having an epoxy equivalent of at least 650 g/equivalent and at most 30,000 g/equivalent.

12. The composition according to claim 9, wherein the epoxy resin (a) is a phenoxy resin having at least one skeleton among a bisphenol A skeleton, a bisphenol F skeleton and a biphenyl skeleton.

13. A composition coating liquid, comprising:
the composition as defined in claim 4; and
an organic solvent (E).

14. A three-dimensional integrated circuit, comprising:
a semiconductor substrate laminate having at least two semiconductor substrates each having a semiconductor device layer formed thereon laminated, and a layer containing the composition as defined in claim 4.

15. The agglomerated boron nitride particles according to claim 1, having a specific surface area from at least 10 m$^2$/g to at most 26.7 m$^2$/g.

16. A process for producing the agglomerated boron nitride particles of claim 1, comprising:
granulating a slurry containing a material boron nitride powder,
wherein the volume-based average particle size D$_{50}$ of the material boron nitride powder in the slurry is at most ⅕ of the volume-based average particle size D$_{50}$ of granulated particles.

17. The process for producing agglomerated boron nitride particles according to claim 16, wherein the total oxygen content of the material boron nitride powder is at least 1 wt % and at most 10 wt %.

18. The process for producing agglomerated boron nitride particles according to claim 16, wherein the material boron nitride powder satisfies the following conditions (1) and/or (2):
(1) the total pore volume is at most 1.0 cm$^3$/g; and
(2) the specific surface area is at least 20 m$^2$/g.

19. The process for producing agglomerated boron nitride particles according to claim 16, wherein the slurry containing a material boron nitride powder is granulated into spherical particles by a spray drying method, and the obtained granulated particles are subjected to heat treatment in a non-oxidizing gas atmosphere.

20. The process for producing agglomerated boron nitride particles according to claim 16, wherein the slurry containing a material boron nitride powder contains a metal oxide in an amount of at least 1 wt % and at most 30 wt % based on the material boron nitride powder.

21. A process for producing a three-dimensional integrated circuit, comprising:
forming a film of the composition coating liquid as defined in claim 13 on the surface of a plurality of semiconductor substrates; and pressure-bonding such semiconductor substrates.

22. A composition, comprising:

a resin (A) having a melt viscosity at 120° C. of at most 100 Pa·s; and a filler (B) comprising boron nitride which has a crystallite size (Lc) of the 002 plane of at least 450 [Å], a crystallite size (La) of the 100 plane of at least 500 [Å], the crystallize size (Lc) and the crystallite size (La) satisfying the following formula (i), and has an oxygen content of at most 0.30 wt %:

$$0.70 \leq Lc/La \tag{i}.$$

23. The composition according to claim 22, wherein the volume average particle size of the filler (B) is at most 10 µm.

24. The composition according to claim 22, which contains the filler (B) in an amount of at least 40 parts by weight and at most 400 parts by weight per 100 parts by weight of the resin (A).

* * * * *